United States Patent
McLaurin et al.

(10) Patent No.: US 9,466,949 B1
(45) Date of Patent: *Oct. 11, 2016

(54) GALLIUM NITRIDE CONTAINING LASER DEVICE CONFIGURED ON A PATTERNED SUBSTRATE

(71) Applicant: Soraa Laser Diode, Inc., Goleta, CA (US)

(72) Inventors: Melvin McLaurin, Goleta, CA (US); James W. Raring, Goleta, CA (US); Christiane Elsass, Goleta, CA (US); Thiago P. Melo, Fremont, CA (US); Mathew C. Schmidt, Fremont, CA (US)

(73) Assignee: SORAA LASER DIODE, INC., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/857,719

(22) Filed: Sep. 17, 2015

Related U.S. Application Data

(63) Continuation of application No. 14/317,846, filed on Jun. 27, 2014, now Pat. No. 9,166,372.

(60) Provisional application No. 61/841,138, filed on Jun. 28, 2013.

(51) Int. Cl.
*H01S 5/02* (2006.01)
*H01S 5/22* (2006.01)
(Continued)

(52) U.S. Cl.
CPC ......... *H01S 5/34333* (2013.01); *H01S 5/0425* (2013.01); *H01S 5/1082* (2013.01); *H01S 5/2201* (2013.01); *H01S 5/3063* (2013.01); *H01S 5/3202* (2013.01)

(58) Field of Classification Search
CPC ............. H01L 21/0243; H01S 5/3202; H01S 5/2201; H01S 5/2275; H01S 5/34333
See application file for complete search history.

(56) References Cited

U.S. PATENT DOCUMENTS

| | | |
|---|---|---|
| 4,341,592 A | 7/1982 | Shortes et al. |
| 4,860,687 A | 8/1989 | Frijlink |

(Continued)

FOREIGN PATENT DOCUMENTS

| | | |
|---|---|---|
| JP | 2007-173467 A | 7/2007 |
| JP | 2007-068398 | 4/2008 |
| WO | 2008-041521 A1 | 4/2008 |

OTHER PUBLICATIONS

Abare "Cleaved and Etched Facet Nitride Laser Diodes," IEEE Journal of Selected Topics in Quantum Electronics, vol. 4, No. 3, pp. 505-509 (May 1998).

(Continued)

*Primary Examiner* — Yuanda Zhang
*Assistant Examiner* — Michael Carter
(74) *Attorney, Agent, or Firm* — Kilpatrick Townsend & Stockton LLP

(57) ABSTRACT

A gallium and nitrogen containing laser diode device. The device has a gallium and nitrogen containing substrate material comprising a surface region. The surface region is configured on either a non-polar crystal orientation or a semi-polar crystal orientation. The device has a recessed region formed within a second region of the substrate material, the second region being between a first region and a third region. The recessed region is configured to block a plurality of defects from migrating from the first region to the third region. The device has an epitaxially formed gallium and nitrogen containing region formed overlying the third region. The epitaxially formed gallium and nitrogen containing region is substantially free from defects migrating from the first region and an active region formed overlying the third region.

19 Claims, 25 Drawing Sheets

(51) Int. Cl.

| | |
|---|---|
| *H01S 5/343* | (2006.01) |
| *H01S 5/227* | (2006.01) |
| *H01S 5/32* | (2006.01) |
| *H01L 21/02* | (2006.01) |
| *H01S 5/30* | (2006.01) |
| *H01S 5/042* | (2006.01) |
| *H01S 5/10* | (2006.01) |

(56) References Cited

U.S. PATENT DOCUMENTS

| | | |
|---|---|---|
| 4,911,102 A | 3/1990 | Manabe et al. |
| 5,331,654 A | 7/1994 | Jewell et al. |
| 5,334,277 A | 8/1994 | Nakamura |
| 5,366,953 A | 11/1994 | Char et al. |
| 5,527,417 A | 6/1996 | Lida et al. |
| 5,607,899 A | 3/1997 | Yoshida et al. |
| 5,632,812 A | 5/1997 | Hirabayashi |
| 5,696,389 A | 12/1997 | Ishikawa et al. |
| 5,821,555 A | 10/1998 | Saito et al. |
| 5,888,907 A | 3/1999 | Tomoyasu et al. |
| 5,926,493 A | 7/1999 | O'Brien et al. |
| 5,951,923 A | 9/1999 | Rorie et al. |
| 6,069,394 A | 5/2000 | Hashimoto et al. |
| 6,147,953 A | 11/2000 | Duncan |
| 6,153,010 A | 11/2000 | Kiyoku et al. |
| 6,239,454 B1 | 5/2001 | Glew et al. |
| 6,379,985 B1 | 4/2002 | Cervantes et al. |
| 6,451,157 B1 | 9/2002 | Hubacek |
| 6,489,636 B1 | 12/2002 | Goetz et al. |
| 6,586,762 B2 | 7/2003 | Kozaki |
| 6,635,904 B2 | 10/2003 | Goetz et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,920,166 B2 | 7/2005 | Akasaka et al. |
| 7,009,199 B2 | 3/2006 | Hall |
| 7,033,858 B2 | 4/2006 | Chai et al. |
| 7,053,413 B2 | 5/2006 | D'Evelyn et al. |
| 7,063,741 B2 | 6/2006 | D'Evelyn |
| 7,128,849 B2 | 10/2006 | Setlur et al. |
| 7,220,324 B2 | 5/2007 | Baker et al. |
| 7,303,630 B2 | 12/2007 | Motoki et al. |
| 7,312,156 B2 | 12/2007 | Granneman et al. |
| 7,323,723 B2 | 1/2008 | Ohtsuka et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,470,555 B2 | 12/2008 | Matsumura |
| 7,483,466 B2 | 1/2009 | Uchida et al. |
| 7,489,441 B2 | 2/2009 | Scheible et al. |
| 7,555,025 B2 | 6/2009 | Yoshida |
| 7,691,658 B2 | 4/2010 | Kaeding et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,017,932 B2 | 9/2011 | Okamoto et al. |
| 8,044,412 B2 | 10/2011 | Murphy et al. |
| 8,143,148 B1 | 3/2012 | Raring et al. |
| 8,247,887 B1 | 8/2012 | Raring et al. |
| 8,252,662 B1 | 8/2012 | Poblenz et al. |
| 8,259,769 B1 | 9/2012 | Raring et al. |
| 8,314,429 B1 | 11/2012 | Raring et al. |
| 8,351,478 B2 | 1/2013 | Raring et al. |
| 8,355,418 B2 | 1/2013 | Raring et al. |
| 8,422,525 B1 | 4/2013 | Raring et al. |
| 9,166,372 B1 | 10/2015 | McLaurin et al. |
| 2002/0050488 A1 | 5/2002 | Nikitin et al. |
| 2002/0085603 A1 | 7/2002 | Okumura |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0140846 A1 | 7/2003 | Biwa et al. |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0104391 A1 | 6/2004 | Maeda et al. |
| 2004/0151222 A1 | 8/2004 | Sekine |
| 2004/0196877 A1 | 10/2004 | Kawakami et al. |
| 2004/0222357 A1 | 11/2004 | King et al. |
| 2004/0247275 A1 | 12/2004 | Vakhshoori et al. |
| 2004/0262624 A1 | 12/2004 | Akita et al. |
| 2005/0025204 A1* | 2/2005 | Kamikawa ............ B82Y 20/00 372/43.01 |
| 2005/0040384 A1 | 2/2005 | Tanaka et al. |
| 2005/0072986 A1 | 4/2005 | Sasaoka |
| 2005/0168564 A1 | 8/2005 | Kawaguchi et al. |
| 2005/0224826 A1 | 10/2005 | Keuper et al. |
| 2005/0229855 A1 | 10/2005 | Raaijmakers |
| 2005/0285128 A1 | 12/2005 | Scherer et al. |
| 2006/0030738 A1 | 2/2006 | Vanmaele et al. |
| 2006/0037529 A1 | 2/2006 | D'Evelyn |
| 2006/0038193 A1 | 2/2006 | Wu et al. |
| 2006/0060131 A1 | 3/2006 | Atanackovic |
| 2006/0066319 A1 | 3/2006 | Dallenbach et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0118799 A1 | 6/2006 | D'Evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |
| 2007/0081857 A1 | 4/2007 | Yoon |
| 2007/0086916 A1 | 4/2007 | LeBoeuf et al. |
| 2007/0093073 A1 | 4/2007 | Farrell et al. |
| 2007/0110112 A1 | 5/2007 | Sugiura |
| 2007/0120141 A1 | 5/2007 | Moustakas et al. |
| 2007/0163490 A1 | 7/2007 | Habel et al. |
| 2007/0166853 A1 | 7/2007 | Guenthe et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2007/0280320 A1 | 12/2007 | Feezell et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezle et al. |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0232416 A1 | 9/2008 | Okamoto et al. |
| 2008/0285609 A1 | 11/2008 | Ohta et al. |
| 2008/0291961 A1 | 11/2008 | Kamikawa et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0058532 A1 | 3/2009 | Kikkawa et al. |
| 2009/0078944 A1 | 3/2009 | Kubota et al. |
| 2009/0080857 A1 | 3/2009 | St. John-Larkin |

(56) References Cited

U.S. PATENT DOCUMENTS

| | | | |
|---|---|---|---|
| 2009/0081857 A1 | 3/2009 | Hanser et al. | |
| 2009/0081867 A1 | 3/2009 | Taguchi et al. | |
| 2009/0141765 A1 | 6/2009 | Kohda et al. | |
| 2009/0159869 A1 | 6/2009 | Ponce et al. | |
| 2009/0229519 A1 | 9/2009 | Saitoh | |
| 2009/0250686 A1 | 10/2009 | Sato et al. | |
| 2009/0267100 A1 | 10/2009 | Miyake et al. | |
| 2009/0273005 A1 | 11/2009 | Lin | |
| 2009/0301387 A1 | 12/2009 | D'Evelyn | |
| 2009/0301388 A1 | 12/2009 | D'Evelyn | |
| 2009/0309110 A1 | 12/2009 | Raring et al. | |
| 2009/0309127 A1 | 12/2009 | Raring et al. | |
| 2009/0320744 A1 | 12/2009 | D'Evelyn | |
| 2009/0321778 A1 | 12/2009 | Chen et al. | |
| 2010/0001300 A1 | 1/2010 | Raring et al. | |
| 2010/0003492 A1 | 1/2010 | D'Evelyn | |
| 2010/0006873 A1 | 1/2010 | Raring et al. | |
| 2010/0025656 A1 | 2/2010 | Raring et al. | |
| 2010/0031875 A1 | 2/2010 | D'Evelyn | |
| 2010/0044718 A1 | 2/2010 | Hanser et al. | |
| 2010/0096615 A1 | 4/2010 | Okamoto et al. | |
| 2010/0104495 A1 | 4/2010 | Kawabata et al. | |
| 2010/0140745 A1 | 6/2010 | Khan et al. | |
| 2010/0151194 A1 | 6/2010 | D'Evelyn | |
| 2010/0195687 A1 | 8/2010 | Okamoto et al. | |
| 2010/0220262 A1 | 9/2010 | DeMille et al. | |
| 2010/0295054 A1 | 11/2010 | Okamoto et al. | |
| 2010/0301348 A1* | 12/2010 | Kamikawa | B82Y 20/00 257/76 |
| 2010/0302464 A1 | 12/2010 | Raring et al. | |
| 2010/0309943 A1 | 12/2010 | Chakraborty et al. | |
| 2010/0316075 A1 | 12/2010 | Raring et al. | |
| 2010/0327291 A1 | 12/2010 | Preble et al. | |
| 2011/0056429 A1 | 3/2011 | Raring et al. | |
| 2011/0057167 A1 | 3/2011 | Ueno et al. | |
| 2011/0064100 A1 | 3/2011 | Raring et al. | |
| 2011/0064101 A1 | 3/2011 | Raring et al. | |
| 2011/0064102 A1* | 3/2011 | Raring | B82Y 20/00 372/44.011 |
| 2011/0075694 A1 | 3/2011 | Yoshizumi et al. | |
| 2011/0103418 A1 | 5/2011 | Hardy et al. | |
| 2011/0133489 A1 | 6/2011 | Hemeury et al. | |
| 2011/0164637 A1 | 7/2011 | Yoshizumi et al. | |
| 2011/0180781 A1 | 7/2011 | Raring et al. | |
| 2011/0186874 A1 | 8/2011 | Shum | |
| 2011/0186887 A1 | 8/2011 | Trottier et al. | |
| 2011/0216795 A1 | 9/2011 | Hsu et al. | |
| 2011/0247556 A1 | 10/2011 | Raring et al. | |
| 2011/0261847 A1 | 10/2011 | Chou | |
| 2013/0234111 A1 | 9/2013 | Pfister et al. | |

OTHER PUBLICATIONS

Aoki et al., "InGaAs/InGaAsP MQW Electroabsorption Modulator Integrated with a DFB Laser Fabricated by Band-Gap Energy Control Selective Area MOCVD, 1993," IEEE J Quantum Electronics, vol. 29, pp. 2088-2096.

Asano et al., "100-mW kink-Free Blue-Violet Laser Diodes with Low Aspect Ratio," 2003, IEEE Journal of Quantum Electronics, vol. 39, No. 1, pp. 135-140.

Asif Khan "Cleaved cavity optically pumped InGaN—GaN laser grown on spinel substrates," Appl. Phys. Lett. 69 (16), pp. 2418-2420 (Oct. 14, 1996).

Bernardini et al., "Spontaneous Polarization and Piezoelectric Constants of III-V Nitrides," 1997, Physical Review B, vol. 56, No. 16, pp. 10024-10027.

Caneau et al., "Studies on Selective OMVPE of (Ga,In)/(As,P)," 1992, Journal of Crystal Growth, vol. 124, pp. 243-248.

Chen et al., "Growth and Optical Properties of Highly Uniform and Periodic InGaN Nanostructures," 2007, Advanced Materials, vol. 19, pp. 1707-1710.

D'Evelyn et al., "Bulk GaN Crystal Growth by the High-Pressure Ammonothermal Method," Journal of Crystal Growth, 2007, vol. 300, pp. 11-16.

Fujii et al., "Increase in the Extraction Efficiency of GaN-based Light-Emitting Diodes via Surface Roughening," 2004, Applied Physics Letters, vol. 84, No. 6, pp. 855-857.

Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.

Funato et al., "Monolithic Polychromatic Light-Emitting Diodes Based on InGaN Microfacet Quantum Wells toward Tailor-Made Solid-State Lighting," 2008, Applied Physics Express, vol. 1, pp. 011106-1-011106-3.

Founta et al., 'Anisotropic Morphology of Nonpolar a-Plane GaN Quantum Dots and Quantum Wells,' Journal of Applied Physics, vol. 102, vol. 7, 2007, pp. 074304-1-074304-6.

Gardner et al. "Blue-emitting InGaN—GaN double-heterostructure light-emitting diodes reaching maximum quantum efficiency above 200 A/ cm2", Applied Physics Letters 91, 243506 (2007).

hap ://techon.nikkeibp. co jp/english/NEWS_EN/20080122/146009.

Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kendall et al., "Energy Savings Potential of Solid State Lighting in General Lighting Applications," 2001, Report for the Department of Energy, pp. 1-35.

Kim et al, "Improved Electroluminescence on Nonpolar m-plane InGaN/GaN Qantum Well LEDs", 2007, Physica Status Solidi (RRL), vol. 1, No. 3, pp. 125-127.

Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.

Lin et al. "Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).

Masui et al. "Electrical Characteristics of Nonpolar InGaN-Based Light-Emitting Diodes Evaluated at Low Temperature," Jpn. J. Appl. Phys. 46 pp. 7309-7310 (2007).

Michiue et al. "Recent development of nitride LEDs and LDs," Proceedings of SPIE, vol. 7216, 72161Z (2009).

Nakamura et al., "InGaN/Gan/AlGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.

Nam et al., "Later Epitaxial Overgrowth of GaN films on SiO2 Areas via Metalorganic Vapor Phase Epitaxy," 1998, Journal of Electronic Materials, vol. 27, No. 4, pp. 233-237.

Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.

Okamoto et. al "Continuous-Wave Operation of m-Plane InGaN Multiple Quantum Well Laser Diodes" The Japan Society of I Applied Physics JJAP Express LEtter, vol. 46, No. 9, 2007 pp. L 187-L 189.

Okamoto et al. in "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).

Park, "Crystal orientation effects on electronic properties of wurtzite InGaN/GaN quantum wells,",Journal of Applied Physics vol. 91, No. 12, pp. 9904-9908 (Jun. 2002).

Purvis, "Changing the Crystal Face of Gallium Nitride." The Advance Semiconductor Magazine, vol. 18, No. 8, Nov. 2005.

Romanov "Strain-induced polarization in wurtzite III-nitride semipolar layers," Journal of Applied Physics 100, pp. 023522-1 through 023522-10 (Jul. 25, 2006).

(56) References Cited

OTHER PUBLICATIONS

Sato et al., "High Power and High Efficiency Green Light Emitting Diode on free-Standing Semipolar (1122) Bulk GaN Substrate," 2007.Physica Status Solidi (RRL), vol. 1, pp. 162-164.
Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.
Schmidt et al., "Demonstration of Nonpolar m-plane InGaN/GaN Laser Diodes," 2007, Journal of Japanese Applied Physics, vol. 46, No. 9, pp. 190-191.
Schmidt et al., "High Power and High External Efficiency m-plane InGaN Light Emitting Diodes," 2007, Japanese Journal of Applied Physics, vol. 46, No. 7, pp. L126-L128.
Schoedl "Facet degradation of GaN heterostructure laser diodes," Journal of Applied Physics vol. 97, issue 12, pp. 123102-1 to 123102-8 (2005).
Shchekin et al., "High Performance Thin-film Flip-Chip InGaN—GaN Light-emitting Diodes," 2006, Applied Physics Letters, vol. 89, pp. 071109-071109-3.
Shen et al. "Auger recombination in InGaN measured by photoluminescence," Applied Physics Letters, 91, 141101 (2007).
Sizov et al., "500-nm Optical Gain Anisotropy of Semipolar (1122) InGaN Quantum Wells," 2009, Applied Physics Express, vol. 2, pp. 071001-1-071001-3.
Tomiya et. al. Dislocation related issues in the degradation of GaN-based laser diodes, IEEE Journal of Selected Topics in Quantum Electronics vol. 10, No. 6 (2004).
Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.
Uchida et al.,"Recent Progress in High-Power Blue-violet Lasers," 2003, IEEE Journal of Selected Topics in Quantum Electronics, vol. 9, No. 5, pp. 1252-1259.
Waltereit et al., "Nitride Semiconductors Free of Electrostatic Fields for Efficient White Light-emitting Diodes," 2000, Nature: International Weekly Journal of Science, vol. 406, pp. 865-868.
Wierer et al., "High-power AlGaInN Flip-chip Light-emitting Diodes," 2001, Applied Physics Letters, vol. 78, No. 22, pp. 3379-3381.
Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.
Yoshizumi et al. "Continuous-Wave operation of 520 nm Green InGaN-Based Laser Diodes on Semi-Polar {20-21} GaN Substrates," Applied Physics Express 2 (2009).
Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.
Zhong et al., "Demonstration of High Power Blue-Green Light Emitting Diode on Semipolar (1122) Bulk GaN Substrate," 2007, Electron Letter, vol. 43, No. 15, pp. 825-826.
Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.
International Search Report of PCT Application No. PCT/US2009/047107, dated Sep. 29, 2009, 4 pages.
International Search Report of PCT Application No. PCT/US2009/046786, dated May 13, 2010, 2 pages.
International Search Report of PCT Application No. PCT/US2009/52611, dated Sep. 29, 2009, 3 pages.
International Search Report & Written Opinion ofPCT Application No. PCT/US2010/030939, dated Jun. 16, 2010, 9 pages.
International Search Report & Written Opinion of PCT Application No. PCT/US2010/049172, dated Nov. 17, 2010, 7 pages.
International Search Report of PCT Application No. PCT/US2011/037792, dated Sep. 8, 2011, 2 pages.
USPTO Office action for U.S. Appl. No. 12/873,820 dated Oct. 11, 2012.
USPTO Office action for U.S. Appl. No. 12/749,466 dated Feb. 3, 2012.
USPTO Office action for U.S. Appl. No. 13/046,565 dated Feb. 2, 2012.
USPTO Office action for U.S. Appl. No. 13/046,565 dated Nov. 7, 2011.
USPTO Office action for U.S. Appl. No. 12/484,924 dated Oct. 31, 2011.
USPTO Office action for U.S. Appl. No. 12/497,289 dated Feb. 2, 2012.
USPTO Office action for U.S. Appl. No. 12/759,273 dated Nov. 21, 2011.
USPTO Office action for U.S. Appl. No. 12/762,269 (Oct. 12, 2011).
USPTO Office action for U.S. Appl. No. 12/762,271 dated Dec. 23, 2011.
USPTO Office action for U.S. Appl. No. 12/778,718 dated Nov. 25, 2011.
USPTO Notice of Allowance for U.S. Appl. No. 12/762,278 dated Nov. 7, 2011.
USPTO Office Action for U.S. Appl. No. 12/481,543 dated Jun. 27, 2011.
USPTO Office Action for U.S. Appl. No. 12/482,440 dated Feb. 23, 2011.
USPTO Office Action for U.S. Appl. No. 12/482,440 dated Aug. 12, 2011.
USPTO Office Action for U.S. Appl. No. 12/484,924 dated Apr. 14, 2011.
USPTO Office Action for U.S. Appl. No. 12/491,169 dated Oct. 22, 2010.
USPTO Office Action for U.S. Appl. No. 12/491,169 dated May 11, 2011.
USPTO Notice of Allowance for U.S. Appl. No. 12/497,289 dated May 22, 2012.
USPTO Office Action for U.S. Appl. No. 12/502,058 dated Dec. 8, 2010.
USPTO Office Action for U.S. Appl. No. 12/502,058 dated Aug. 19, 2011.
USPTO Notice of Allowance for U.S. Appl. No. 12/502,058 dated Apr. 16, 2012.
USPTO Office Action for U.S. Appl. No. 12/534,829 dated Apr. 19, 2011.
USPTO Notice of Allowance for U.S. Appl. No. 12/534,829 dated Oct. 28, 2011.
USPTO Notice of Allowance for U.S. Appl. No. 12/534,829 dated Dec. 5, 2011.
USPTO Notice of Allowance for U.S. Appl. No. 12/534,829 dated Dec. 21, 2011.
USPTO Office Action for U.S. Appl. No. 12/573,820 dated Mar. 2, 2011.
USPTO Office Action for U.S. Appl. No. 12/573,820 dated Oct. 11, 2011.
USPTO Office Action for U.S. Appl. No. 12/749,466 dated Jun. 29, 2011.
USPTO Office Action for U.S. Appl. No. 12/749,476 dated Apr. 11, 2011.
USPTO Office Action for U.S. Appl. No. 12/749,476 dated Nov. 8, 2011.
USPTO Notice of Allowance for U.S. Appl. No. 12/749,476 dated May 4, 2012.
USPTO Notice of Allowance for U.S. Appl. No. 12/762,269 dated Apr. 23, 2012.
USPTO Office Action for U.S. Appl. No. 12/762,271 dated Jun. 6, 2012.
USPTO Notice of Allowance for U.S. Appl. No. 12/778,718 dated Apr. 3, 2012.
USPTO Notice of Allowance for U.S. Appl. No. 12/778,718 dated Jun. 13, 2012.
USPTO Office Action for U.S. Appl. No. 12/868,441 dated Apr. 30, 2012.
USPTO Office Action for U.S. Appl. No. 12/880,803 dated Feb. 22, 2012.

(56) References Cited

OTHER PUBLICATIONS

USPTO Office Action for U.S. Appl. No. 12/883,652 dated Apr. 17, 2012.
USPTO Office Action for U.S. Appl. No. 12/884,993 dated Mar. 16, 2012.
USPTO Office Action for U.S. Appl. No. 13/014,622 dated Nov. 28, 2011.
USPTO Office Action for U.S. Appl. No. 13/014,622 dated Apr. 30, 2012.
USPTO Office Action for U.S. Appl. No. 13/046,565 dated Apr. 13, 2012.
USPTO Office Action for U.S. Appl. No. 12/884,993 dated Aug. 2, 16, 2012.
USPTO Notice of Allowance for U.S. Appl. No. 12/884,993 dated Nov. 26, 2012.
USPTO Office Action for U.S. Appl. No. 12/883,093 dated Mar. 13, 2012.
USPTO Office Action for U.S. Appl. No. 12/883,093 dated Aug. 3, 2012.
USPTO Notice of Allowance for U.S. Appl. No. 12/883,093 dated Nov. 21, 2012.
U.S. Appl. No. 61/249,568, filed Oct. 7, 2009, Raring et al. Unpublished.
U.S. Appl. No. 61/182,105, filed May 29, 2009, Raring, Unpublished.
U.S. Appl. No. 61/164,409, filed Mar. 28, 2009, Raring et al., Unpublished.
U.S. Appl. No. 12/573,820, filed Oct. 5, 2009, Raring et al., Unpublished.
U.S. Appl. No. 12/880,889, filed Sep. 13, 2010, Raring et al., Unpublished.
U.S. Appl. No. 12/727,148, filed Mar. 18, 2010, Raring, Unpublished.
USPTO Office Action for U.S. Appl. No. 14/317,846, dated Feb. 26, 2015.
USPTO Notice of Allowance for U.S. Appl. No. 14/317,846, dated May 26, 2015.

* cited by examiner

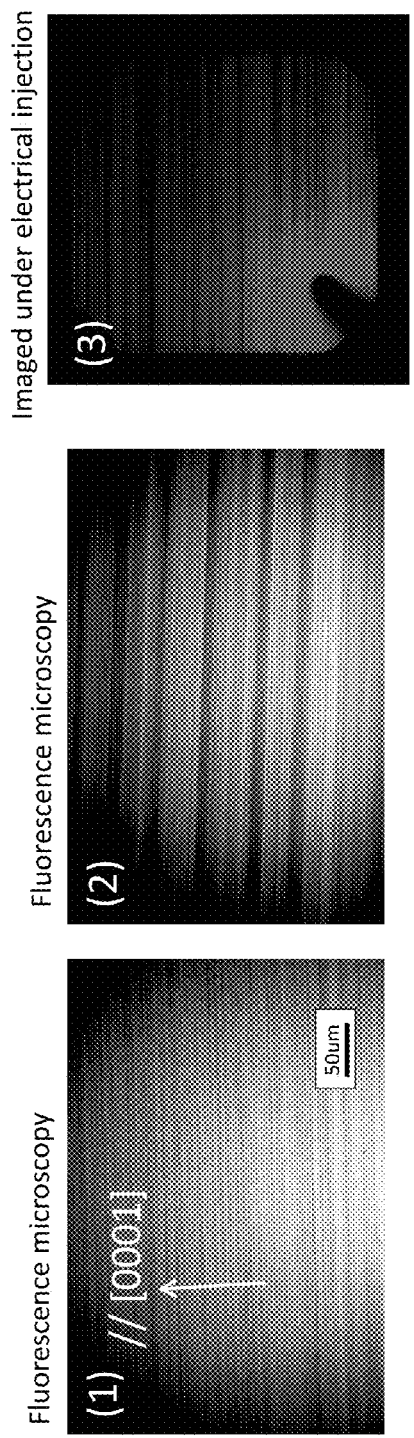
Figure 3A – Basal plane misfits in (20-21) films
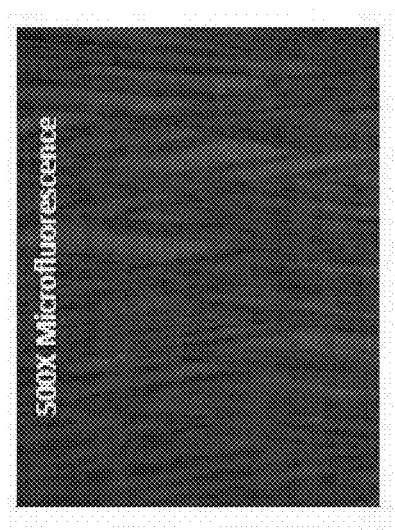
Figure 3B – Basal plane and non-basal plane misfits in (20-21) device

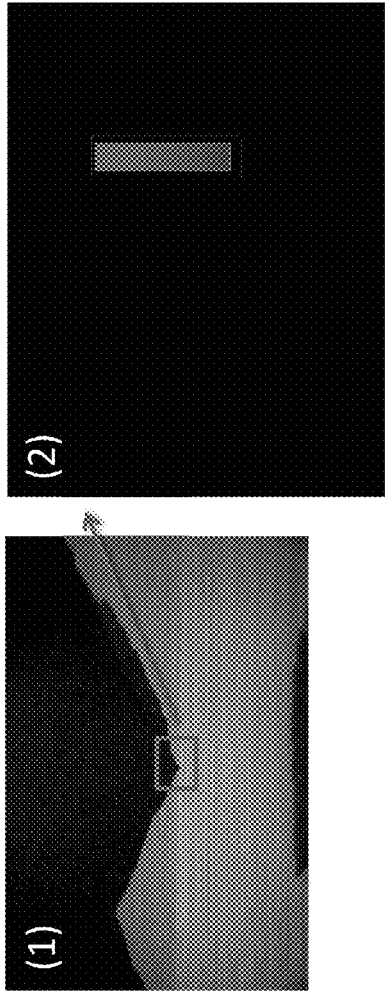
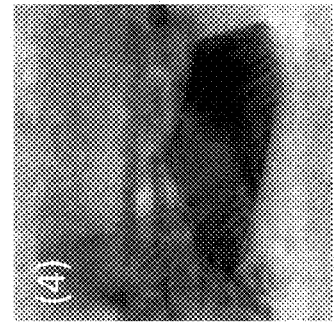
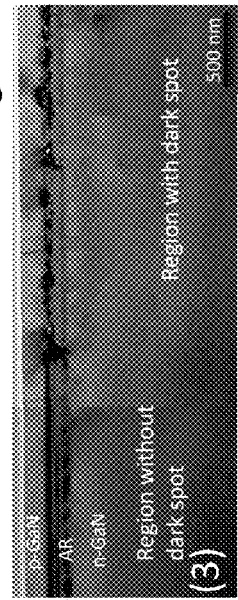
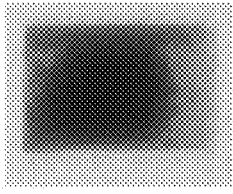
Figure 4B – Blue box shows location of TEM foil. (3) and (4) show TEM images of triangle defect as degraded active region consisting of faceted hollow or metal-filled voids.
Cross-sectional TEM image
Figure 4A – Green (20-21) LD

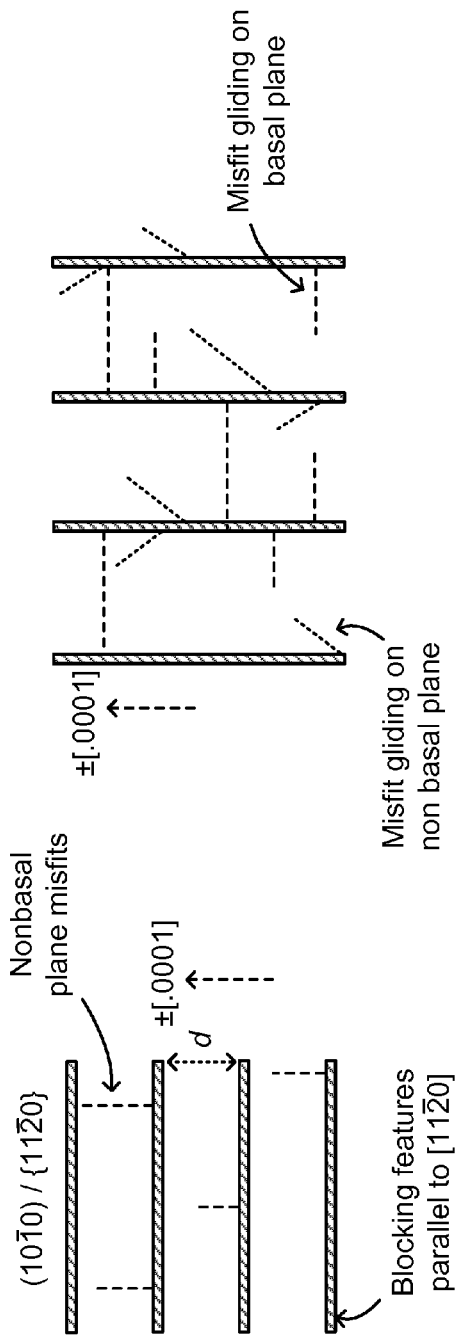
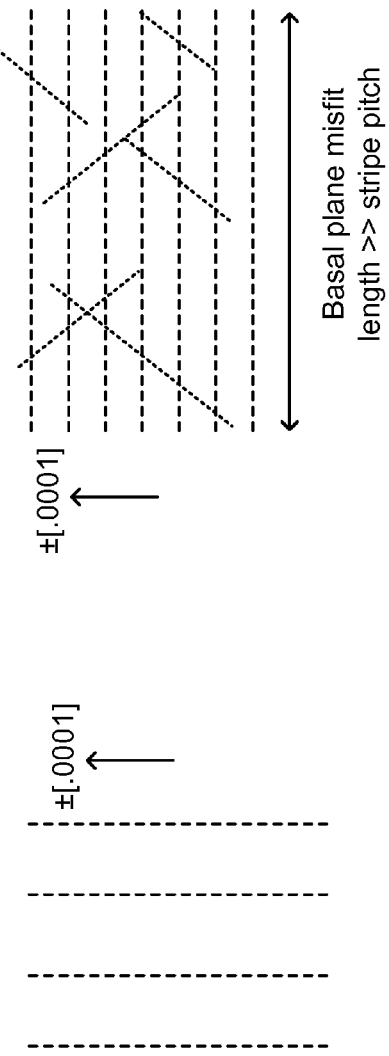
Figure 5A
Figure 5B

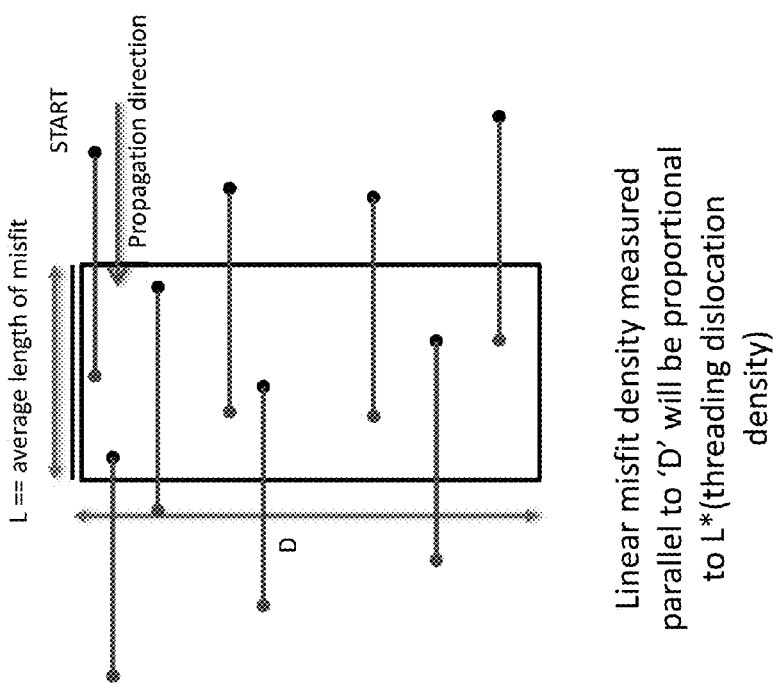

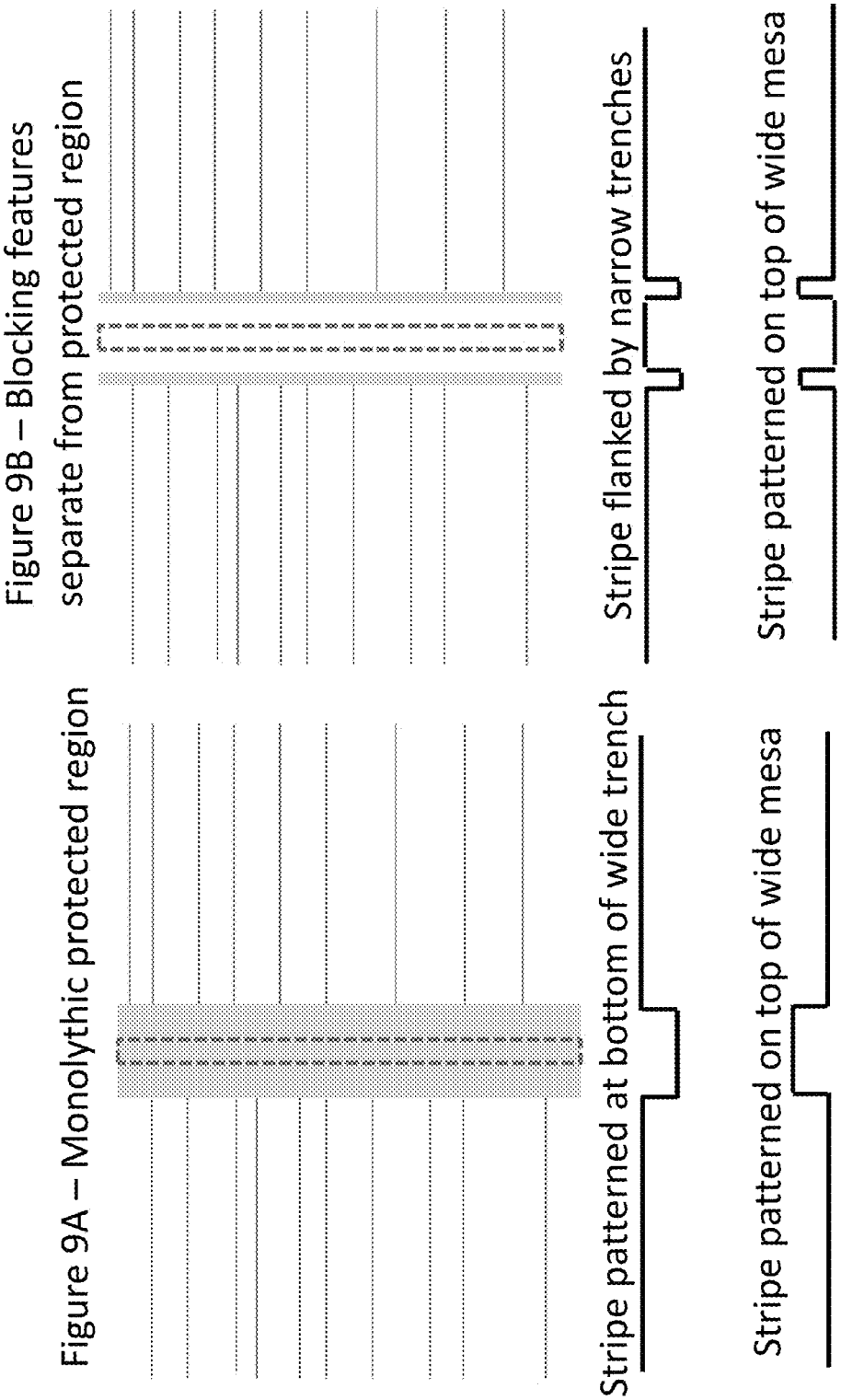

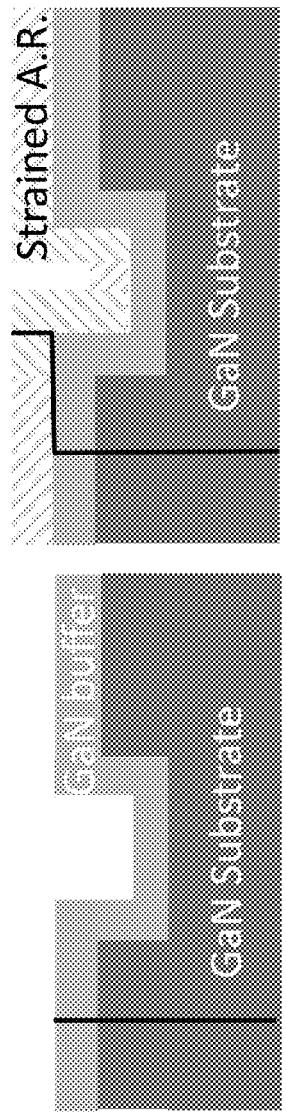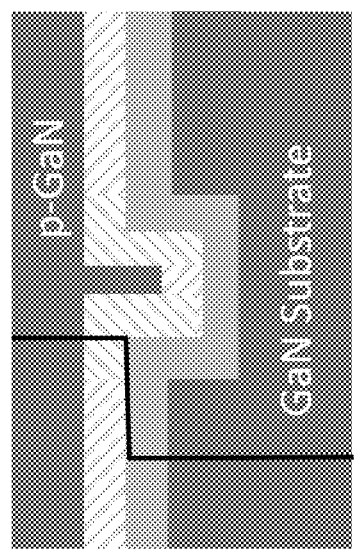
Figure 15A
Figure 15B
Figure 15C

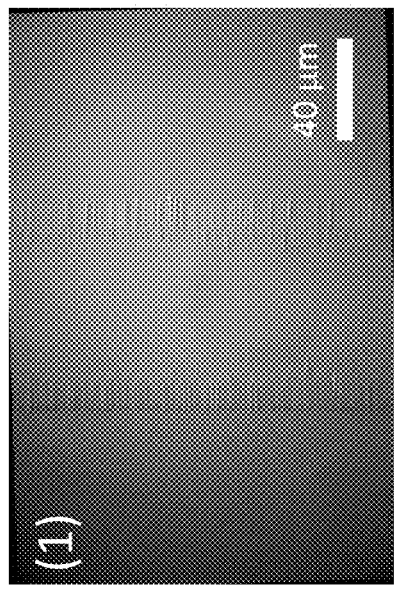
Figure 16A
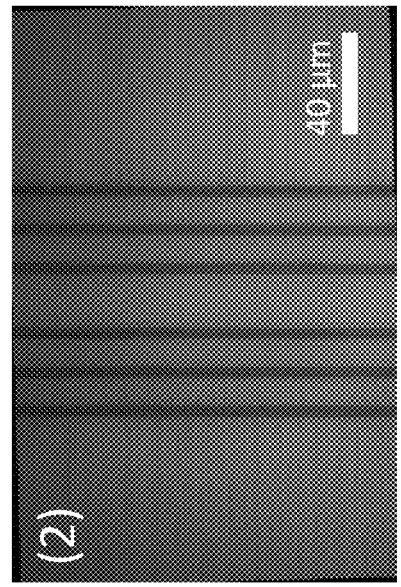
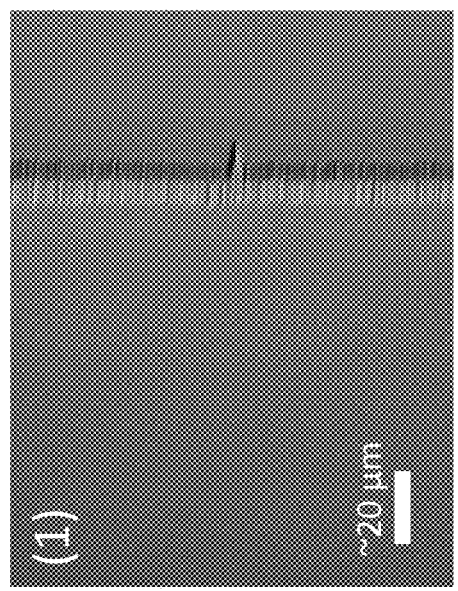
Figure 16B
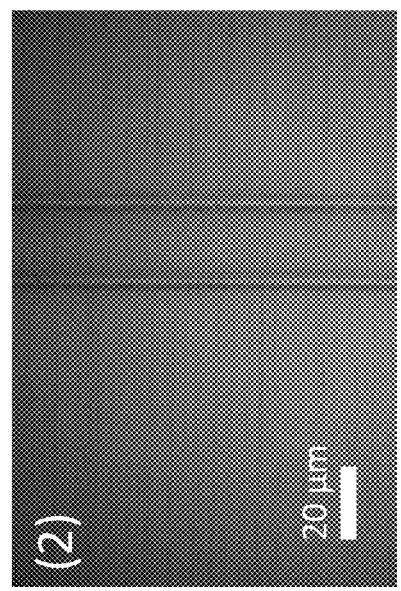

Spatial maps of photoluminescence measurements taken from a single laser diode device grown on patterned semipolar wafer.

GALLIUM NITRIDE CONTAINING LASER DEVICE CONFIGURED ON A PATTERNED SUBSTRATE

This application is a continuation of U.S. patent application Ser. No. 14/317,846, filed on Jun. 27, 2014, which claims the benefit of U.S. Patent Application Ser. No. 61/841,138, filed on Jun. 28, 2013, both of which are hereby incorporated by reference for all purposes. This application is related to U.S. application Ser. No. 13/651,291 filed on Oct. 12, 2012, and U.S. application Ser. No. 13/850,187 filed on Mar. 25, 2013, both of which are hereby incorporated by reference for all purposes.

FIELD

The present disclosure relates to methods for users of electronic devices to regulate their activities by helping them to balance entertainment or communication activities with educational or productivity activities. The disclosed methods monitor and control, for example, the time kids spend on games and ensure that such time can be balanced with use of educational applications.

BACKGROUND

The present disclosure relates generally to optical techniques. More specifically, the present disclosure provides methods and devices using semi-polar oriented gallium and nitrogen containing substrates for optical applications.

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of about 1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5% to 10%, and further commercialization ensue into more high end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal, which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature, which limits their application.

From the above, it is seen that techniques for improving optical devices is highly desired.

SUMMARY

The present disclosure relates generally to optical techniques. More specifically, the present disclosure provides methods and devices using semi-polar oriented gallium and nitrogen containing substrates for optical applications.

In an example, the present invention provides a gallium and nitrogen containing laser diode device. The device has a gallium and nitrogen containing substrate material comprising a surface region. The surface region is configured on either a non-polar crystal orientation or a semi-polar crystal orientation. The device has a recessed region formed within a second region of the substrate material, the second region being between a first region and a third region. The recessed region is configured to block a plurality of defects from migrating from the first region to the third region. The device has an epitaxially formed gallium and nitrogen containing region formed overlying the third region. The epitaxially formed gallium and nitrogen containing region is substantially free from defects migrating from the first region and an active region formed overlying the third region.

In an example, the present invention provides a method for fabricating a gallium and nitrogen containing laser diode device. The method includes providing a gallium and nitrogen containing substrate material comprising a surface region, which is configured on either a non-polar crystal orientation or a semi-polar crystal orientation. The method includes forming a migration blocking region (MBR) formed within a second region of the substrate material. The second region is between a first region and a third region. The MBR is configured to block a plurality of first defects from migrating from the first region to the third region and is configured to block a plurality of second defects migrating from the third region to the first region. The method includes forming an epitaxially formed gallium and nitrogen containing region overlying at least the first region and the third region while maintaining the plurality of second defects in the third region and while maintaining the plurality of first defects in the first region and forming an active region formed overlying the third region.

In an alternative example, the present invention provides a gallium and nitrogen containing laser diode device. The device includes a gallium and nitrogen containing substrate material comprising a surface region, which is configured on either a non-polar crystal orientation or a semi-polar crystal orientation. The device has a migration blocking region (MBR) formed within a second region of the substrate material. The second region is between a first region and a third region. The MBR is configured to block a plurality of first defects from migrating from the first region to the third region and is configured to block a plurality of second defects migrating from the third region to the first region. An epitaxially formed gallium and nitrogen containing region is formed overlying at least the first region and the third region while maintaining the plurality of second defects in the third region and while maintaining the plurality of first defects in the first region and forming an active region formed overlying the third region.

In an example, the present techniques include a transparent conductive oxide such as indium tin oxide (ITO) incorporated in the p-type cladding region or overlying the p-type cladding regions, highly reflective metals such as Ag overlying the p-type cladding regions, and/or etched facets. One or more examples of certain benefits that may be achieved with this technique can be provided as follows:

1. Increased material gain due to higher material quality enabling higher radiative efficiencies. Increased material gain will provide lower threshold current density and higher laser efficiency.

2. Increased laser diode lifetime due to lower defect density in or around the active region. Such defects can act as non-radiative combination centers.

3. Increased strain budget to enable better active region and waveguide designs before the onset of strain induced material degradation. For example, this technique employed in a green laser design can enable the growth of high quality InGaN SCH layers with thicknesses ranging from 50 nm to 150 nm with high indium content of up to 15% or higher InN mol fraction. In other examples, this technique can enable green lasers containing active regions with a very high number of quantum wells such as 7, 9, 11, or even higher. Such design improvements allow for lower loss and higher gain within the laser diodes to improve the efficiency in preferred examples. These and other benefits can be achieved using one or more of the following aspects:

1. Thin barriers ranging from 1.5 nm to 4 nm;
2. Substantially Al-free cladding regions;
3. 3-5 quantum wells, 6-8 quantum wells, 9-12 quantum wells;
4. Etched facets;
5. Transparent conductive oxide such as indium tin oxide (ITO) in or overlying the p-type cladding regions;
5. Highly reflective metal contact such as Ag overlying the p-type cladding regions; and
6. Combinations of 4 and 5 and combinations of the other above.

In a first aspect, gallium and nitrogen containing laser diode devices are provided, the devices comprising: a gallium and nitrogen containing substrate material comprising a surface region, the surface region being configured on either a non-polar crystal orientation or a semi-polar crystal orientation; a recessed region formed within a second region of the substrate material, the second region being between a first region of the substrate and a third region of the substrate, the recessed region being configured to block a plurality of defects from migrating from the first region to the third region; an epitaxially formed gallium and nitrogen containing region formed overlying the third region, the epitaxially formed gallium and nitrogen containing region being substantially free from defects migrating from the first region; an active region formed overlying the third region; a p-type region overlying the active region; a laser stripe region overlying a portion of the third region, the laser stripe region being characterized by a cavity orientation substantially parallel to a projection of a c-direction or in a c-direction, the laser stripe region having a first end and a second end; and a first facet provided on the first end of the laser stripe region and a second facet provided on the second end of the laser stripe region.

In a second aspect, gallium and nitrogen containing laser diode devices are provided, the devices comprising: a gallium and nitrogen containing substrate material comprising a surface region, the substrate surface region being configured on either a non-polar crystal orientation or a semi-polar crystal orientation; a migration blocking region (MBR) formed within a second region of the substrate surface region, the second region being between a first region of the substrate surface region and a third region of the substrate surface region, the MBR being configured to block a plurality of defects from migrating from the first region to the third region; an epitaxially formed gallium and nitrogen containing region formed overlying the third region, the epitaxial region being substantially free from defects migrating from the first region to the third region; an active region formed overlying the third region; and a p-type region overlying the active region.

In a third aspect, methods for fabricating a gallium and nitrogen containing laser diode devices are provided, the methods comprising: providing a gallium and nitrogen containing substrate material comprising a surface region, the substrate surface region being configured on either a non-polar crystal orientation or a semi-polar crystal orientation; forming a migration blocking region (MBR) within a second region of the substrate surface region, the second region being between a first region of the substrate surface region and a third region of the substrate surface region, the MBR being configured to block a plurality of first defects from migrating from the first region to the third region and being configured to block a plurality of second defects migrating from the third region to the first region; forming an epitaxially gallium and nitrogen containing region overlying at least the first region and the third region while maintaining the plurality of second defects in the third region and while maintaining the plurality of first defects in the first region; forming an active region overlying the third region; and forming a p-type region overlying the active region.

In a fourth aspect, gallium and nitrogen containing laser diode devices are provided, the devices comprising: a gallium and nitrogen containing substrate material comprising a surface region, the substrate surface region being configured on either a non-polar crystal orientation or a semi-polar crystal orientation; a migration blocking region (MBR) formed within a second region of the substrate surface region, the second region being between a first region of the substrate surface region and a third region substrate surface region, the MBR being configured to block a plurality of defects from migrating from the first region to the third region and being configured to block a plurality of second defects from migrating from the third region to the first region; an epitaxially formed gallium and nitrogen containing region formed overlying the third region, the epitaxially formed gallium and nitrogen containing region being substantially free from defects migrating from the first region; an n-type cladding region formed overlying the epitaxially formed gallium and nitrogen containing region; an active region formed overlying the third region, the active region comprises a plurality of quantum wells ranging from two to eleven, each pair of quantum well regions having a barrier region disposed there between; a p-type gallium and nitrogen containing cladding region formed overlying the active region; and a laser stripe region overlying a portion of the third region, the laser stripe region being characterized by a cavity orientation substantially parallel to a projection of a c-direction or in a c-direction, the laser stripe region having a first end and a second end; a first facet provided on the first end of the laser stripe region and a second facet provided on the second end of the laser stripe region.

In a fifth aspect, gallium and nitrogen containing laser diode devices are provided, the devices comprising: a gallium and nitrogen containing substrate material comprising a surface region, the substrate surface region being configured on either a non-polar crystal orientation or a semi-polar crystal orientation; a migration blocking region (MBR) formed within a second region of the substrate surface region, the second region being between a first region of the substrate surface region and a third region of the substrate surface region, the MBR being configured to block a plurality of defects from migrating from the first region to the third region and being configured to block a plurality of second defects from migrating from the third region to the first region; an epitaxially formed gallium and nitrogen containing region formed overlying the third region, the epitaxially formed gallium and nitrogen containing region being substantially free from defects migrating from the first region; an n-type cladding region formed overlying the epitaxially formed gallium and nitrogen containing region; an active region formed overlying the third region, the active region comprising a plurality of quantum wells ranging from two to eleven, a barrier region disposed between each pair of quantum wells; a laser stripe region overlying a portion of the third region, the laser stripe region being characterized by a cavity orientation substantially parallel to a projection of a c-direction or in a c-direction, the laser stripe region having a first end and a second end; a first etched facet provided on the first end of the laser stripe region and a second etched facet provided on the second end of the laser stripe region; and a p-type gallium and nitrogen containing cladding region formed overlying the active region.

In a sixth aspect, gallium and nitrogen containing laser diode devices are provided, the devices comprising: a gallium and nitrogen containing substrate material comprising a surface region, the substrate surface region being configured on either a non-polar crystal orientation or a semi-polar crystal orientation; a migration blocking region (MBR) formed within a second region of the substrate surface region, the second region being between a first region of the substrate surface region and a third region of the substrate surface region, the MBR being configured to block a plurality of defects from migrating from the first region to the third region and being configured to block a plurality of second defects from migrating from the third region to the first region; an epitaxially formed gallium and nitrogen containing region formed overlying the third region, the epitaxially formed gallium and nitrogen containing region being substantially free from defects migrating from the first region; an n-type cladding region formed overlying the gallium and nitrogen containing region; an active region formed overlying the third region, the active region comprises a plurality of quantum wells ranging from two to eleven, a barrier region disposed between each pair of quantum wells; a laser stripe region overlying a portion of the third region, the laser stripe region being characterized by a cavity orientation substantially parallel to a projection of a c-direction or in a c-direction, the laser stripe region having a first end and a second end; a first facet provided on the first end of the laser stripe region and a second facet provided on the second end of the laser stripe region; a p-type gallium and nitrogen containing cladding region formed overlying the active region; and a conductive oxide layer overlying the p-type gallium and nitrogen containing cladding region.

In a seventh aspect, gallium and nitrogen containing laser diode devices are provided, the devices comprising: a gallium and nitrogen containing substrate material comprising a surface region, the substrate surface region being configured on either a non-polar crystal orientation or a semi-polar crystal orientation; a migration blocking region (MBR) formed within a second region of the substrate surface region, the second region being between a first region of the substrate surface region and a third region of the substrate surface region, the MBR being configured to block a plurality of defects from migrating from the first region to the third region and being configured to block a plurality of second defects from migrating from the third region to the first region; an epitaxially formed gallium and nitrogen containing region formed overlying the third region, the epitaxially formed gallium and nitrogen containing region being substantially free from defects migrating from the first region; an n-type cladding region formed overlying the gallium and nitrogen containing region; an active region formed overlying the third region, the active region comprises a plurality of quantum wells ranging from two to eleven, a barrier layer disposed between each pair of quantum wells; a laser stripe region overlying a portion of the third region, the laser stripe region being characterized by a cavity orientation substantially parallel to a projection of a c-direction or in a c-direction, the laser stripe region having a first end and a second end; a first facet provided on the first end of the laser stripe region and a second facet provided on the second end of the laser stripe region; a p-type gallium and nitrogen containing cladding region formed overlying the active region; a reflective metal layer overlying the p-type gallium and nitrogen containing cladding region; and the reflective metal layer comprises silver.

In an eighth aspect, gallium and nitrogen containing laser diode devices are provided, the devices comprising: a gallium and nitrogen containing substrate material comprising a surface region, the surface region being configured on either a non-polar crystal orientation or a semi-polar crystal orientation; an epitaxially formed gallium and nitrogen containing region formed overlying the substrate material; an n-type cladding region formed overlying the gallium and nitrogen containing region; an active region formed overlying the third region, the active region comprising a plurality of quantum wells ranging from two to eleven, a barrier region disposed between each pair of quantum wells; a laser stripe region overlying a portion of the third region, the laser stripe region being characterized by a cavity orientation substantially parallel to a projection of a c-direction or in a c-direction, the laser stripe region having a first end and a second end; a first etched facet provided on the first end of the laser stripe region and a second etched facet provided on the second end of the laser stripe region; a p-type gallium and nitrogen containing cladding region formed overlying the active region; a reflective metal layer overlying the p-type gallium and nitrogen containing cladding region; and the reflective metal layer comprises silver.

In a ninth aspect, gallium and nitrogen containing laser diode devices are provided, the devices comprising: a gallium and nitrogen containing substrate material comprising a surface region, the substrate surface region being configured on either a non-polar crystal orientation or a semi-polar crystal orientation; an epitaxially formed gallium and nitrogen containing region formed overlying the substrate surface region; an n-type cladding region formed overlying the epitaxially formed gallium and nitrogen containing region; an active region formed overlying the third region, the active region comprises a plurality of quantum wells ranging from two to eleven, a barrier region disposed between each pair of quantum wells; a laser stripe region overlying a portion of the third region, the laser stripe region being characterized by a cavity orientation substantially parallel to a projection of a c-direction or in a c-direction, the laser stripe region having a first end and a second end; a first etched facet provided on the first end of the laser stripe region and a second etched facet provided on the second end of the laser stripe region; a p-type gallium and nitrogen containing cladding region formed overlying the active region; and a conductive oxide layer overlying the p-type gallium and nitrogen containing cladding region.

Embodiments provided by the present disclosure achieve these benefits and others in the context of known process technology. However, a further understanding of the nature and advantages of the embodiments disclosed herein may be realized by reference to the specification and the attached drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 3A shows emissions pertaining to formation of basal plane misfits in or near the active regions in our green LD devices, grown on (20-21) oriented substrates according to examples.

FIG. 3B shows a microfluorescence image of basal plane and non-basal plane misfit in a (20-21) device.

FIG. 4A shows an image of a green laser diode having a (20-21) orientation with a high density of dark triangle defects.

FIG. 4B shows Nomarski mages of individual triangle defects with higher magnification image showing internal structure and point of nucleation.

FIG. 5A shows schematic diagrams of misfit distributions on substrates with linear misfit blocking features arresting the glide of threading dislocations in strained epitaxial films (e.g., the active region), according to certain embodiments.

FIG. 5B shows schematic diagrams of misfit distributions on substrates without misfit blocking features.

FIG. 7A shows the relationship between threading dislocation density and linear misfit density for basal plane misfits.

FIGS. 9A and 9B show two types of blocking FIG. 9A shows a monolithic approach in which the etched trench or mesa coincides with the location of a laser stripe, and the blocking occurs at the edges of this region. FIG. 9B shows an approach in which blocking features are separate or remote from the laser stripe, i.e. two or more trenches, mesas or defective regions are defined on the substrate and the laser stripe is disposed in a region between the blocking features according to certain embodiments.

FIGS. 15A-15C show diagrams of the coalescence process for a narrow trench, with trench width and depth selected to allow for coalescence only after the strained layers are grown according to certain embodiments.

FIG. 16A-16B shows laser diode films grown on patterned semipolar substrates containing regions isolated by 5 micron wide trenches according to certain embodiments.

DETAILED DESCRIPTION

Figure 1:
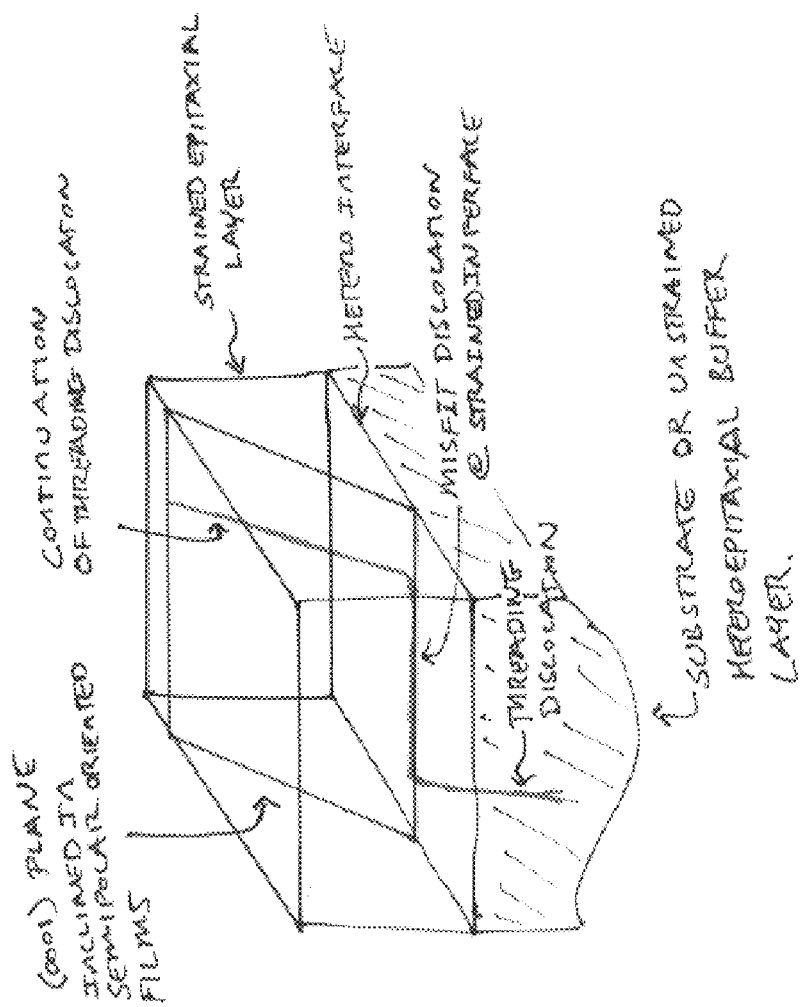
FIGS. 1 and 2 illustrate schematics of basal and non-basal plane slip geometries according to examples.

The present disclosure relates generally to optical techniques. More specifically, the present disclosure provides methods and devices using semi-polar oriented gallium and nitrogen containing substrates for optical applications. More particularly, the present invention provides a method and device using a gallium and nitrogen containing substrate configured on the {20-21} family of planes or an off-cut of the {20-21} family of planes toward the plus or minus c-plane and/or toward the a-plane according to one or more embodiments, but there can be other configurations. Such family of planes include, but are not limited to, (30-3-2), (20-2-1), (30-3-1), (30-32), (20-21), (30-31) or any orientation within +/−10 degrees toward c-plane and/or a-plane from these orientations. In particular, the present invention provides a method and device for emitting electromagnetic radiation using nonpolar or semipolar gallium containing substrates such as GaN, AlN, InN, InGaN, AlGaN, and AlInGaN, and others. The invention can be applied to optical devices, lasers, light emitting diodes, solar cells, photoelectrochemical water splitting and hydrogen generation, photodetectors, integrated circuits, and transistors.

One feature of non-polar and semi-polar films is the formation of misfit dislocations at strained interfaces. In c-plane oriented films the available slip systems require sufficiently large strains to induce slip that misfits are difficult to produce. This is not the case in semi-polar films, as slip of threading dislocations on the inclined basal plane and on inclined m-planes is commonly observed. It should also be possible to see slip on prismatic planes and inclined a-planes in semi-polar and non-polar films. Indeed, slip on inclined m-planes is observed at low density in some of our non-polar blue LD structures.

These misfits appear to form due to the translation of threading dislocations that are inherent to the underlying GaN substrate. This translation is driven by strain in the heteroepitaxial layer and leaves behind a dislocation in the plane of the interface which relieves strain and is called a 'misfit' dislocation. See FIGS. 1 and 2 for schematics of basal and non-basal plane slip geometries. In FIG. 2, angle of misfit θ relative to $\{11\bar{2}0\}$ goes to 90° as substrate misorientation from $(10\bar{1}0)$ goes to 0°. Formation of basal plane misfits in or near the active regions is common in our green LD devices, grown on (20-21) oriented substrates, and impacts the emission from the active region as can be observed in FIGS. 3A-3B. This may have a negative impact on our LD devices, either by reducing radiative emission near the misfit, or by populating the laser stripe with localized regions of lower carrier concentration due to higher non-radiative recombination rates near the misfits. Being able to prevent misfit formation in the region of a semipolar laser diode may enable higher performance for standard structures as well as allow for the growth of fully strained structures with much higher active region volumes (resulting in better AlGaN free guiding as well as high current radiative efficiency) that are possible with high efficacy today.

Figure 7B:
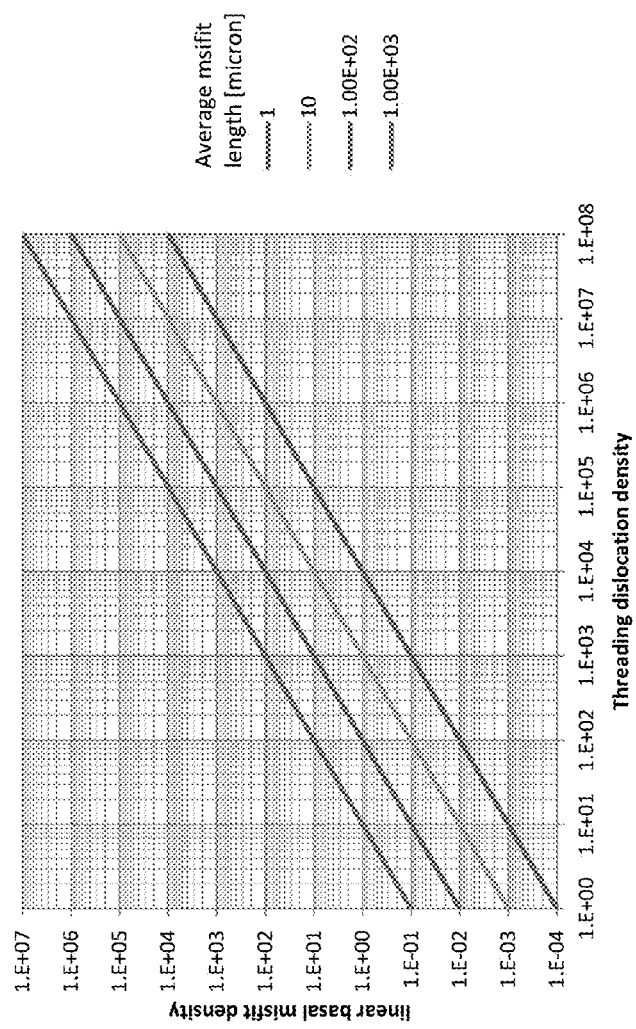
FIG. 7B shows the calculated relationship between linear misfit density and threading dislocation density on TDD for various average misfit glide lengths.
Figure 8A:
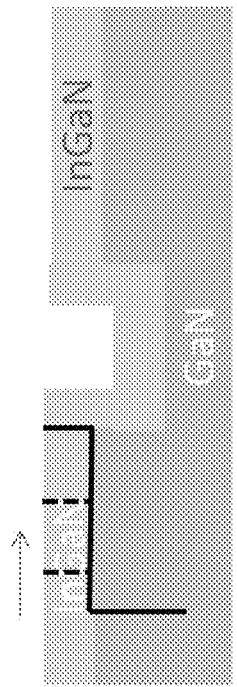
FIGS. 8A and 8B show etched mesas and etched trenches, respectively, that have been etched into the substrate prior to growth of epitaxial layers.
Figure 8B:
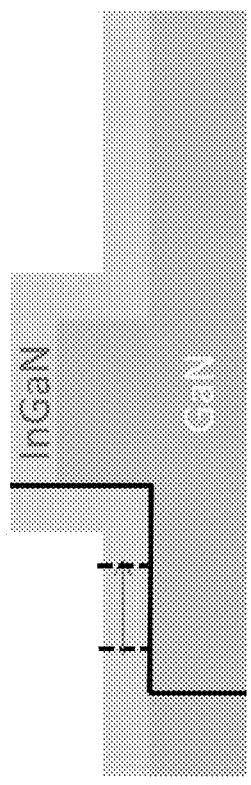
Figure 8C:
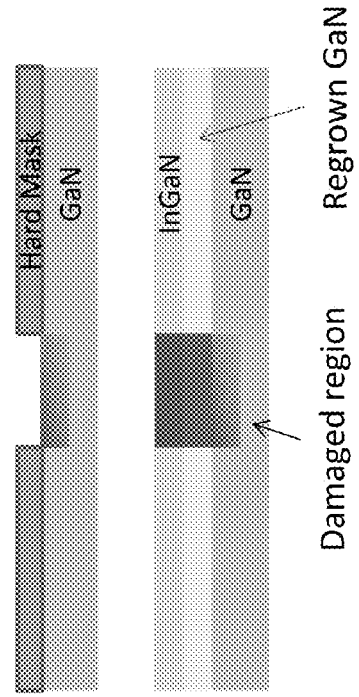
FIG. 8C shows a trench produced with a selective area growth process utilizing a mask deposited on the wafer prior to growth of epitaxial layers.
Figure 8D:
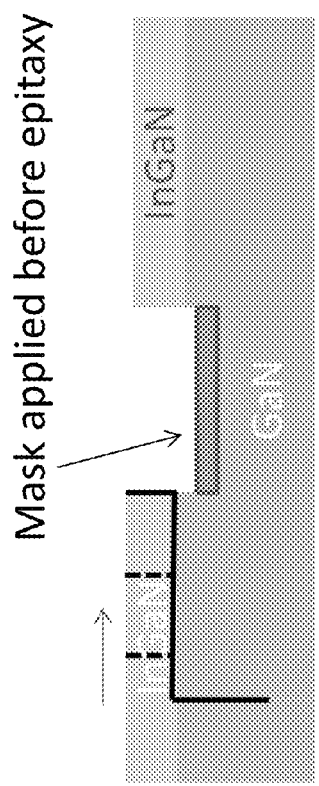
FIG. 8D shows a misfit barrier blocking feature defined by patterned damage to a substrate consisting of defective GaN that is induced by some pre-growth, patterned processing of the substrate wafer that then yields defective regions in the subsequently grown epitaxial films according to certain embodiments.

FIG. 7B shows a rough calculation of misfit linear density vs. threading dislocation density and average line length of a misfit. This calculation assumes all threading dislocations participate in misfit formation. For substrates with high densities of threading dislocations (>1E6/$cm^2$) the misfit density is large (>100/$cm^2$) for even short average misfit lengths (~1 micron). As the misfit line length approaches 1 mm, misfit densities can be kept below 100 $cm^2$ only by reducing the substrate TDD<1E2/$cm^2$. Misfit blocking structures may be necessary to provide misfit free regions even on very high quality GaN substrates.

FIGS. 5A-5B shows a schematic of the general idea, with in FIG. 5A some generic linear blocking feature arresting the glide of threading dislocations in the strained epitaxial films (e.g., the active region of our devices), in an example. For non-polar films the blocking features may be arrayed parallel to the c-plane so as to stop m-plane slip which is sometimes observed in our non-polar blue devices. In semi-polar films, both the basal and non-basal plane slip systems are oriented with some component parallel to [0001], so [0001] parallel blocking features can be used to limit their extent.

Figure 6:
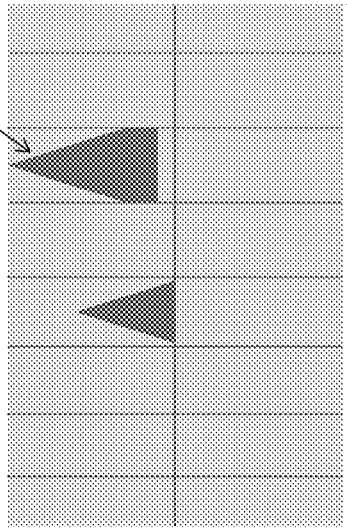
FIG. 6 shows a second defect type observed in our green devices according to an example.

FIGS. 4A-4B and 6 describe a second defect type observed in our green devices. These defects consist of degraded active region material and consist of partially hollow or metal filled voids that are arrayed along crystallographic directions (giving the arrays of voids a triangular shape). Since these defects nucleate as a single point and then become self-propagating it may follow that we may be able to interrupt the expansion of this kind of defect by introducing a discontinuity in the active region.

The blocking features under consideration are shown in FIG. 8 and consist of 4 classes of features. FIGS. 8A and 8B show mesas and trenches, respectively, etched into the substrate prior to growth. Growth of the epitaxial layers do not fill the trenches and there is either a step up or down at the edges of the features that can block the glide of threading dislocations. FIG. 8C shows a trench produced with a selective area growth process utilizing a mask deposited on the wafer prior to growth. FIG. 8D shows the last class of blocking features, which may consist of defective GaN that is induced by some pre-growth, patterned processing of the substrate wafer that then yields defective regions in the subsequently grown epitaxial films. The defects in the defective regions may then impede the motion of gliding threading dislocations (e.g., similar to dislocation motion impediment at grain boundaries). This processing can consist of high-dose ion implantation of the substrate, deposition of an anti-surfactant, deposition of non-fully dense mask (e.g., micro-masking), deposition of a porous mask (e.g., nano-masking), deposition of foreign species to disturb growth (e.g., metals, silicon, anti-surfactants), or chemical or photo-chemical etching of the substrate to produce porous GaN.

FIGS. 9A-9B shows the 2 classes of blocking that may occur. 9A shows a monolithic approach, where the etched trench or mesa is also the location of the laser stripe, and the blocking occurs at the edges of this region. FIG. 9B shows the other class, where the blocking features are remote from the laser stripe, i.e. two or more mesa or stripes (or defective regions as in FIG. 8D) are defined on the substrate and the laser stripe is disposed in a region between the blocking features.

Figure 10:
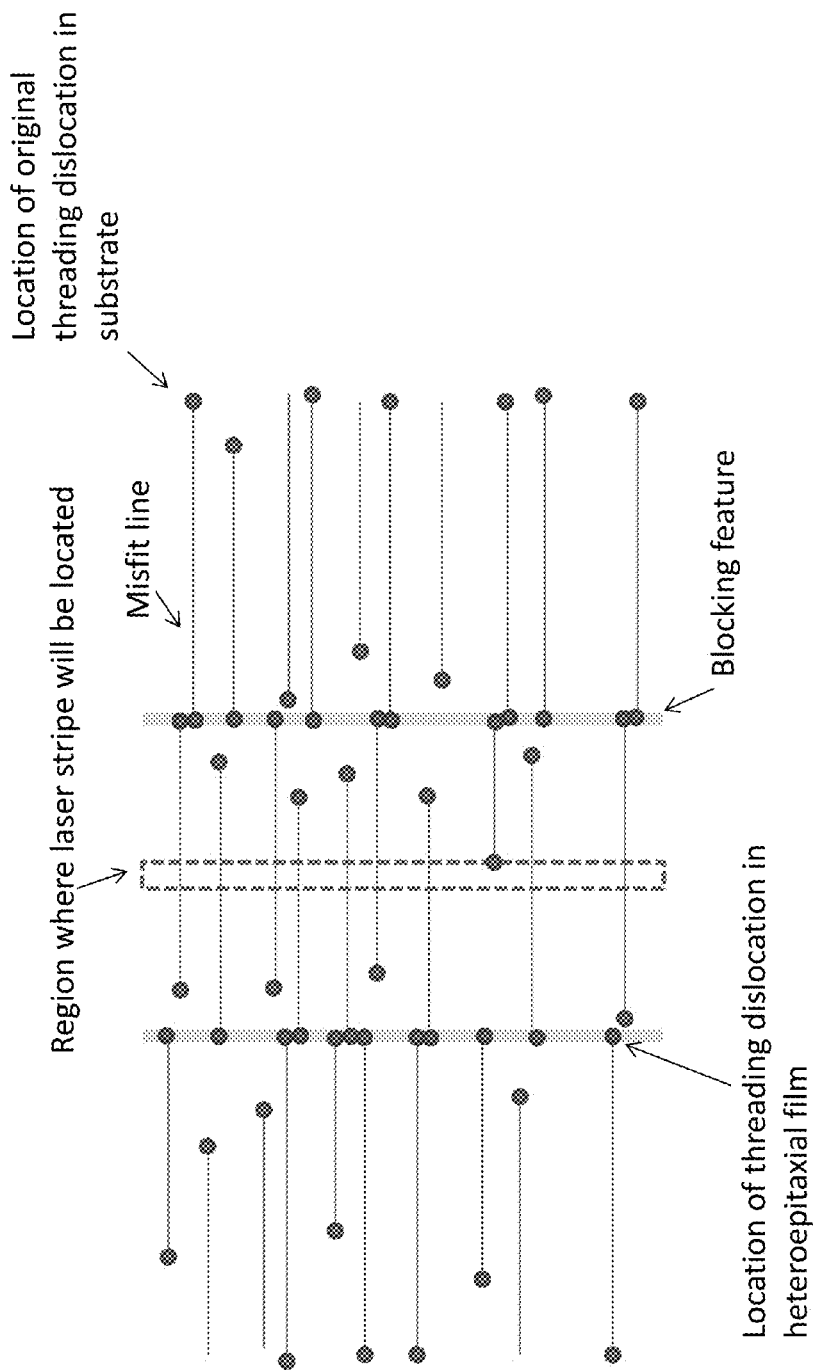
FIG. 10 illustrates blocking features for control of threading dislocation density in intentionally relaxed films according to certain embodiments. Typically one would expect misfits to glide an average distance, simply displacing the location of the original threading dislocation and leaving the threading dislocation density and distribution relatively unchanged. By introducing blocking features, one forces the misfits to stop gliding at specific locations, thereby reducing the dislocation density within the device. Blocking feature geometry can be tailored to either prevent misfit propagation onto laser device or encourage partial relaxation of epi-film via misfit formation while eliminating TDs.

FIG. 10 shows a potential application of such features that has not been applied to semipolar GaN substrates. Typically we expect to see threading dislocations distributed more-or-less uniformly across our substrates. Depending on how the substrates are grown there may be some variation from region to region across the wafer. The expectation is, especially for wider stripes, that some threading dislocations may be found in all stripe regions. Since threading dislocations are sources of failure in LDs, it may be advantageous to remove threading dislocations from the regions where laser stripes will be defined. Typically, one may expect the glide of threading dislocations during misfit formation to move all threading dislocations available to glide an average distance, leaving the threading dislocation distribution over the majority of the substrate unchanged. By introducing blocking features at some critical length scale much shorter than the average misfit glide length one can theoretically force a substantial portion or all of the threading dislocations to collect at the blocking feature; leaving the region of the stripe relatively free of misfits. For certain designs, this can result in partially relaxed (metamorphic) buffer layers that are relatively threading dislocation free. Relaxation of the buffer layer may allow for growth of higher quality active regions due to the InGaN quantum wells being under lower strain. Because all of the misfits have been localized to the blocking features one can then growth even more highly strained films on top of these relaxed buffers, as there may be a much lower density of threading dislocations available to glide and result in strain relaxation via misfit formation.

Figure 11B:
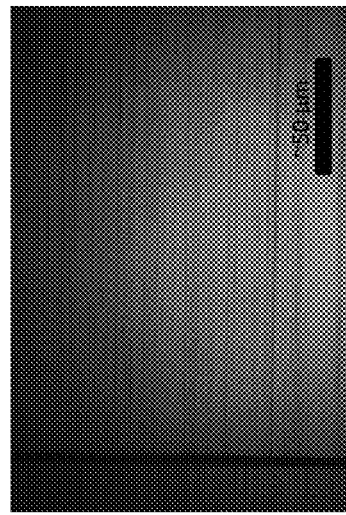
FIG. 11A-11C show fluorescence micrographs of a laser diode structure grown on a GaN semipolar substrate etched before growth with test patterns consisting of 5 micron wide trenches separated by unetched regions of varying width according to certain embodiments.
Figure 11A:
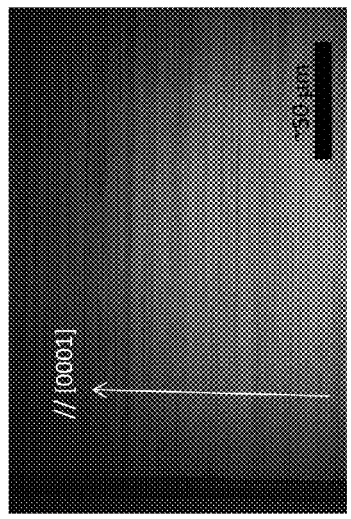
Figure 11C:
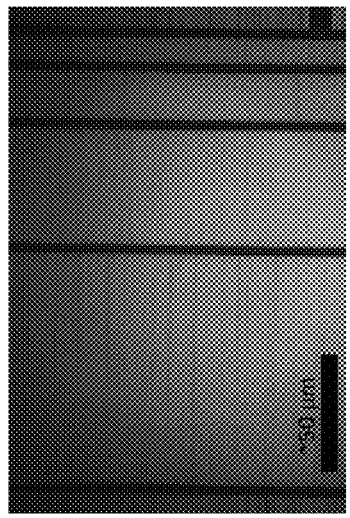

FIGS. 11A-11C shows fluorescence micrographs of a laser diode structure grown on a GaN semipolar substrate etched before growth with test patterns consisting of 5 micron wide trenches separated by unetched regions of varying width. Parallel lines of contrast (referred to here as "striations") can be seen running perpendicular to the [0001] direction. These striations are due to spatial variation in radiative recombination efficiency near misfit dislocations that form from threading dislocations that slip on the basal plane. Here it is shown that the more narrowly spaced trenches bound regions significantly lower striation density than more widely spaced trenches. This is consistent with the model that the misfit dislocations are derived from threading dislocations inherent to the substrate, that the threading dislocations slip due to misfit strain and propagate laterally through the film. Interrupting the areal contiguity of the strained layer through which the misfit is gliding with an etched feature, such as a trench or mesa, arrests the motion of the misfit. This limits the misfit density to be a function of the total number of threading dislocation contained within the bounded region.

Figure 2:
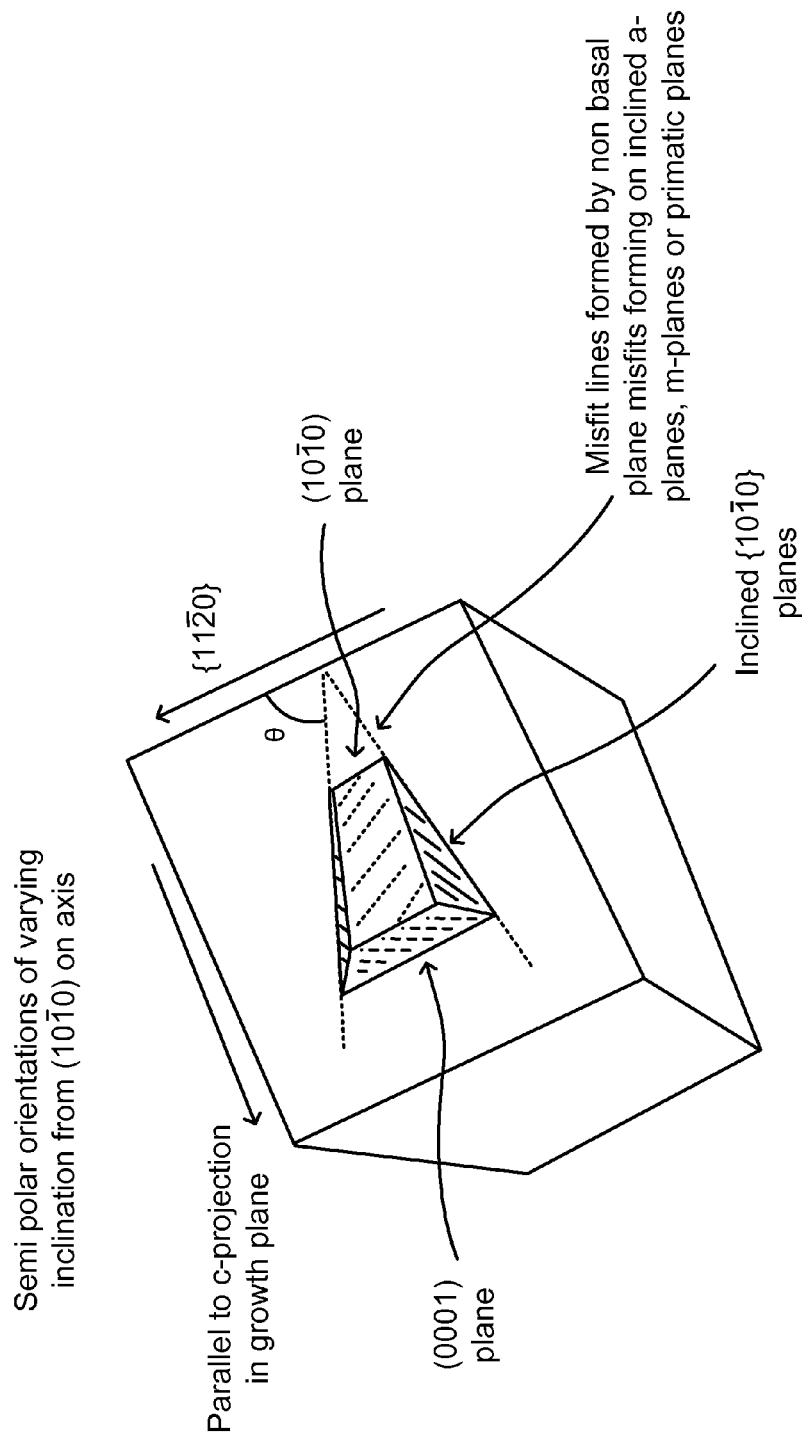
Figure 12:
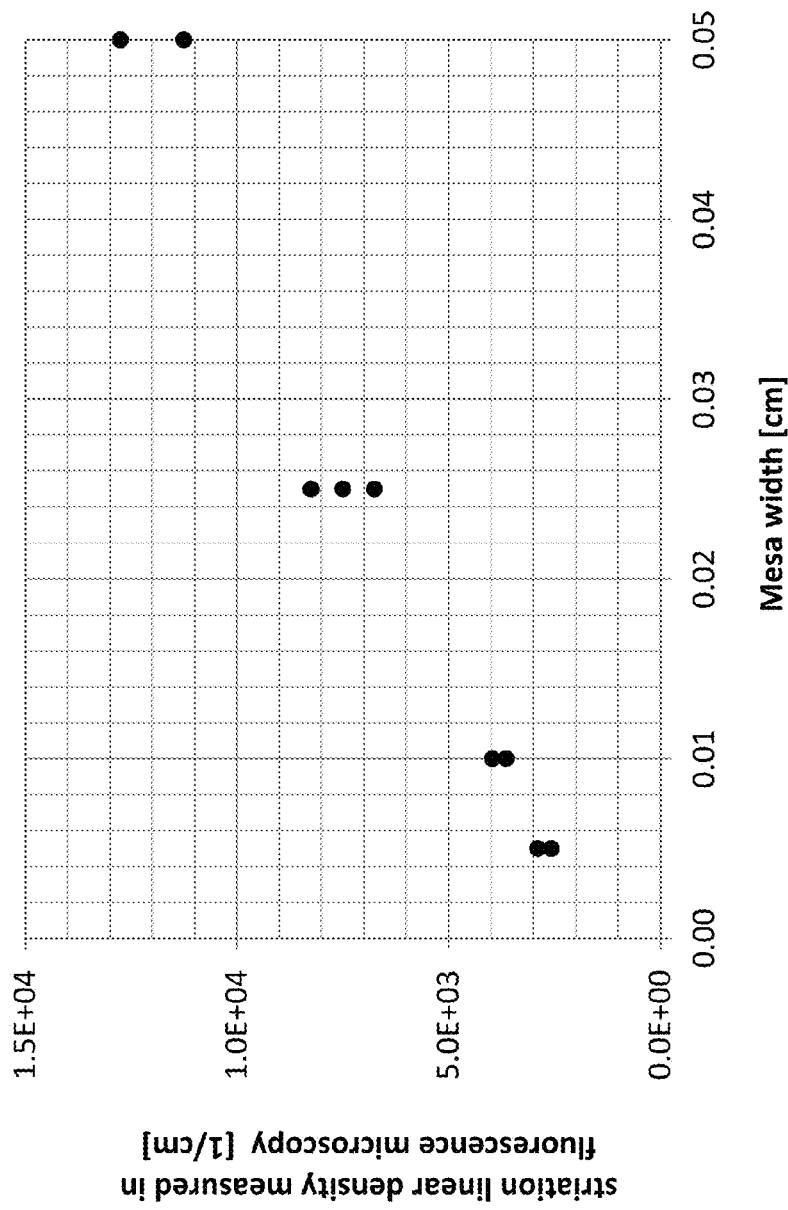
FIG. 12 shows a plot of linear density of striations measured at various locations on the test structures shown in FIG. 11 for different mesa widths according to certain embodiments.

FIG. 12 shows a plot of linear density of striations measured at various locations on the test structures shown in FIG. 1. Striation density varies linearly with the width of the mesa. This is in agreement with the hypothesis that basal plane misfits are derived from threading dislocations inherent to the substrate, which are found with some finite areal density. The optimal mesa width is then bounded at a maximum by the desired misfit density and the substrate threading dislocation density and at a minimum the processing limitations of subsequent device fabrication.

Figure 13:
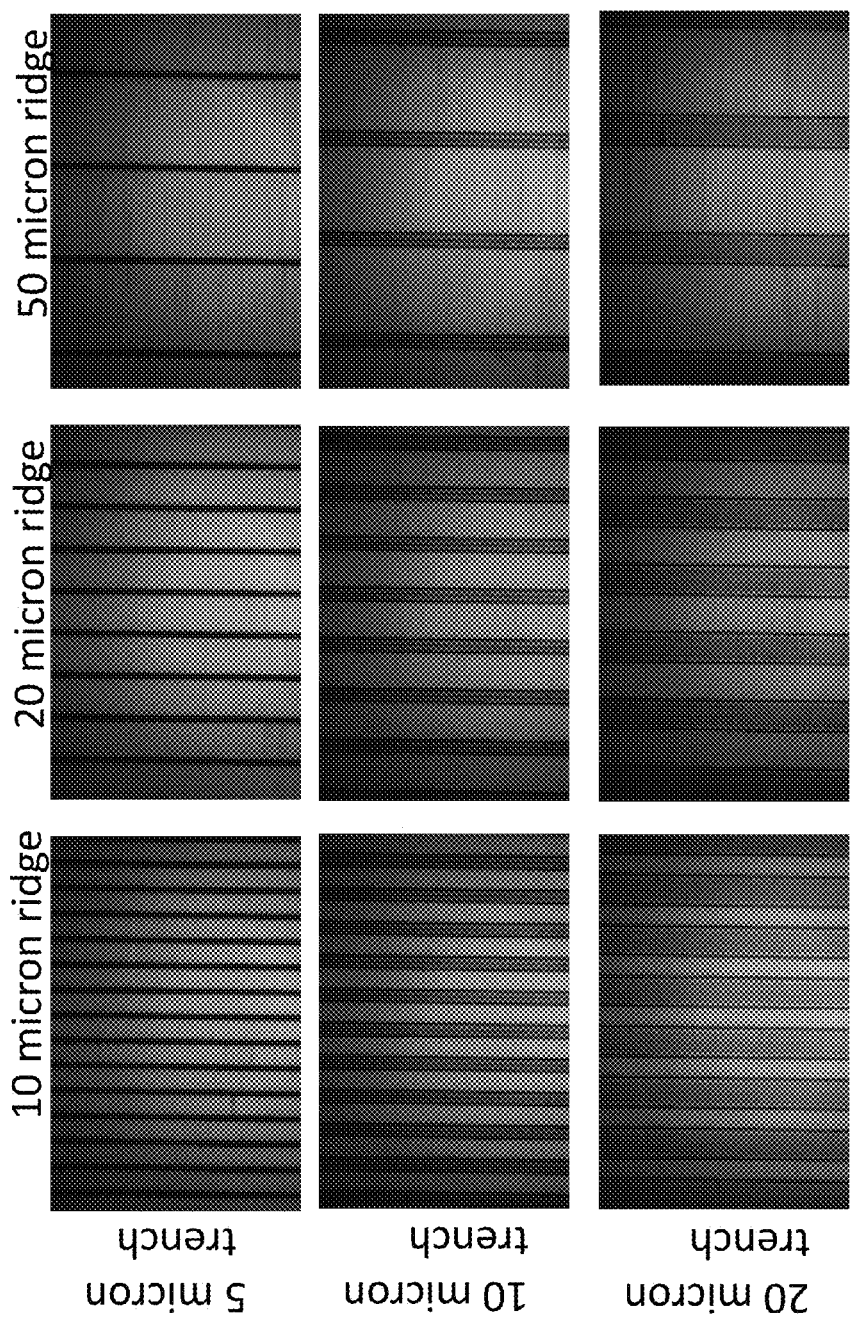
FIG. 13 shows fluorescence micrographs of test structures consisting of various trench widths and mesa widths according to certain embodiments.

FIG. 13 shows matrix of fluorescence micrographs of test structures consisting of various trench widths and mesa widths. Images were taken from the same wafer. FIG. 13 shows that misfit density [as evidenced by density of striations in fluorescence micrograph contrast] depends only on mesa width and not trench width. i.e. a trench need only be wide enough to provide a disruption in the strained layer to be effective at stopping misfits.

Figure 14B:
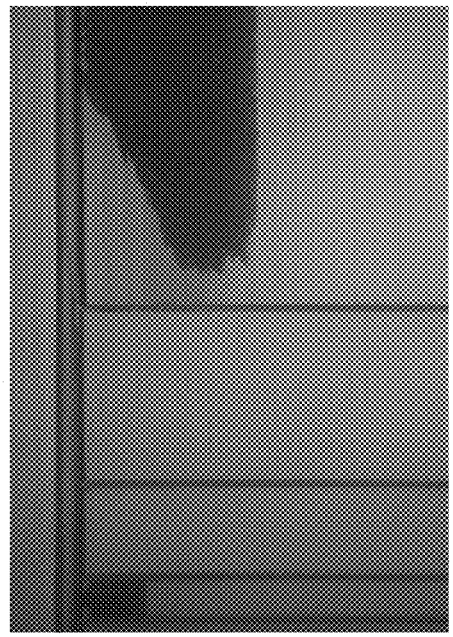
FIG. 14A-14B shows micrographs of substrates with topological features etched into the sample surface illustrating the prevention of extended defects and other than misfits according to certain embodiments.
Figure 14A:
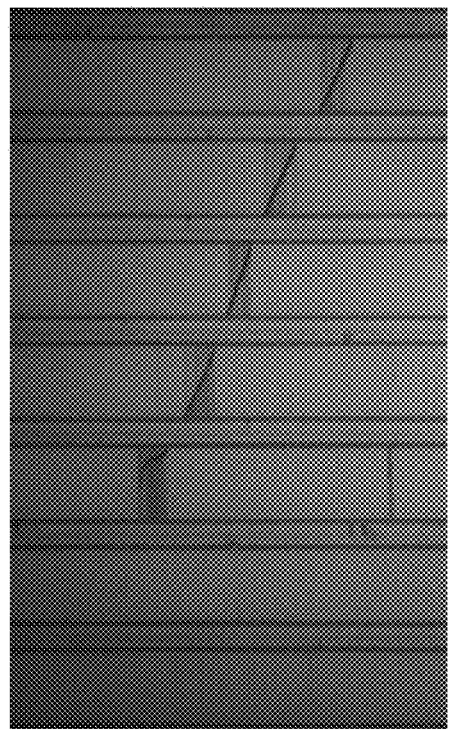

FIGS. 14A-14B shows topological features etched into the sample surface can prevent propagation of extended defects other than misfits. FIG. 14A shows etched trenches bisected by a defect in the original substrate before patterning (most likely a scratch). The defect acts as a nucleation site for misfit dislocations (extrinsic misfits, which are not related to threading dislocations inherent to the substrate) which can be seen as striations in the contrast of the fluorescence micrograph. Here the trenches are seen to be effective in preventing the propagation of the induced misfits and limiting the impact of substrate surface defects. In FIG. 14B very narrow trenches (approximately 5 microns wide) are shown to stop propagation of extrinsic misfits induced by a "dark triangle" defect which is caused by degradation of InGaN containing layers. In the upper left hand corner of FIG. 14B it can be seen that trenches also prevent the expansion of dark triangle defects. Therefore it is shown that interrupting the lateral contiguity of strained and InGaN containing layers can stop propagation of a variety of extended defects and limit their impact on device performance and yield.

FIGS. 15A-15C show that narrow trenches offer an advantages over mesas in that they: leave a more planar surface, require less area of the wafer to be etched, can be coalesced after growth of the strained layers to leave a planar surface that is more easily processed. FIGS. 15A-15C show diagrams of the coalescence process of a narrow trench, with trench width and depth chosen to allow for coalescence only after the strained layers are grown.

FIGS. 16A-16B shows laser diode films grown on patterned semipolar substrates containing regions isolated by 5 micron wide trenches. In FIG. 16A, (1) and (2) show, respectively, Nomarski and fluorescence micrographs of a wafer with trenches spaced at 20 micrometers. In FIG. 16B, (1) and (2) show, respectively, Nomarski and fluorescence micrographs of a wafer with trenches spaced at 20 micron region bracketed by two sets of 3 trenches of the same dimensions as in FIG. 16A. Thick regrowth on single trenches closely spaced led to reduction of misfit density as well as roughening of the surface between the trenches. Thick regrowth on the structure in FIG. 16B isolated the roughening to the outermost sets of trenches while also reducing misfit density at the center of the pattern. In both cases the thickness of grown films was high enough to fill in the trenches. Note that images in B are taken at same location and magnification while images in A are same location but original images were different magnifications.

Figures 17A, 17B:
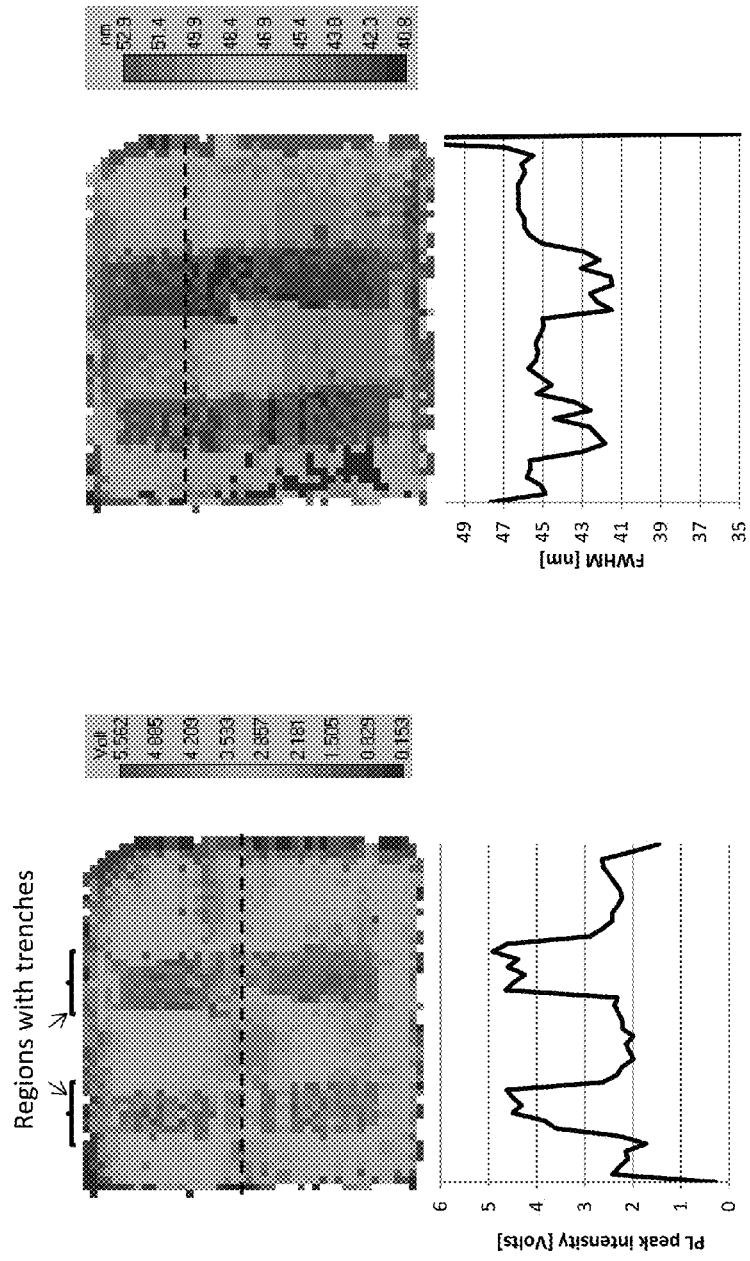
FIGS. 17A and 17B show spatial maps of photoluminescence measurements taken from a single laser diode device grown on patterned a semipolar wafer according to certain embodiments.

FIGS. 17A-17B shows spatial maps of photoluminescence measurements taken from an epitaxial structure suitable for fabrication of green laser diodes grown on a patterned semipolar wafer according to one embodiment of this technique using trench regions as the MBR is grown on the wafer. FIG. 17A shows peak spectral intensity [reported in Volts from photodetector], and FIG. 17B shows spectral full width at half maximum. Dotted lines indicate location of line scan shown in inset. Vertical regions are areas where wafers were patterned with trenches and the average misfit density is reduced relative to the unpatterned regions. As can be seen in the figure, the regions employing the MBR regions exhibit higher photoluminescence intensity and narrower full width at half maximum. The higher intensity is indicative of higher radiative recombination and efficiency and the narrower full width at half maximum is indicative of more homogenous material, both of which indicate a much improved material quality. Such an improvement in material quality will enable a higher efficiency laser diode.

Forming laser diodes on semipolar orientations of gallium and nitrogen containing material (e.g., GaN) can be advantageous. Such lasers may include long wavelength emission, high gain properties, improved material quality, and/or increased design flexibility over alternative planes such as the conventional polar c-plane or even the nonpolar m-plane or polar c-plane. For example, we have fabricated true green laser diodes on the (20-21) semipolar plane and found that the (30-3-1) semipolar plane offers narrower full width at half-maximum (FWHM) emission spectra and higher gain compared to the nonpolar m-plane in the blue regime, as described in U.S. application Ser. No. 12/883,093 filed on Sep. 15, 2010, which is incorporated by reference.

Figure 18:
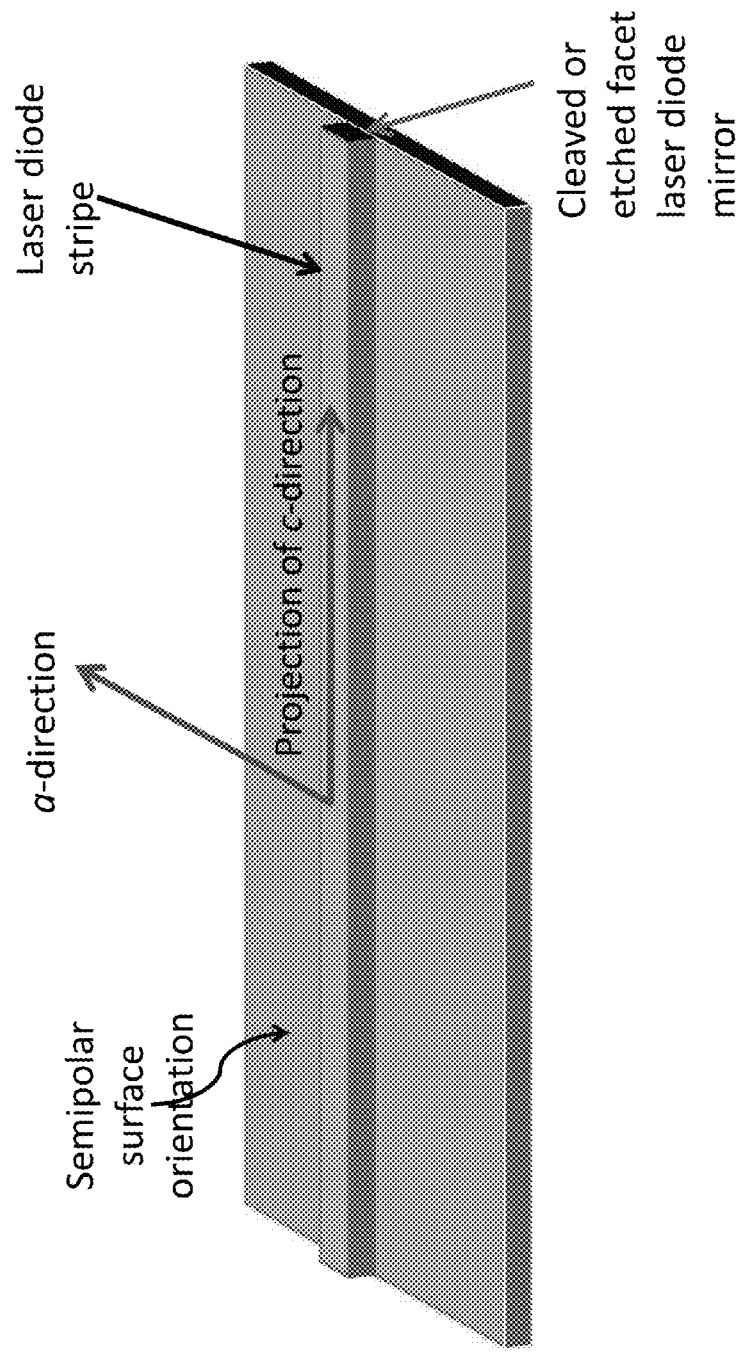
FIG. 18 is a simplified schematic diagram of a semipolar laser diode with a cavity aligned in the projection of c-direction with cleaved or etched facets according to certain embodiments.

As an example, FIG. 18 is a simplified schematic diagram of semipolar laser diode with the cavity aligned in the projection of c-direction with cleaved or etched mirrors. Example of projection of c-direction oriented laser diode stripe on semipolar (30-3-1) substrate with cleaved or etched mirrors. This diagram is merely an example, which should not unduly limit the scope of the claims herein. One of ordinary skill in the art may recognize other variations, modifications, and alternatives. As shown, the optical device includes a gallium nitride substrate member having a semipolar crystalline surface region characterized by an orientation of about 9 degrees to about 12.5 degrees toward (000-1) from the m-plane.). In an embodiment, the gallium nitride substrate member is a bulk GaN substrate characterized by having a semipolar crystalline surface region, but can be others. In an embodiment, the bulk GaN substrate has a surface dislocation density below $10^5$ cm$^{-2}$ or $10^5$ to $10^7$ cm$^{-2}$. It should be noted that homoepitaxial growth on bulk GaN is generally better than hetero-epitaxy growth. The nitride crystal or wafer may comprise $Al_xIn_yGa_{1-x-y}N$, where $0\le x$, y, $x+y\le 1$. In an embodiment, the nitride crystal comprises GaN. In one or more embodiments, the GaN substrate has threading dislocations, at a concentration between about $10^5$ cm$^{-2}$ and about $10^8$ cm$^{-2}$, in a direction that is substantially orthogonal or oblique with respect to the surface. As a consequence of the orthogonal or oblique orientation of the dislocations, the surface dislocation density is below about $10^5$ cm$^{-2}$ or below about $10^7$ cm$^{-2}$ others such as those ranging from about $10^5$ cm$^{-2}$$10^8$ cm$^{-2}$. In alternative example, is a projection of the c-direction oriented laser diode stripe on semipolar (20-21) substrate with cleaved or etched mirrors. The optical device includes a gallium nitride substrate member having a semipolar crystalline surface region characterized by an orientation of about 13 degrees to about 17 degrees toward (0001) from the m-plane.). In an embodiment, the gallium nitride substrate member is a bulk GaN substrate characterized by having a semipolar crystalline surface region, but can be others. In an embodiment, the bulk GaN substrate has a surface dislocation density below $10^5$ cm$^{-2}$ or from $10^5$ cm$^{-2}$ to $10^7$ cm$^{-2}$.

In an embodiment, the device has a laser stripe region formed overlying a portion of the semipolar crystalline orientation surface region. In an embodiment, the laser stripe region is characterized by a cavity orientation that is substantially parallel to the projection of the c-direction. In an embodiment, the laser stripe region has a first end and a second end.

In an embodiment, the device has a first facet provided on the first end of the laser stripe region and a second facet provided on the second end of the laser stripe region. In one or more embodiments, the first facet is substantially parallel with the second facet. Mirror surfaces are formed on each of the surfaces. The first facet comprises a first mirror surface. In an embodiment, the first mirror surface is provided by a scribing and breaking process or alternatively by etching techniques using etching technologies such as reactive ion etching (RIE), inductively coupled plasma etching (ICP), or chemical assisted ion beam etching (CAIBE), or other method. Any suitable scribing process can be used, such as a diamond scribe or laser scribe or combinations. In an embodiment, the first mirror surface comprises a reflective coating. In an embodiment, the reflective coating can be deposited using, for example, e-beam evaporation, thermal evaporation, RF sputtering, DC sputtering, ECR sputtering, ion beam deposition, Ion Assisted Deposition, reactive ion plating, any combinations, and the like. In still other embodiments, surface passivation may be used to the exposed surface prior to coating. The reflective coating is selected from silicon dioxide, hafnia, and titania, tantalum pentoxide, zirconia, including combinations, and the like. Preferably, the reflective coating is highly reflective and includes a coating of silicon dioxide and tantalum pentoxide, which has been deposited using electron beam deposition. Depending upon the embodiment, the first mirror surface can also comprise an anti-reflective coating. Additionally, the facets can be cleaved or etched or a combination of them.

Also in an embodiment, the second facet comprises a second mirror surface. The second mirror surface is provided by a scribing and breaking process according to an embodiment or alternatively by etching techniques using etching technologies such as reactive ion etching (RIE), inductively coupled plasma etching (ICP), or chemical assisted ion beam etching (CAIBE), or other method. Preferably, the scribing is diamond scribed or laser scribed or the like. In an embodiment, the second mirror surface comprises a reflective coating, such as silicon dioxide, hafnia, titania, tantalum pentoxide, zirconia, aluminum oxide, combinations, and the like. In an embodiment, the second mirror surface comprises an anti-reflective coating, such alumina or aluminum oxide. In an embodiment, the coating can be formed using electron beam deposition, thermal evaporation, RF sputtering, DC sputtering, ECR sputtering, ion beam deposition, ion assisted deposition, reactive ion plating, any combinations, and the like. In still other embodiments, the present method may provide surface passivation to the exposed surface prior to coating.

In an embodiment, the laser stripe has a length and width. The length ranges from about 20 microns to about 500 microns or about 500 microns to about 1500 microns. The stripe also has a width ranging from about 0.5 microns to about 50 microns, but can be other dimensions. In an embodiment, the stripe can also be about 3 to 35 microns wide for a high power multi-lateral-mode device or about 1 to 2 microns for a single lateral mode laser device. In an embodiment, the width is substantially constant in dimension, although there may be slight variations. The width and length are often formed using a masking and etching process, which are commonly used in the art.

In an embodiment, the device is also characterized by a spontaneously emitted light that is polarized in substantially perpendicular to the projection of the c-direction (in the a-direction). That is, the device performs as a laser or the like. In an embodiment, the spontaneously emitted light is characterized by a polarization ratio of greater than 0.2 to about 1 perpendicular to the c-direction. In an embodiment, the spontaneously emitted light is characterized by a wavelength ranging from about 400 nanometers to yield a violet emission, a blue emission, a green emission, and/or others. In certain embodiments, the light can be emissions ranging from violet 395 nm to 420 nm; blue 430 nm to 480 nm; green 500 nm to 550 nm; or others, which may slightly vary depending upon the application. In an embodiment, the spontaneously emitted light is highly polarized and is characterized by a polarization ratio of greater than 0.4. In an embodiment, the emitted light is characterized by a polarization ratio that is preferred.

Figure 19:
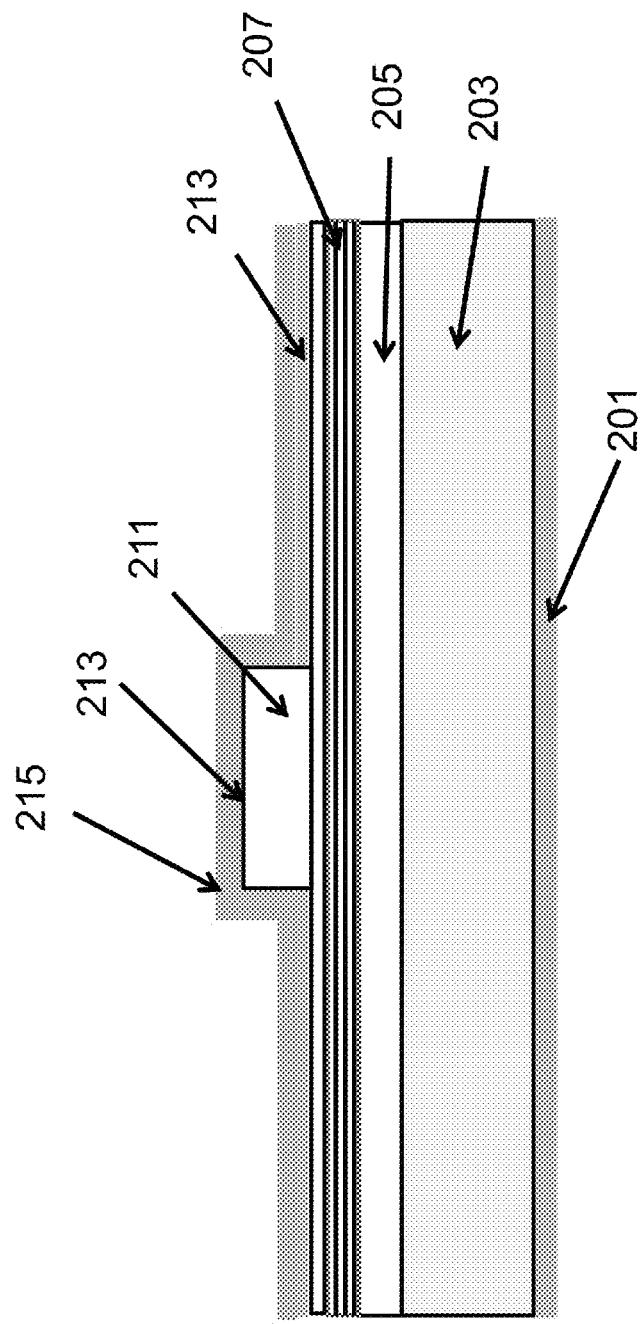
FIG. 19 is a simplified schematic cross-sectional diagram illustrating a laser diode structure according to certain embodiments.

FIG. 19 is a simplified schematic cross-sectional diagram illustrating a laser diode structure according to embodiments of the present disclosure. As shown, the laser device includes gallium nitride substrate 203, which has an underlying n-type metal back contact region 201. In an embodiment, the metal back contact region is made of a suitable material such as those noted below and others.

In an embodiment, the device also has an overlying n-type gallium nitride layer 205, an active region 207, and an overlying p-type gallium nitride layer structured as a laser stripe region 211. Additionally, the device also includes an n-side separate confinement heterostructure (SCH) 206, p-side guiding layer or SCH 208, p-AlGaN EBL 209, among other features. In an embodiment, the device also has a p++ type gallium nitride material 213 to form a contact region. In an embodiment, the p++ type contact region has a suitable thickness and may range from about 10 nm to 50 nm, or other thicknesses. In an embodiment, the doping level can be higher than the p-type cladding region and/or bulk region. In an embodiment, the p++ type region has doping concentration ranging from about $10^{19}$ Mg/cm$^3$ to $10^{21}$ Mg/cm$^3$, or others. The p++ type region preferably causes tunneling between the semiconductor region and overlying metal contact region. In an embodiment, each of these regions is formed using at least an epitaxial deposition technique of metal organic chemical vapor deposition (MOCVD), molecular beam epitaxy (MBE), or other epitaxial growth techniques suitable for GaN growth. In an embodiment, the epitaxial layer is a high quality epitaxial layer overlying the n-type gallium nitride layer. In some embodiments, the high quality layer is doped, for example, with Si or O to form n-type material, with a dopant concentration between about $10^{16}$ cm$^{-3}$ and $10^{20}$ cm$^{-3}$.

In an embodiment, an n-type $Al_uIn_vGa_{1-u-v}N$ layer, where $0 \leq u$, $v$, $u+v \leq 1$, is deposited on the substrate. In an embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 900 to about 1200 degrees Celsius in the presence of a nitrogen-containing gas. As an example, the carrier can be hydrogen or nitrogen or others. In an embodiment, the susceptor is heated to approximately 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (e.g., ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 sccm and 10 sccm is initiated.

In an embodiment, the laser stripe region is made of the p-type gallium nitride layer 211. In an embodiment, the laser stripe is provided by an etching process selected from dry etching or wet etching. In an embodiment, the etching process is dry, but can be others. As an example, the dry etching process is an inductively coupled plasma process using chlorine bearing species or a reactive ion etching process using similar chemistries or combination of ICP and RIE, among other techniques. Again as an example, the chlorine bearing species are commonly derived from chlorine gas or the like. The device also has an overlying dielectric region, which exposes 213 contact region, which is preferably a p++ gallium nitride region. In an embodiment, the dielectric region is an oxide such as silicon dioxide or silicon nitride, but can be others, such as those described in more detail throughout the present specification and more particularly below. The contact region is coupled to an overlying metal layer 215. The overlying metal layer is a multilayered structure containing gold and platinum (Ni/Au), but can be others such as gold and palladium (Pd/Au), gold, titanium, and palladium (Pd/Ti/Au) or gold and nickel (Pt/Au). In an alternative embodiment, the metal layer comprises Pd/Au formed using suitable techniques. In an embodiment, the Ni/Au is formed via electron-beam deposition, sputtering, or any like techniques. The thickness includes nickel material ranging in thickness from about 50 to about 100 nm and gold material ranging in thickness from about 100 Angstroms to about 1-3 microns, and others.

In an embodiment, the dielectric region can be made using a suitable technique. As an example, the technique may include reactively sputter of $SiO_2$ using an undoped polysilicon target (99.999% purity) with $O_2$ and Ar. In an embodiment, the technique uses RF magnetron sputter cathodes configured for static deposition; sputter target; throw distance; pressure: 1-5 mT or about 2.5 mT, power: 300 to 400 W; flows: 2-3-9 sccm $O_2$, 20-50 sccm, Ar, deposition thickness: 1000-2500 A, and may include other variations. In an embodiment, deposition may occur using non-absorbing, nonconductive films, e.g., $Al_2O_3$, $Ta_2O_5$, $SiO_2$, $Ta_2O_5$, $ZrO_2$, $TiO_2$, $HfO_2$, $NbO_2$. Depending upon the embodiment, the dielectric region may be thinner, thicker, or the like. In other embodiments, the dielectric region can also include multilayer coatings, e.g., 1000 A of $SiO_2$ capped with 500 A of $Al_2O_3$. Deposition techniques can include, among others, ebeam evaporation, thermal evaporation, RF Sputter, DC Sputter, ECR Sputter, Ion Beam Deposition, Ion Assisted Deposition, reactive ion plating, combinations, and the like.

In an embodiment, the laser device has active region 207. The active region can include one to twenty quantum well regions according to one or more embodiments. As an example, following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 1-20 quantum wells. Preferably, the active layer may include about 3-9 quantum wells or more preferably 4-7 quantum wells or others. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where 0≤w, x, y, z, w+x, y+z≤1, where w<u, y and/or x>v, z so that the bandgap of the well layer(s) is less than that of the barrier layer(s) and the n-type layer. The well layers and barrier layers may each have a thickness between about 1 nm and about 40 nm. In an embodiment, each of the thicknesses is preferably 2 nm-8 nm. In an embodiment, each well region may have a thickness of about 4 nm to 7 nm and each barrier region may have a thickness of about 2 nm to about 5 nm, among others. In another embodiment, the active layer comprises a double heterostructure, with an InGaN or $Al_wIn_xGa_{1-w-x}N$ layer about 10 nm to 100 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped In an embodiment, the active region can also include an electron blocking region, and a separate confinement heterostructure. In an embodiment, the separate confinement heterostructure (SCH) can include AlInGaN or preferably InGaN, but can be other materials. The SCH is generally comprises material with an intermediate index between the cladding layers and the light emitting active layers to improve confinement of the optical mode within the active region of the laser device according to an embodiment. In one or more embodiments, the SCH layers have a preferred thickness, impurity, and configuration above and below the active region to confine the optical mode. Depending upon the embodiment, the upper and lower SCH can be configured differently or the same. The electron blocking region can be on either side or both sides of the SCH positioned above the active region according to an embodiment. In an embodiment, the SCH can range from about 10 nm to about 150 nm, and preferably about 40 to 100 nm for the lower SCH region. In the upper SCH region, the thickness ranges from about 20 to 50 nm in an embodiment. As noted, the SCH is preferably InGaN having about 2% to about 5% indium or 5% to about 10% by atomic percent according to an embodiment.

In some embodiments, an electron blocking layer is preferably deposited. In an embodiment, the electron blocking layer comprises a gallium and nitrogen containing material including magnesium at a concentration of about $10^{16}$ cm$^{-3}$ to about $10^{22}$ cm$^{-3}$. The electron-blocking layer may comprise $Al_sIn_tGa_{1-s-t}N$, where 0≤s, t, s+t≤1, with a higher bandgap than the active layer, and may be doped p-type. In one specific embodiment, the electron blocking layer comprises AlGaN with an Al composition ranging from 5% to 20%. In another embodiment, the electron blocking layer may not contain Al. In another embodiment, the electron blocking layer comprises an AlGaN/GaN superlattice structure, comprising alternating layers of AlGaN and GaN, each with a thickness between about 0.2 nm and about 5 nm.

As noted, the p-type gallium nitride structure, which can be a p-type doped $Al_qIn_rGa_{1-q-r}N$, where 0≤q, r, q+r≤1, layer is deposited above the active layer. The p-type layer may be doped with Mg, to a level between about $10^{16}$ cm$^{-3}$ and $10^{22}$ cm$^{-3}$, and may have a thickness between about 5 nm and about 1500 nm. The outermost 5 nm to 70 nm of the p-type layer may be doped more heavily than the rest of the layer, so as to enable an improved electrical contact. In an embodiment, the laser stripe is provided by an etching process selected from dry etching or wet etching. In an embodiment, the etching process is dry, but can be others. The device also has an overlying dielectric region, which exposes 213 contact region. In an embodiment, the dielectric region is an oxide such as silicon dioxide, but can be others.

In an embodiment, the metal contact is made of suitable material. The electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In an embodiment, the electrical contact serves as a p-type electrode for the optical device. In another embodiment, the electrical contact serves as an n-type electrode for the optical device.

Figure 20:
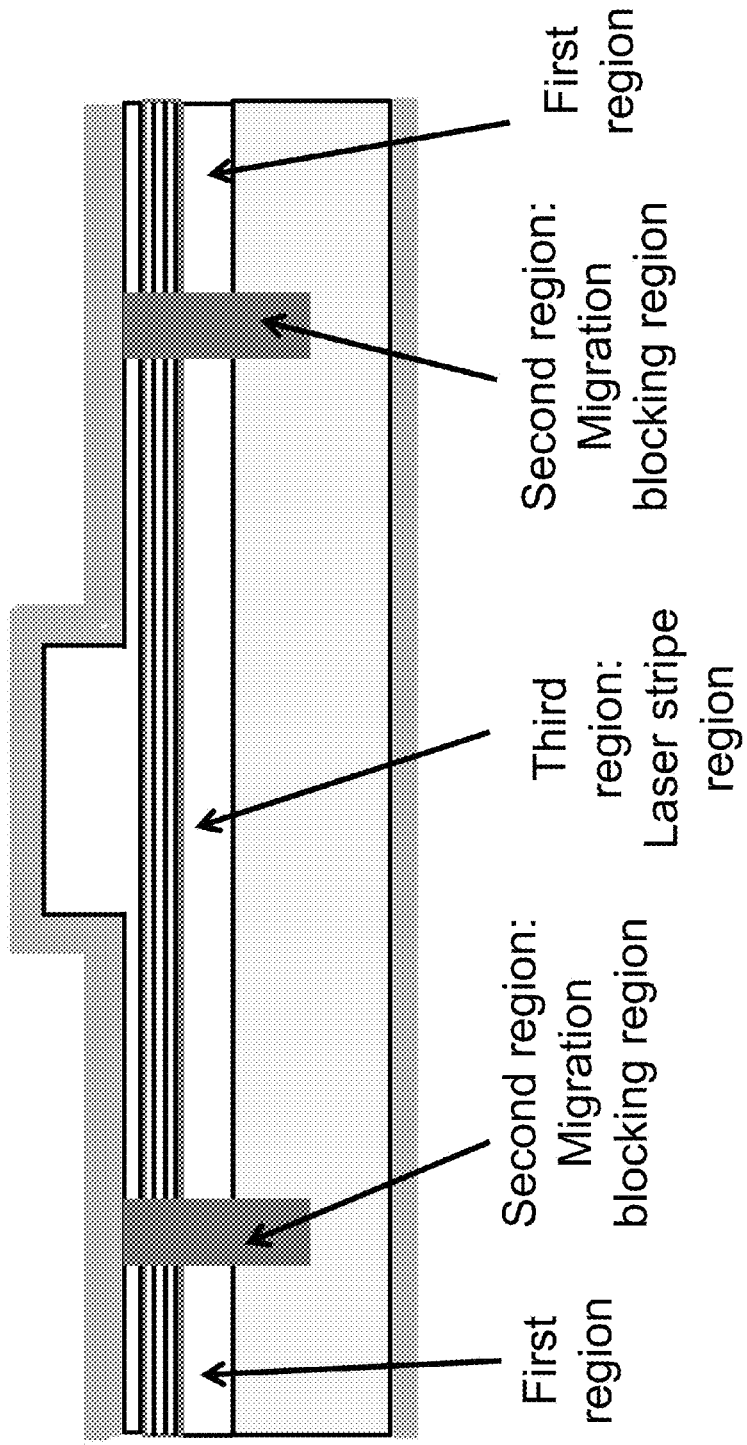
FIG. 20 shows a cross-sectional schematic of a gallium and nitrogen containing laser diode with a first, second, and third region, where the second region is a migration blocking region and the third region contains the laser stripe region.

FIG. 20 shows a cross-sectional schematic of a gallium and nitrogen containing laser diode with a first, second, and third region, where the second region is the migration blocking region and the third region contains the laser stripe region.

Figure 21:
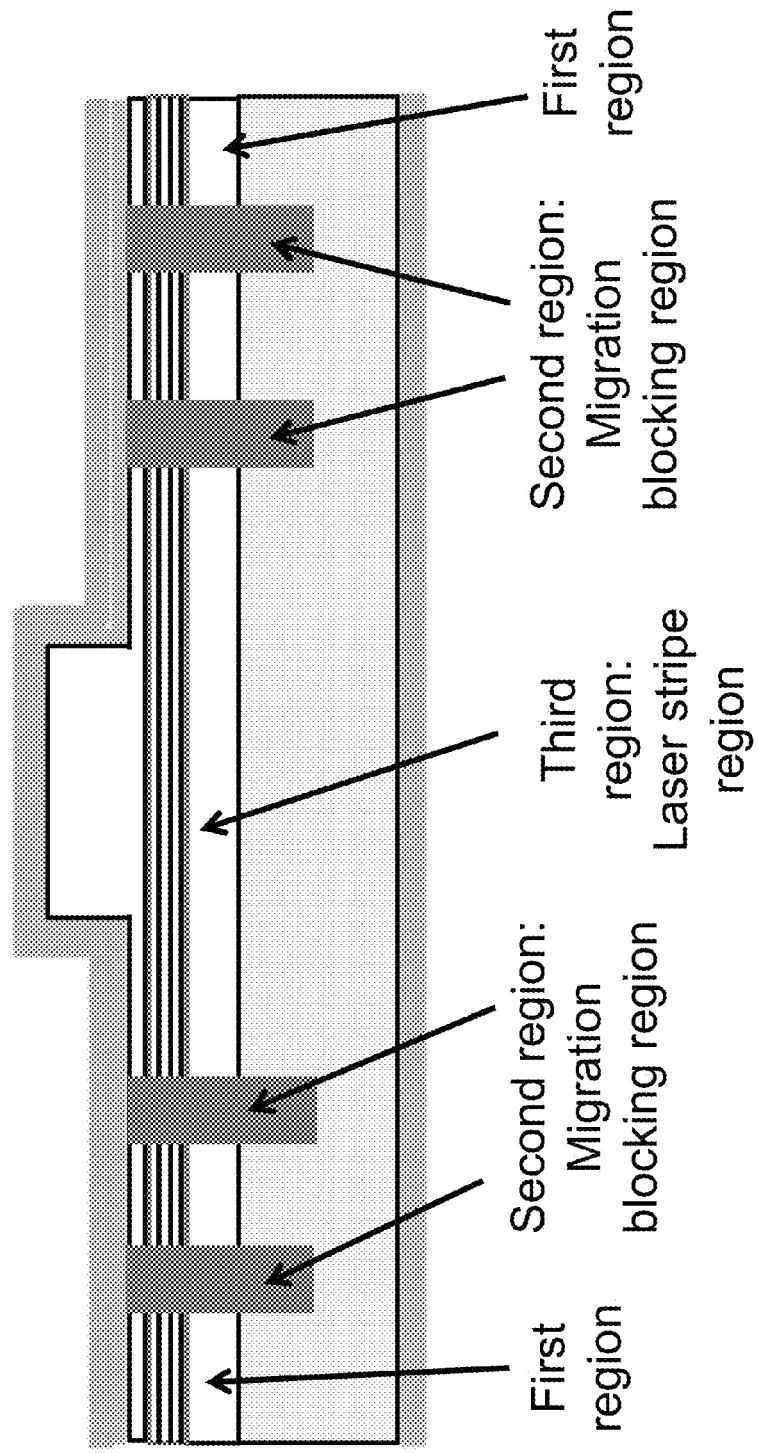
FIG. 21 shows a cross-sectional schematic of a gallium and nitrogen containing laser diode with a first, second, and third region, where the second region is the migration blocking region and the third region contains the laser stripe region. In this configuration there are two migration blocking regions protecting the third region from defects formed in the first region.

FIG. 21 shows a cross-sectional schematic of a gallium and nitrogen containing laser diode with a first, second, and third region, where the second region is the migration blocking region and the third region contains the laser stripe region. In this configuration there are two migration blocking regions protecting the third region from defects formed in the first region.

Figure 22:
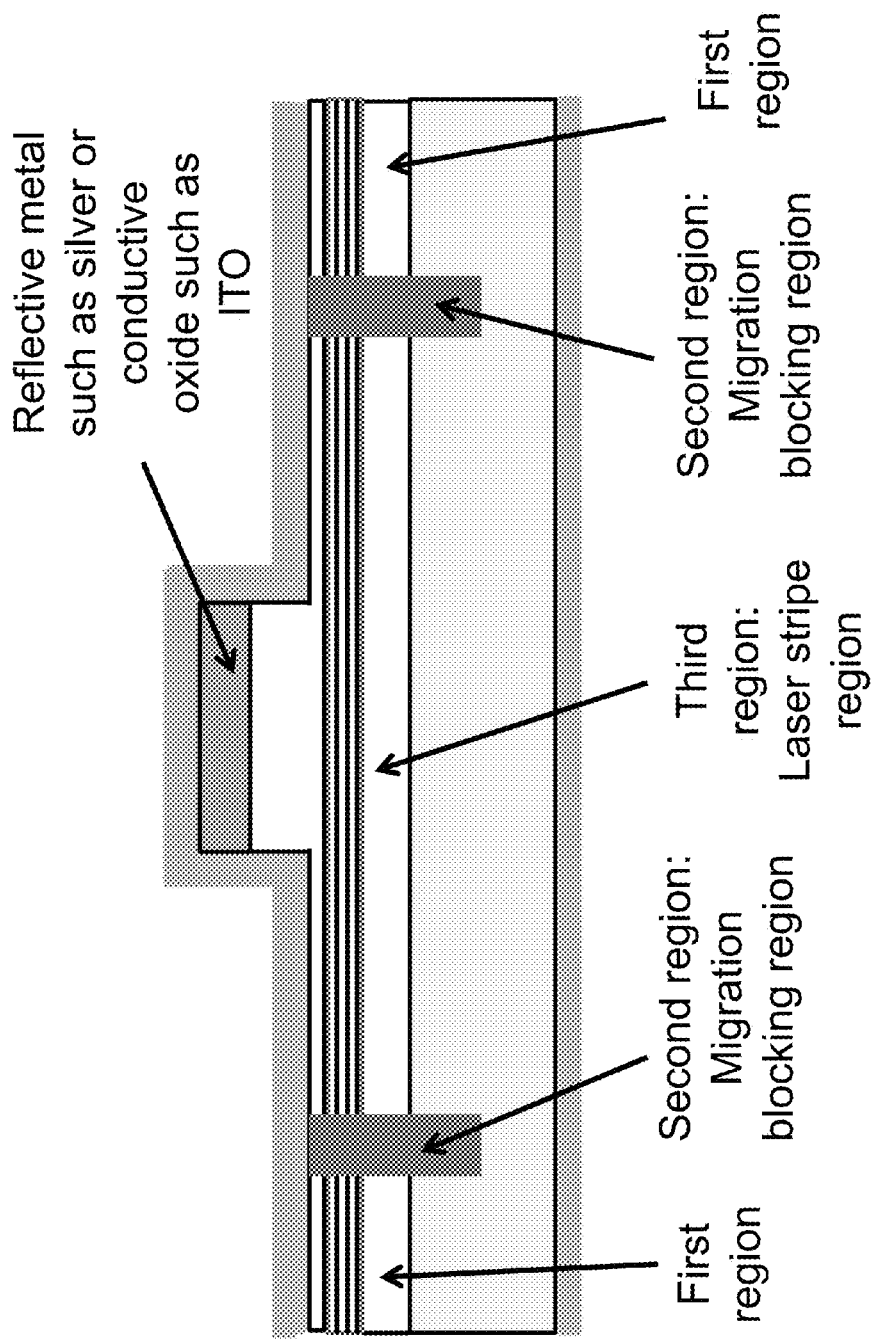
FIG. 22 shows a cross-sectional schematic of a gallium and nitrogen containing laser diode with a first, second, and third region, where the second region is the migration blocking region and the third region contains the laser stripe region. A reflective metal layer such as Ag or a conductive oxide such as ITO is positioned above the p-type cladding region to reduce the modal overlap with the metal layer and hence reduce the loss. In this configuration the reflective metal or conductive oxide is configured only substantially above the ridge.

FIG. 22 shows a cross-sectional schematic of a gallium and nitrogen containing laser diode with a first, second, and third region, where the second region is the migration blocking region and the third region contains the laser stripe region. A reflective metal layer such as Ag or a conductive oxide such as ITO is positioned above the p-type cladding region to reduce the modal overlap with the metal layer and hence reduce the loss. In this configuration the reflective metal or conductive oxide is configured only substantially above the ridge region of the laser diode.

Figure 23:
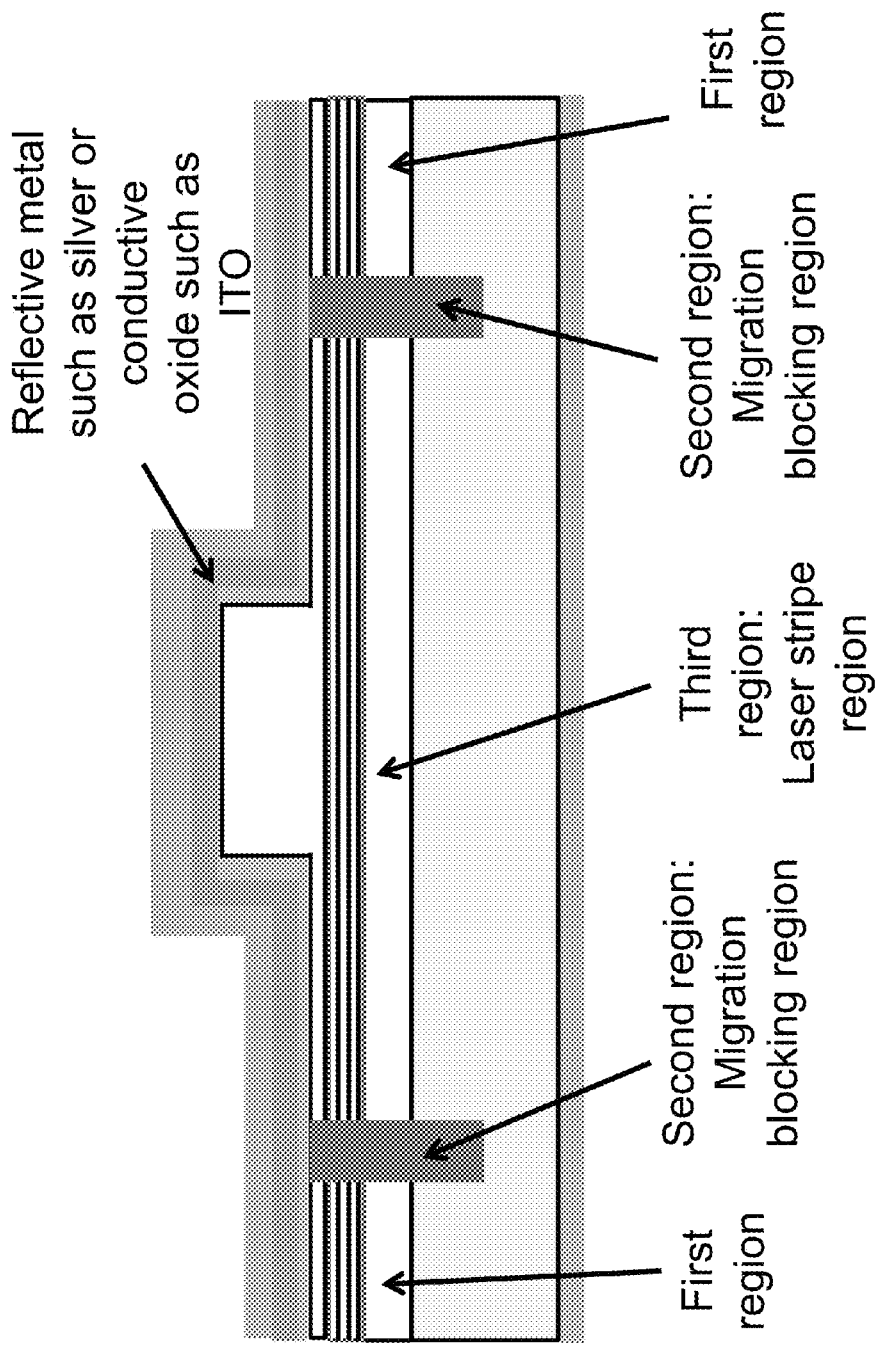
FIG. 23 shows a cross-sectional schematic of a gallium and nitrogen containing laser diode with a first, second, and third region, where the second region is the migration blocking region and the third region contains the laser stripe region. A reflective metal layer such as Ag or a conductive oxide such as ITO is positioned above the p-type cladding region to reduce the modal overlap with the metal layer and hence reduce the loss. In this configuration the reflective metal or conductive oxide is configured both above the ridge and above the dielectric material adjacent to the ridge, making the deposition process similar to what may be used to deposit the p-metal, such as a lift-off technique.

FIG. 23 shows a cross-sectional schematic of a gallium and nitrogen containing laser diode with a first, second, and third region, where the second region is the migration blocking region and the third region contains the laser stripe region. A reflective metal layer such as Ag or a conductive oxide such as ITO is positioned above the p-type cladding region to reduce the modal overlap with the metal layer and hence reduce the loss. In this configuration the reflective metal or conductive oxide is configured both above the ridge region of the laser diode and above the dielectric material adjacent to the ridge region, making the deposition process similar to what may be used to deposit the p-metal, such as a lift-off technique.

In certain embodiments, a migration blocking region may include epitaxial layers as well as the substrate. The migration blocking layer including epitaxial layers such as an n-type cladding layer is formed before deposition of the active region in the third region.

Figure 24:
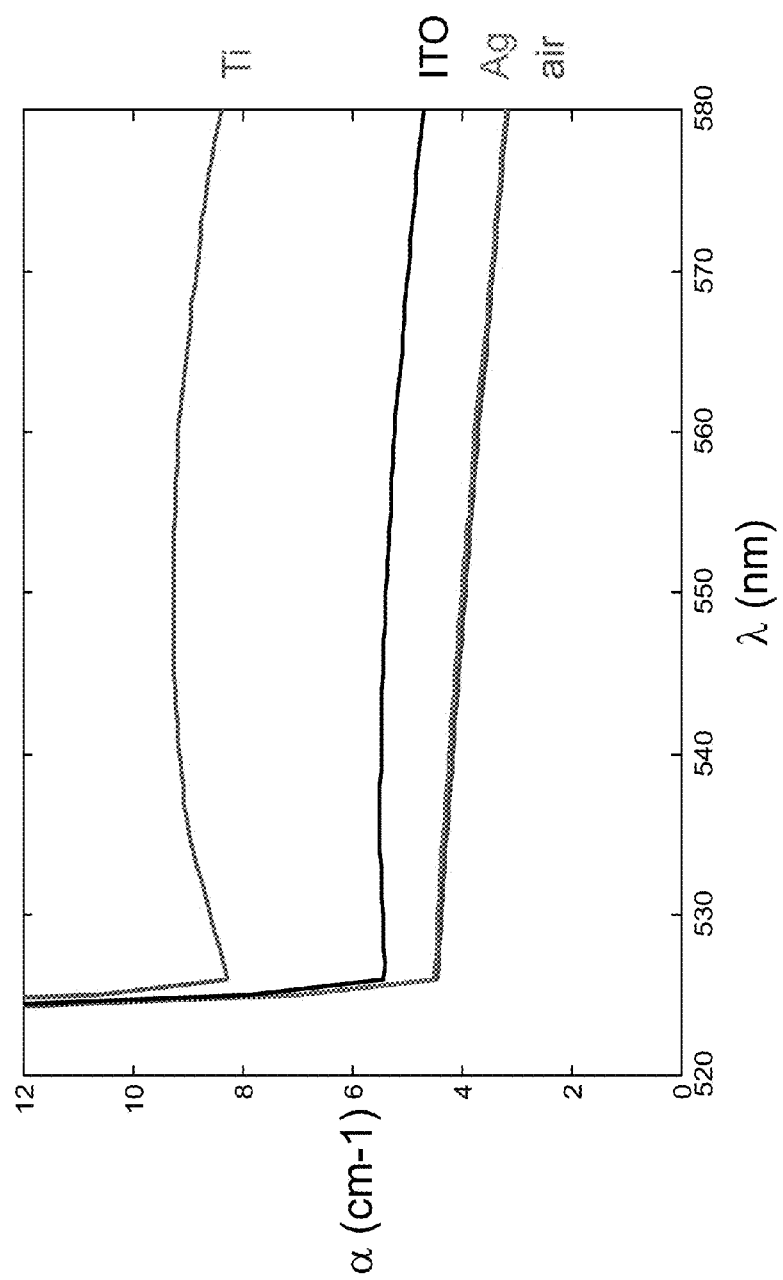
FIG. 24 is a simulation showing loss versus wavelength for a green laser diode epitaxial structure grown on a semipolar gallium and nitrogen containing substrate. The different curves represent different materials deposited between the p-cladding region and a standard metal contact layer such as gold, along with only air above the p-cladding. As is shown, for a typical metal such as Titanium (Ti) the loss is about 8 $cm^{-1}$ to 9 $cm^{-1}$, but can be reduced to 5 $cm^{-1}$ to 6 $cm^{-1}$ with the use of a conductive oxide like ITO and all the way down to 4 $cm^{-1}$ to 4.5 $cm^{-1}$ by using a highly reflective metal layer such as silver (Ag). The loss is being reduced due to the reduced modal overlap with the metal layer above these conductive oxide layers and reflective metal layers. According to the simulation, silver can provide a loss nearly identical to that of having only air above the p-cladding, which is the ideal case.

FIG. 24 is a simulation showing loss versus wavelength for a green laser diode epitaxial structure grown on a semipolar gallium and nitrogen containing substrate. The different curves represent different materials deposited between the p-cladding region and a standard metal contact layer such as gold, along with only air above the p-cladding. As can be seen, for a typical metal such as Titanium (Ti) the loss is about 8 $cm^{-1}$ to 9 $cm^{-1}$, but can be reduced to 5 $cm^{-1}$ to 6 $cm^{-1}$ with the use of a conductive oxide like ITO and all the way down to 4 $cm^{-1}$ to 4.5 $cm^{-1}$ by using a highly reflective metal layer such as silver (Ag). The loss is being reduced due to the reduced modal overlap with the metal layer above these conductive oxide layers and reflective metal layers. According to the simulation, silver can provide a loss nearly identical to that of having only air above the p-cladding, which is the ideal case.

In an embodiment, a ridge waveguide is fabricated using a certain deposition, masking, and etching processes. In an embodiment, the mask comprises photoresist (PR) or dielectric or any combination of both and/or different types of them. The ridge mask is about 1 microns to about 2.5 microns wide for single lateral mode applications or 2.5 µm to 30 µm wide for multimode applications. The ridge waveguide is etched by ion-coupled plasma (ICP), reactive ion etching (RIE), chemical assisted ion beam (CAIBE) etched, or other method. The etched surface is 20 nm to 250 nm above the active region. A dielectric passivation layer is then blanket deposited by any number of commonly used methods in the art, such as sputter, e-beam, PECVD, or other methods. This passivation layer can include $SiO_2$, $Si_3N_4$, $Ta_2O_5$, or others. The thickness of this layer is 80 nm to 400 nm thick. An ultrasonic process is used to remove the etch mask which is covered with the dielectric. This exposes the p-GaN contact layer. P-contact metal is deposited by e-beam, sputter, or other deposition technique using a PR mask to define the 2D geometry. The contact layer can be Ni/Au but others can be Pt/Au or Pd/Au.

In one or more preferred embodiments, the present disclosure provides a laser structure without an aluminum bearing cladding region. In an embodiment, the laser device comprises a multi-quantum well active region having thin barrier layers. In one or more embodiments, the active region comprises three or more quantum well structures. Between each of the quantum well structures there may be a thin barrier layer, e.g., 7 nm and less, 6 nm and less, 5 nm and less, 4 nm and less, 3 nm and less, 2 nm and less. In an embodiment, the combination of thin barrier layers in the multi-quantum well structures enables a low voltage (e.g., 6 volts and less) laser diode free from use of aluminum bearing cladding regions.

In an embodiment, the present disclosure provides an optical device. The optical device has a gallium and nitrogen containing substrate including a (60-6-1), (60-61), (50-5-1), (50-51), (40-4-1), (40-41), (30-3-1), a (30-31), a (20-2-1), a (20-21), a (30-3-2), a (30-32), and/or an offcut orientation. or offcuts thereof crystalline surface region orientation, which may be off-cut. The device preferably has an n-type cladding material overlying the n-type gallium and nitrogen containing material according to an embodiment. The n-type cladding material may be formed from GaN, AlGaN, InAlGaN, or a combination and ranges in thickness from about 1 µm to about 5 µm according to an embodiment. The n-type cladding material may be doped with silicon or oxygen. The device also has an active region comprising at least three quantum wells. Each of the quantum wells has a thickness of 3.0 nm and greater or 5.5 nm and greater, and one or more barrier layers. Each of the barrier layers has a thickness ranging from about 2 nm to about 4 nm or about 4 nm to about 8 nm or about 8 nm to about 20 nm and is configured between a pair of quantum wells according to an embodiment. At least one or each of the barrier layers has a thickness ranging from about 2 nm to about 4 nm and is configured between a pair of quantum wells or adjacent to a quantum well according to an embodiment. At least one or each of the barrier layers has a thickness ranging from about 3.5 nm to about 6.5 nm and is configured between a pair of quantum wells or adjacent to a quantum well according to an embodiment. Preferably, the device has a p-type cladding material overlying the active region. Preferably, the p-type cladding material may be formed from GaN, AlGaN, InAlGaN, or a combination and ranges in thickness from about 0.4 µm to about 1 µm according to an embodiment. The p-type cladding material may be doped with magnesium. In an embodiment, the active region is configured for a forward voltage of less than about 6V or less than about 5V for the device for an output power of 60 mW or 100 mW and greater.

In yet an alternative embodiment, the present disclosure provides an optical device. The device has a gallium and nitrogen containing substrate including a (60-6-1), (60-61), (50-5-1), (50-51), (40-4-1), (40-41), (30-3-1), a (30-31), a (20-2-1), a (20-21), a (30-3-2), a (30-32), and/or an offcut orientation. The device also has an n-type cladding material overlying the n-type gallium and nitrogen containing material. The n-type cladding material may be formed from GaN, AlGaN, InAlGaN, or a combination of any of the foregoing, and may range in thickness from about 1 µm to about 5 µm according to an embodiment. The n-type cladding material may be doped with silicon or oxygen. The device further has an active region comprising at least three quantum wells. Each of the quantum wells has a thickness of 2.0 nm and greater or 3.5 nm and greater or 5 nm and greater and one or more barrier layers according to an embodiment. Each of the barrier layers has a thickness ranging from about 2 nm to about 4 nm or about 4 nm to about 8 nm or about 8 nm to about 20 nm according to an embodiment. Each of the barrier layers is configured between a pair of quantum wells according to one or more embodiments. At least one or each of the barrier layers has a thickness ranging from about 2 nm to about 5 nm and is configured between a pair of quantum wells or adjacent to a quantum well according to an embodiment. At least one or each of the barrier layers has a thickness ranging from about 4 nm to about 8 nm and is configured between a pair of quantum wells or adjacent to a quantum well according to an embodiment. The device also has a p-type cladding material overlying the active region. Preferably, the p-type cladding material may be formed from GaN, AlGaN, InAlGaN, or a combination and ranges in thickness from about 0.4 µm to about 1 µm according to an embodiment. The p-type cladding material may be doped with magnesium. The device optionally has a p-type material overlying the p-type cladding material.

In other embodiments, the invention provides yet an alternative optical device, which has a gallium and nitrogen containing substrate including a (60-6-1), (60-61), (50-5-1), (50-51), (40-4-1), (40-41), (30-3-1), a (30-31), a (20-2-1), a (20-21), a (30-3-2), a (30-32), or offcuts thereof crystalline surface region orientation. An n-type cladding material is overlying the n-type gallium and nitrogen containing material. Preferably, the n-type cladding material is substantially free from an aluminum bearing material. The device has an active region comprising at least three quantum wells, each of which has a thickness of 2.5 nm or 3.5 nm and greater. The device has one or more barrier layers, each of which has a thickness ranging from about 2 nm to about 4 nm or about 4 nm to about 8 nm or about 8 nm to about 20 nm in one or more alternative embodiments. Preferably, each of the barrier layers is configured between a pair of quantum wells according to an embodiment. The device also has a p-type cladding material overlying the active region according to an embodiment. The p-type cladding material is substantially free from an aluminum bearing material according to an embodiment. The device also has a p-type material overlying the p-type cladding material.

In other embodiments, the invention provides a method of fabricating an optical device, which has a gallium and nitrogen containing substrate including a (60-6-1), (60-61), (50-5-1), (50-51), (40-4-1), (40-41), (30-3-1), a (30-31), a (20-2-1), a (20-21), a (30-3-2), a (30-32), or offcuts thereof crystalline surface region orientation. An n-type cladding material is overlying the n-type gallium and nitrogen containing material. Preferably, the n-type cladding material is substantially free from an aluminum bearing material. The method includes forming an active region comprising at least three quantum wells, each of which has a thickness of 2.5 nm or 3.5 nm and greater. The device has one or more barrier layers, each of which has an n-type impurity characteristic and a thickness ranging from about 2 nm to about 4 nm or about 4 nm to about 8 nm or about 8 nm to about 20 nm in one or more alternative embodiments. Preferably, each of the barrier layers is configured between a pair of quantum wells according to an embodiment. The method also includes forming a p-type cladding material overlying the active region according to an embodiment. The p-type cladding material is substantially free from an aluminum bearing material according to an embodiment. The method also includes forming a p-type material overlying the p-type cladding material.

In an embodiment, the present disclosure provides an optical device, such as a laser diode. The device has a gallium and nitrogen containing substrate including a (60-6-1), (60-61), (50-5-1), (50-51), (40-4-1), (40-41), (30-3-1), a (30-31), a (20-2-1), a (20-21), a (30-3-2), a (30-32), or offcuts thereof crystalline surface region orientation, which may be off-cut according to one or more embodiments. The device has an n-type cladding material overlying the n-type gallium and nitrogen containing material. The n-type cladding material may be formed from GaN, AlGaN, InAlGaN, or a combination of any of the forgoing and may range in thickness from about 1 μm to about 5 μm according to an embodiment. The n-type cladding material may be doped with silicon or oxygen. The device also has an active region comprising at least three quantum wells. In an embodiment, each of the quantum wells has a thickness of 2.0 nm or 3.5 nm and greater and one or more barrier layers according to an embodiment. Each of the barrier layers has a n-type characteristic and a thickness ranging from about 2 nm to about 4.5 nm in an embodiment. Each of the barrier layers has a p-type characteristic and a thickness ranging from about 3.5 nm to about 7 nm in an alternative specific embodiment. In an embodiment, each of the barrier layers is configured between a pair of quantum wells. The device also has a p-type cladding material overlying the active region. Preferably, the p-type cladding material may be formed from GaN, AlGaN, InAlGaN, or a combination of any of the foregoing and may range in thickness from about 0.3 μm to about 1 μm according to an embodiment. The p-type cladding material may be doped with magnesium. And overlying p-type material is included. In an embodiment, the active region is configured for a forward voltage of less than about 6 V or less than about 7V for the device for an output power of 60 mW and greater. In other embodiments for nonpolar m-plane devices or semipolar (60-6-1), (60-61), (50-5-1), (50-51), (40-4-1), (40-41), (30-3-1), a (30-31), a (20-2-1), a (20-21), a (30-3-2), a (30-32), or offcuts thereof planes, operable in the blue (430 nm-475 nm) and green (505-530 nm), the present method and structure include five (5) or more thick quantum wells of greater than 4 nm or 5 nm in thickness and thin barriers that are 2-4 nm in thickness.

In one or more embodiments, the present disclosure includes a laser diode substantially free from an aluminum containing cladding region. To form the laser diode without an aluminum containing cladding region, the present laser diode includes three or more quantum wells to provide enough confinement of the optical mode for sufficient gain to reach lasing. However, when the number of quantum wells increases in the active region, the forward voltage of the diode can increase, as a tradeoff We have determined that the forward voltage of the diode can be reduced in multi-quantum well active regions by way of the use of thin barriers on the order of 3 nm to 4 nm, which are much thinner than conventional lasers such as those in Yoshizumi et al., "Continuous-Wave operation of 520 nm Green InGaN-Based Laser Diodes on Semi-Polar {20-21} GaN Substrates," Applied Physics Express, 2 (2009) 092101. We have also determined that the forward voltage can be reduced in multi-quantum well active regions by adding p or n-type dopant species to the active region according to one or more other embodiments. Although any one or combination of these approached can be used, we believe it may be preferable to use the thin barrier approach to avoid adding impurities to the active region. The impurities may change optical losses and alter the electrical junction placement according to one or more embodiments. Accordingly, the present disclosure provides a laser device and method with low voltage on (60-6-1), (60-61), (50-5-1), (50-51), (40-4-1), (40-41), (30-3-1), a (30-31), a (20-2-1), a (20-21), a (30-3-2), a (30-32), or offcuts thereof.

The device has a gallium and nitrogen containing substrate member having a (60-6-1), (60-61), (50-5-1), (50-51), (40-4-1), (40-41), (30-3-1), a (30-31), a (20-2-1), a (20-21), a (30-3-2), a (30-32), or offcuts thereof crystalline surface region. The device has an n-type gallium and nitrogen containing cladding material. In an embodiment, the n-type gallium and nitrogen containing cladding material is substantially free from an aluminum species, which leads to imperfections, defects, and other limitations. The device also has an active region including multiple quantum well structures overlying the n-type gallium and nitrogen containing cladding material. In one or more preferred embodiments, the device also has thin barrier layers configured with the multiple well structures. The device has a p-type gallium and nitrogen containing cladding material overlying the active region. In an embodiment, the p-type gallium and nitrogen containing cladding material is substantially free from an aluminum species. The device preferably includes a laser stripe region configured from at least the active region and characterized by a cavity orientation substantially parallel to a projection of the c-direction. The laser stripe region has a first end and a second end. The device also has a first cleaved or etched facet provided on the first end of the laser stripe region and a second cleaved or etched facet provided on the second end of the laser stripe region. Depending upon the embodiment, the facets may be cleaved, etched, or a combination of cleaved and etched. In yet other embodiments, the present device includes a gallium and nitrogen containing electron-blocking region that is substantially free from aluminum species. In yet other embodiments, the device does not include any electron-blocking layer or yet in other embodiments, there is no aluminum in the cladding layers and/or electron blocking layer, although other embodiments include aluminum containing blocking layers. In still other embodiments, the optical device and method are free from any aluminum material, which leads to defects, imperfections, and the like.

In some preferred embodiments, the present method and structure is substantially free from InAlGaN or aluminum bearing species in the cladding layers as conventional techniques, such as those in Yoshizumi et al., "Continuous-Wave operation of 520 nm Green InGaN-Based Laser Diodes on Semi-Polar {20-21} GaN Substrates," Applied Physics Express 2 (2009) 092101. That is, the present laser structure and method are substantially free from any aluminum species in the cladding region. Aluminum is generally detrimental. Aluminum often leads to introduction of oxygen in the reactor, which can act as non radiative recombination centers to reduce the radiative efficiency and introduce other limitations. We also determined that oxygen can compensate p-type dopants in the p-cladding to cause additional resistivity in the optical device. In other aspects, we also determined that aluminum is detrimental to the MOCVD reactor and can react or pre-react with other growth precursors. Use of aluminum containing cladding layers is also cumbersome and can take additional time to grow. In fact, by using substantially Al-free cladding layers MOCVD growth throughput can be increased by 2-4× drastically reducing the cost associated with growth. Accordingly, it is believed that the aluminum cladding free laser method and structure are generally more efficient to grow than conventional laser structures.

Moreover, the present invention provides an optical device that is substantially free from aluminum bearing cladding materials. The device has a gallium and nitrogen containing substrate member having a (30-3-1) or offcut crystalline surface region. The device has an n-type gallium and nitrogen containing cladding material. In a specific embodiment, the n-type gallium and nitrogen containing cladding material is substantially free from an aluminum species, which leads to imperfections, defects, and other limitations. The device also has an active region including multiple quantum well structures overlying the n-type gallium and nitrogen containing cladding material. In one or more preferred embodiments, the device also has thin barrier layers configured with the multiple well structures. The device has a p-type gallium and nitrogen containing cladding material overlying the active region. In a preferred embodiment, the p-type gallium and nitrogen containing cladding material is substantially free from an aluminum species. The device preferably includes a laser stripe region configured from at least the active region and characterized by a cavity orientation substantially parallel to a projection in a c-direction. The laser strip region has a first end and a second end. The device also has a first etched or etched facet provided on the first end of the laser stripe region and a second etched or etched facet provided on the second end of the laser stripe region. Depending upon the embodiment, the facets may be etched, etched, or a combination of cleaved and etched. In yet other embodiments, the present device includes a gallium and nitrogen containing electron blocking region that is substantially free from aluminum species. In yet other embodiments, the device does not include any electron blocking layer or yet in other embodiments, there is no aluminum in the cladding layers and/or electron blocking layer, although other embodiments include aluminum containing blocking layers. In still other embodiments, the optical device and method are free from any aluminum material, which leads to defects, imperfections, and the like. Further details of these limitations can be found throughout the present specification and more particularly below.

In preferred embodiments, the present method and structure is substantially free from InAlGaN or aluminum bearing species in the cladding layers as conventional techniques, such as those in Yoshizumi et al., "Continuous-Wave operation of 520 nm Green InGaN-Based Laser Diodes on Semi-Polar {20-21} GaN Substrates," Applied Physics Express 2 (2009) 092101. That is, the present laser structure and method are substantially free from any aluminum species in the cladding region. Aluminum is generally detrimental. Aluminum often leads to introduction of oxygen in the reactor, which can act as non radiative recombination centers to reduce the radiative efficiency and introduce other limitations. We also determined that oxygen can compensate p-type dopants in the p-cladding to cause additional resistivity in the optical device. In other aspects, we also determined that aluminum is detrimental to the MOCVD reactor and can react or pre-react with other growth precursors. Use of aluminum cladding layers is also cumbersome and can take additional time to grow. Accordingly, it is believed that the aluminum cladding free laser method and structure are generally more efficient to grow than conventional laser structures. Further benefits are described throughout the present specification and more particularly below.

In alternative example, the present invention provides a green laser diode configured using a semipolar gallium and nitrogen containing bulk substrate member, as described in more detail below, which has etched facets.

In preferred embodiments, the invention provides a laser structure without an aluminum bearing cladding region. In a specific embodiment, the laser device comprises a multi-quantum well active region having thin barrier layers, with the active region comprising three or more quantum well structures. Between each of the quantum well structures is a thin barrier layer, e.g., 8 nm and less, 7 nm and less, 6 nm and less, 5 nm and less, 4 nm and less, 3 nm and less, 2 nm and less, 1.5 nm and less. In a preferred embodiment, the combination of thin barrier layers configured in the multi-quantum well structures enables a low voltage (e.g., 7 volts and less, 6 volts and less) laser diode free from use of aluminum bearing cladding regions.

In one embodiment, the optical device has a gallium and nitrogen containing substrate including a {20-21} crystalline surface region orientation, which may be off-cut. The device preferably has an n-type cladding material overlying the n-type gallium and nitrogen containing material according to a specific embodiment. The n-type cladding material is substantially free from an aluminum bearing material. The device also has an active region comprising at least three quantum wells. Each of the quantum wells has a thickness of 2.5 nm and greater or 3.5 nm and greater and one or more barrier layers. Each of the barrier layers has a thickness ranging from about 2 nm to about 4 nm or about 3 nm to about 6.5 nm and is configured between a pair of quantum wells according to a specific embodiment. At least one or each of the barrier layers has a thickness ranging from about 2 nm to about 4 nm and is configured between a pair of quantum wells or adjacent to a quantum well according to a specific embodiment. At least one or each of the barrier layers has a thickness ranging from about 3 nm to about 6.5 nm and is configured between a pair of quantum wells or adjacent to a quantum well according to a specific embodiment. Preferably, the device has a p-type cladding material overlying the active region. Preferably, the p-type cladding material is substantially free from an aluminum bearing material according to a specific embodiment. In a preferred embodiment, the active region is configured operably for a forward voltage of less than about 7V or less than about 6V for the device for an output power of 60 mW and greater.

In yet an alternative embodiment, the present invention provides an optical device. The device has a gallium and nitrogen containing substrate including a {20-21} crystalline surface region orientation. The device also has an n-type cladding material overlying the n-type gallium and nitrogen containing material. The n-type cladding material is substantially free from an aluminum bearing material. The device further has an active region comprising at least two quantum wells. Each of the quantum wells has a thickness of 2.5 nm and greater or 3.5 nm and greater and one or more barrier layers according to a specific embodiment. Each of the barrier layers has a thickness ranging from about 2 nm to about 5 nm or about 3 nm to about 8 nm according to a specific embodiment. Each of the barrier layers is configured between a pair of quantum wells according to one or more embodiments. At least one or each of the barrier layers has a thickness ranging from about 2 nm to about 5 nm and is configured between a pair of quantum wells or adjacent to a quantum well according to a specific embodiment. At least one or each of the barrier layers has a thickness ranging from about 3 nm to about 8 nm and is configured between a pair of quantum wells or adjacent to a quantum well according to a specific embodiment. The device also has a p-type cladding material overlying the active region. The p-type cladding material is substantially free from an aluminum bearing material according to a preferred embodiment. The device optionally has a p-type material overlying the p-type cladding material.

In other embodiments, the invention provides yet an alternative optical device, which has a gallium and nitrogen containing substrate including a {20-21} crystalline surface region orientation. An n-type cladding material is overlying the n-type gallium and nitrogen containing material. Preferably, the n-type cladding material is substantially free from an aluminum bearing material. The device has an active region comprising at least two quantum wells, each of which has a thickness of 2.5 nm and greater. The device has one or more barrier layers, each of which has an n-type impurity characteristic and a thickness ranging from about 2 nm to about 5 nm or about 3 nm to about 8 nm in one or more alternative embodiments. Preferably, each of the barrier layers is configured between a pair of quantum wells according to a specific embodiment. The device also has a p-type cladding material overlying the active region according to a specific embodiment. The p-type cladding material is substantially free from an aluminum bearing material according to a specific embodiment. The device also has a p-type material overlying the p-type cladding material.

In other embodiments, the invention provides a method of fabricating an optical device, which has a gallium and nitrogen containing substrate including a {20-21} crystalline surface region orientation. An n-type cladding material is overlying the n-type gallium and nitrogen containing material. Preferably, the n-type cladding material is substantially free from an aluminum bearing material. The method includes forming an active region comprising at least two quantum wells, each of which has a thickness of 2.5 nm and greater. The device has one or more barrier layers, each of which has an n-type impurity characteristic and a thickness ranging from about 2 nm to about 5 nm or about 3 nm to about 8 nm in one or more alternative embodiments. Preferably, each of the barrier layers is configured between a pair of quantum wells according to a specific embodiment. The method also includes forming a p-type cladding material overlying the active region according to a specific embodiment. The p-type cladding material is substantially free from an aluminum bearing material according to a specific embodiment. The method also includes forming a p-type material overlying the p-type cladding material.

In a specific embodiment, the present invention provides an optical device, such as a laser diode. The device has a gallium and nitrogen containing substrate including a {20-21} crystalline surface region orientation, which may be off-cut according to one or more embodiments. The device has an n-type cladding material overlying the n-type gallium and nitrogen containing material. In a preferred embodiment, the n-type cladding material is substantially free from an aluminum bearing material. The device also has an active region comprising at least two quantum wells. In a specific embodiment, each of the quantum wells has a thickness of 2.5 nm and greater and one or more barrier layers according to a specific embodiment. Each of the barrier layers has a p-type characteristic and a thickness ranging from about 2 nm to about 3.5 nm in a specific embodiment. Each of the barrier layers has a p-type characteristic and a thickness ranging from about 3.5 nm to about 7 nm in an alternative specific embodiment. In a preferred embodiment, each of the barrier layers is configured between a pair of quantum wells. The device also has a p-type cladding material overlying the active region. Preferably, the p-type cladding material is substantially free from an aluminum bearing material. And overlying p-type material is included. In a preferred embodiment, the active region is configured for a forward voltage of less than about 6V or less than about 7V for the device for an output power of 60 mW and greater.

In one or more embodiments, the present invention includes a laser diode substantially free from an aluminum containing cladding region. To form the laser diode without an aluminum containing cladding region, the present laser diode includes three or more quantum wells to provide enough confinement of the optical mode for sufficient gain to reach lasing. However, when the number of quantum wells increases in the active region, the forward voltage of the diode can increase, as a tradeoff We have determined that the forward voltage of the diode can be reduced in multi-quantum well active regions by way of the use of thin barriers on the order of 5 nm, which are much thinner than conventional lasers such as those in Yoshizumi et al., "Continuous-Wave operation of 520 nm Green InGaN-Based Laser Diodes on Semi-Polar {20-21} GaN Substrates," Applied Physics Express 2 (2009) 092101. We have also determined that the forward voltage can be reduced in multi-quantum well active regions by adding p or n-type dopant species to the active region according to one or more other embodiments. Although any one or combination of these approached can be used, we believe it may be preferable to use the thin barrier approach to avoid adding impurities to the active region. The impurities may change optical losses and alter the electrical junction placement according to one or more embodiments. Accordingly, the present invention provides a laser device and method that is free from aluminum-containing cladding regions with low voltage on {20-21) substrates.

Moreover, the present invention provides an optical device that is substantially free from aluminum bearing cladding materials. The device has a gallium and nitrogen containing substrate member having a {20-21} crystalline surface region. The device has an n-type gallium and nitrogen containing cladding material. In a specific embodiment, the n-type gallium and nitrogen containing cladding material is substantially free from an aluminum species, which leads to imperfections, defects, and other limitations. The device also has an active region including multiple quantum well structures overlying the n-type gallium and nitrogen containing cladding material. In one or more preferred embodiments, the device also has thin barrier layers configured with the multiple well structures. The device has a p-type gallium and nitrogen containing cladding material overlying the active region. In a preferred embodiment, the p-type gallium and nitrogen containing cladding material is substantially free from an aluminum species. The device preferably includes a laser stripe region configured from at least the active region and characterized by a cavity orientation substantially parallel to a projection in a c-direction. The laser strip region has a first end and a second end. The device also has a first etched facet provided on the first end of the laser stripe region and a second etched facet provided on the second end of the laser stripe region. In yet other embodiments, the present device includes a gallium and nitrogen containing electron blocking region that is substantially free from aluminum species. In yet other embodiments, the device does not include any electron blocking layer or yet in other embodiments, there is no aluminum in the cladding layers and/or electron blocking layer, although other embodiments include aluminum containing blocking layers. In still other embodiments, the optical device and method are free from any aluminum material, which leads to defects, imperfections, and the like.

In preferred embodiments, the present method and structure is substantially free from InAlGaN or aluminum bearing species in the cladding layers as conventional techniques, such as those in Yoshizumi et al., "Continuous-Wave operation of 520 nm Green InGaN-Based Laser Diodes on Semi-Polar {20-21} GaN Substrates," Applied Physics Express 2 (2009) 092101. That is, the present laser structure and method are substantially free from any aluminum species in the cladding region. Aluminum is generally detrimental. Aluminum often leads to introduction of oxygen in the reactor, which can act as non radiative recombination centers to reduce the radiative efficiency and introduce other limitations. We also determined that oxygen can compensate p-type dopants in the p-cladding to cause additional resistivity in the optical device. In other aspects, we also determined that aluminum is detrimental to the MOCVD reactor and can react or pre-react with other growth precursors. Use of aluminum cladding layers is also cumbersome and can take additional time to grow. Accordingly, it is believed that the aluminum cladding free laser method and structure are generally more efficient to grow than conventional laser structures.

In a specific embodiment on the {20-21} GaN, the device has a laser stripe region formed overlying a portion of the off-cut crystalline orientation surface region. In a specific embodiment, the laser stripe region is characterized by a cavity orientation substantially in a projection of a c-direction, which is substantially normal to an a-direction. In a specific embodiment, the laser strip region has a first end and a second end, each of which is etched. In a preferred embodiment, the device is formed on a projection of a c-direction on a {20-21} gallium and nitrogen containing substrate having a pair of etched mirror structures, which face each other.

In a preferred embodiment, the device has a first etched facet provided on the first end of the laser stripe region and a second etched facet provided on the second end of the laser stripe region. In one or more embodiments, the first etched is substantially parallel with the second etched facet. Mirror surfaces are formed on each of the etched surfaces. The first etched facet comprises a first mirror surface. In a specific embodiment, the first mirror surface comprises a reflective coating. The reflective coating is selected from silicon dioxide, hafnia, and titania, tantalum pentoxide, zirconia, including combinations, and the like. Depending upon the embodiment, the first mirror surface can also comprise an anti-reflective coating.

Also in a preferred embodiment, the second etched facet comprises a second mirror surface. In a specific embodiment, the second mirror surface comprises a reflective coating, such as silicon dioxide, hafnia, and titania, tantalum pentoxide, zirconia, combinations, and the like. In a specific embodiment, the second mirror surface comprises an anti-reflective coating.

In a specific embodiment, the laser stripe has a length and width. The length ranges from about 50 microns to about 3000 microns or preferably from about 50 microns to 300 microns, 300 microns to about 90 microns or about 90 microns to about 1600 um microns. The strip also has a width ranging from about 0.5 microns to about 50 microns or preferably between 1 microns to about 1.5 microns, about 1.5 microns to about 2.0 microns, about 2.0 microns to about 4 microns, or about 4 microns to about 35 microns but can be other dimensions. In a specific embodiment, the width is substantially constant in dimension, although there may be slight variations. The width and length are often formed using a masking and etching process, which are commonly used in the art.

In a specific embodiment, the present invention provides an alternative device structure capable of emitting 501 nm and greater light in a ridge laser embodiment having etched facets. The device is provided, for example, with one or more of the following epitaxially grown elements:

an n-GaN cladding layer with a thickness from 100 nm to 3000 nm with Si doping level of 5E17 $cm^{-3}$ to 3E18 $cm^{-3}$;

an n-side SCH layer comprising InGaN with molar fraction of InN of between 3% and 15% and thickness from 20 nm to 150 nm;

multiple quantum well active region layers comprising at least two 2.0 nm to 7.5 nm InGaN quantum wells separated by thin 1.5 nm and greater, and optionally up to about 8 nm, GaN barriers a barrier region formed overlying the active region;

a p-side SCH layer comprising InGaN with molar a fraction of InN of between 0% and 15% and a thickness from 15 nm to 100 nm;

an electron blocking layer comprising AlGaN with molar fraction of aluminum of between 5% and 20% and thickness from 5 nm to 20 nm and doped with Mg;

a p-GaN cladding layer with a thickness from 400 nm to 1500 nm with Mg doping level of 2E17 $cm^{-3}$ to 2E19 $cm^{-3}$; and a p++-GaN contact layer with a thickness from 15 nm to 50 nm with Mg doping level of 1E19 $cm^{-3}$ to 1E21 $cm^{-3}$.

Of course there can be other embodiments such as the use of p-side GaN guiding layer in place of the p-SCH, the use of multiple different layers in the SCH regions, or the omission of the EBL layer. Again, there can be other variations, modifications, and alternatives.

In an example, a laser device is fabricated on a {20-21} substrate according to an embodiment of the present invention. The laser device includes gallium nitride substrate, which has an underlying n-type metal back contact region. In a specific embodiment, the metal back contact region is made of a suitable material such as those noted below and others. Further details of the contact region can be found throughout the present specification, and more particularly below.

In a specific embodiment, the device also has an overlying n-type gallium nitride layer, an active region, and an overlying p-type gallium nitride layer structured as a laser stripe region. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ $cm^{-3}$ and $10^{20}$ $cm^{-3}$.

In a specific embodiment, an n-type $Al_uIn_vGa_{1-u-v}N$ layer, where 0≤u, v, u+v≤1, is deposited on the substrate. In a specific embodiment, the carrier concentration may lie in the range between about $10^{16}$ $cm^{-3}$ and $10^{20}$ $cm^{-3}$. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific embodiment, the susceptor is heated to approximately 900 to 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 sccm and 10 sccm, is initiated.

In a specific embodiment, the laser stripe region is made of the p-type gallium nitride layer. In a specific embodiment, the laser stripe is provided by an etching process selected from dry etching or wet etching. In a preferred embodiment, the etching process is dry, but can be others. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region, which exposes contact region. In a specific embodiment, the dielectric region is an oxide such as silicon dioxide or silicon nitride, but can be others. The contact region is coupled to an overlying metal layer. The overlying metal layer is a multilayered structure containing gold and platinum (Pt/Au), nickel gold (Ni/Au), palladium and gold (Pd/Ti), but can be others.

In a specific embodiment, the laser device has active region. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may comprise multiple quantum wells, with 2-10 quantum wells. The quantum wells may comprise InGaN with GaN barrier layers separating them. In other embodiments, the well layers and barrier layers comprise $Al_wIn_xGa_{1-w-x}N$ and $Al_yIn_zGa_{1-y-z}N$, respectively, where 0≤w, x, y, z, w+x, y+z≤1, where w<u, y and/or x>v, z so that the bandgap of the well layer(s) is less than that of the barrier layer(s) and the n-type layer. The well layers and barrier layers may each have a thickness between about 1 nm and about 20 nm. The composition and structure of the active layer are chosen to provide light emission at a preselected wavelength. The active layer may be left undoped (or unintentionally doped) or may be doped n-type or p-type.

In a specific embodiment, the active region can also include an electron blocking region, and a separate confinement heterostructure. In some embodiments, an electron blocking layer is preferably deposited. The electron-blocking layer may comprise $Al_sIn_tGa_{1-s-t}N$, where 0≤s, t, s+t≤1, with a higher bandgap than the active layer, and may be doped p-type. In one specific embodiment, the electron blocking layer comprises AlGaN. In another embodiment, the electron blocking layer comprises an AlGaN/GaN superlattice structure, comprising alternating layers of AlGaN and GaN, each with a thickness between about 0.2 nm and about 5 nm.

In a specific embodiment, the action region structure does not include an AlGaN EBL layer. That is, the laser device is free from any electron blocking layer, which is optional in such embodiment.

As noted, the p-type gallium nitride structure is deposited above the electron blocking layer and active layer(s). The p-type layer may be doped with Mg, to a level between about $10^{16}$ $cm^{-3}$ and $10^{22}$ $cm^{-3}$, and may have a thickness between about 5 nm and about 1000 nm. The outermost 1 nm to 50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region, which exposes a contact region. In a specific embodiment, the dielectric region is an oxide such as silicon dioxide.

In a specific embodiment, the metal contact is made of suitable material. The electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device.

In an example, a laser device includes a starting material such as a bulk nonpolar or semipolar GaN substrate, but can be others. In a specific embodiment, the device is configured to achieve emission wavelength ranges of 390 nm to 420 nm, 420 nm to 440 nm, 440 nm to 470 nm, 470 nm to 490 nm, 490 nm to 510 nm, and 510 nm to 540 nm, but can be others.

In a preferred embodiment, the growth structure is configured using between 3 and 5 or 5 and 7 or 7 and 9 quantum wells positioned between n-type GaN and p-type GaN cladding layers. In a specific embodiment, the n-type GaN cladding layer ranges in thickness from 500 nm to 4000 nm and has an n-type dopant such as Si with a doping level of between $5E17$ $cm^{-3}$ and $5E18$ $cm^{-3}$. In a specific embodiment, the p-type GaN cladding layer ranges in thickness from 500 nm to 1200 nm and has a p-type dopant such as Mg with a doping level of between $1E17$ $cm^{-3}$ and $7E19$ $cm^{-3}$. In a specific embodiment, the Mg doping level is graded such that the concentration may be lower in the region closer to the quantum wells.

In a specific preferred embodiment, the quantum wells have a thickness of between 2.5 nm and 4 nm, 4 nm and 5.5 nm or 5.5 nm and 8 nm, but can be others. In a specific embodiment, the quantum wells may be separated by barrier layers with thicknesses between 2 nm and 3.5 nm or 3.5 nm and 6 nm or 6 nm and 8 nm. The quantum wells and the barriers together comprise a multiple quantum well (MQW) region.

In a preferred embodiment, the device has barrier layers formed from GaN, InGaN, AlGaN, or InAlGaN. In a specific embodiment using InGaN barriers, the indium contents range from 0% to 5% (mole percent), but can be others. Also, it should be noted that % of indium or aluminum is in a molar fraction, not weight percent.

An InGaN separate confinement heterostructure layer (SCH) can be positioned between the n-type GaN cladding and the MQW region according to one or more embodiments. Typically, such separate confinement layer is also referred to as the n-side SCH. The n-side SCH layer ranges in thickness from 10 nm to 60 nm or 60 nm to 150 nm and ranges in indium composition from 1% to 12% (mole percent of InN), but can be others. In a specific embodiment, the n-side SCH layer may be doped with an n-type dopant such as Si.

In yet another preferred embodiment, an InGaN separate confinement heterostructure layer (SCH) is positioned between the p-type GaN cladding and the MQW region, which is called the p-side SCH. In a specific embodiment, the p-side SCH layer ranges in thickness from 10 nm to 40 nm or 40 nm to 150 nm and ranges in indium composition from 0% to 10% (mole percent), but can be others. The p-side SCH layer may be doped with a p-type dopant such as Mg.

In another embodiment, the structure may contain both an n-side SCH and a p-side SCH. In another embodiment, the p-side SCH can be replaced with p-side GaN guiding layer. In another embodiment, the n-side and/or p-side SCH regions may contain multiple layers.

In another embodiment, the structure may contain a GaN guiding layer on the p-side positioned between the p-type GaN cladding layer and the MQW region. This GaN guiding layer may range in thickness from 10 nm to 60 nm and may or may not be doped with a p-type species such as Mg.

In a specific preferred embodiment, an AlGaN electron blocking layer, with an aluminum content of between 5% and 20% (mole percent), is positioned between the MQW and the p-type GaN cladding layer either between the MQW and the p-side SCH, within the p-side SCH, or between the p-side SCH and the p-type GaN cladding. The AlGaN electron blocking layer ranges in thickness from 5 nm to 20 nm and is doped with a p-type dopant such as Mg from $1E17$ $cm^{-3}$ and $1E21$ $cm^{-3}$ according to a specific embodiment. In other embodiments, the electron blocking layer is free from any aluminum species and/or may be eliminated all together. In yet another embodiment, the device may be substantially free from an electron blocking layer.

Preferably, a p-contact layer positioned on top of and is formed overlying the p-type cladding layer. The p-contact layer may comprise GaN doped with a p-dopant such as Mg at a level ranging from $1E20$ $cm^{-3}$ to $1E22$ $cm^{-3}$.

In an example, a laser device has a gallium and nitrogen containing substrate member (e.g., bulk gallium nitride) having a {20-21} crystalline surface region or other surface configuration. The device has an n-type gallium and nitrogen containing cladding material. In a specific embodiment, the n-type gallium and nitrogen containing cladding material is substantially free from an aluminum species, which leads to imperfections, impurities, and other limitations. In one or more preferred embodiment, the cladding material has no aluminum species and is made of a gallium and nitrogen containing material.

In a specific embodiment, the device also has an active region including multiple quantum well structures overlying the n-type gallium and nitrogen containing cladding material. In one or more embodiments, the active regions can include those noted, as well as others. That is, the device can include InGaN/InGaN and/or InGaN/GaN active regions, among others. In a specific embodiment, the optical can include seven MQW, six MQW, five MQW, four MQW, three MQW, more MQW, or fewer, and the like.

In a specific embodiment, the device has a p-type gallium and nitrogen containing cladding material overlying the active region. In a preferred embodiment, the p-type gallium and nitrogen containing cladding material is substantially free from an aluminum species, which leads to imperfections, defects, and other limitations. In one or more preferred embodiment, the cladding material has no aluminum species and is made of a gallium and nitrogen containing material.

In a specific embodiment, the device preferably includes a laser stripe region configured from at least the active region and characterized by a cavity orientation substantially parallel to a projection in a c-direction. Other configurations may also exist depending upon the specific embodiment. The laser strip region has a first end and a second end or other configurations. In a specific embodiment, the device also has a first etched facet provided on the first end of the laser stripe region and a second etched facet provided on the second end of the laser stripe region.

In yet other embodiments, the present device includes a gallium and nitrogen containing electron blocking region that is substantially free from aluminum species. In yet other embodiments, the device does not include any electron blocking layer or yet in other embodiments, there is no aluminum in the cladding layers and/or electron blocking layer.

In preferred embodiments, the present method and structure is substantially free from InAlGaN or aluminum bearing species in the cladding layers as conventional techniques, such as those in Yoshizumi et al., "Continuous-Wave operation of 520 nm Green InGaN-Based Laser Diodes on Semi-Polar {20-21} GaN Substrates," Applied Physics Express 2 (2009) 092101. That is, the present laser structure and method are substantially free from any aluminum species in the cladding region. Aluminum is generally detrimental.

Aluminum often leads to introduction of oxygen in the reactor, which can act as non radiative recombination centers to reduce the radiative efficiency and introduce other limitations. We also determined that oxygen can compensate p-type dopants in the p-cladding to cause additional resistivity in the optical device. In other aspects, we also determined that aluminum is detrimental to the MOCVD reactor and can react or pre-react with other growth precursors. Use of aluminum cladding layers is also cumbersome and can take additional time to grow. Accordingly, it is believed that the aluminum cladding free laser method and structure are generally more efficient to grow than conventional laser structures. Further details of the present laser configured on {20-21} is disclosed in U.S. application Ser. No. 12/883,652 filed on Sep. 16, 2010, which is incorporated by reference in its entirety.

In an example, a gallium and nitrogen containing laser device configured on either a nonpolar or a semipolar surface orientation. The device has a gallium and nitrogen containing substrate member and a cladding region overlying the substrate member. In an example, the device has a cavity region formed overlying the cladding region and configured in alignment in substantially a c-direction or a projection of the c-direction. Preferably, a cavity region is characterized by a first end and a second end. In an example, the device has a first optical coating formed overlying the first facet, wherein the first coating overlying the first facet is configured to increase a reflectivity and a second optical coating formed overlying the second facet, wherein the second coating layer overlying the second facet is configured to reduce a reflectivity. The device has an optical power density characterizing the laser device, the laser device being substantially free from COMD related failure.

In an example, the nonpolar or semipolar surface orientation comprises an m-plane, a (30-31) plane, a (20-21) plane, a (30-32) plane, a (30-3-1) plane, a (20-2-1) plane, a (30-3-2) plane, or an offcut of within +/−5 degrees of any of these planes toward an a-direction or a c-direction; the cladding region being substantially free from Al-containing material, the cladding region being characterized by an AlN mol fraction in the cladding region of less than about 2%. In an example, the first optical coating is provided by a method selected from electron-beam deposition, thermal evaporation, PECVD, sputtering, and a combination of any of the foregoing. In other examples, the present invention also includes related methods reciting the same or similar elements.

In an example, the device comprises an output cavity width of greater than about 3 μm and less than about 25 μm, and is operable at over 1 W or wherein the device comprises an output cavity width of greater than about 3 μm and less than about 25 μm and is operable at over 2 W or wherein the device comprises an output cavity width of greater than about 3 μm and less than about 35 μm, and is operable at over 3 W or wherein the device comprises an output cavity width of greater than about 3 μm and less than about 35 μm, and is operable at over 4.5 W or wherein the device comprises an output cavity width of greater than about 3 μm and less than about 50 μm and is operable at over 3 W. In an example, the device is substantially free from COMD for power levels greater than 100 mW per micron of output cavity width, 200 mW per micron of output cavity width, or 400 mW per micron of output cavity width.

The method and device here can be configured with conductive oxides, low temperature p-clad, n-contact scribes, beam clean-up scribes, among others. It can also include an indium tin oxide (ITO) or ZnO cladding region on top of a thin p-type layer such as p-GaN layer or region of 200 A to 2000 A for laser diodes or LEDs. Certain GaN planes may suffer from severe thermal degradation in the active region during growth of the electron blocking layer and the p-cladding layers where elevated temperatures are used. In a preferred embodiment, if ZnO or ITO is formed in place of a portion or substantially the p-clad layer or region, desirable p-type material can be achieved without subjecting the resulting device to a long growth time of the p-layer. That is, after the epitaxial growth is completed by MOCVD or other method such as MBE, one or more conducting oxide layers such as indium-tin-oxide (ITO) or zinc oxide (ZnO) may then be deposited directly on or generally above the thin p-cladding layer. These conducting oxide layers can be deposited at a temperature lower than a typical p-cladding growth temperature and even substantially lower than the growth temperature of the light emission region. This will prevent or drastically reduce any thermal degradation to the light emission region that may have occurred during the epitaxial growth of the conventional p-cladding region. The resulting conducting oxide layer can act as a p-cladding region in both laser and LED structures and can enable the formation of a good p-contact on top of the conducting oxide layer that results in ohmic or quasi-ohmic characteristics. Additionally, the conducting oxide layers can have optical absorption coefficients in the blue and green wavelength ranges of interest that are lower or significantly lower than the optical absorption coefficient of a typical highly doped epitaxial p-type cladding regions such as GaN or AlGaN, and may therefore help to reduce optical absorption for lower internal losses in a laser cavity or higher extraction efficiency in an LED device. In an alternative embodiment, metallic layers such as silver may be used in place of conducting oxide layers.

In a specific embodiment, the method and device can also include growth of a very low temperature p-cladding on top of the quantum well or light emitting layers. By developing epitaxial conditions that enable low resistance p-cladding sufficient for good device performance with a growth temperature of 700° C. to 800° C., 800° C. to 850° C., or 850° C. to 875° C. degradation to the quantum well or light emitting regions can be reduced.

In another embodiment using a transparent conductive oxide such as ITO the transparent conductive oxide maybe deposited above p-type cladding region(s) and below metallization layers. The conductive oxide such as ITO may serve as a low refractive index layer to reduce the amount of modal overlap with the overlying metallization layers, and hence reduce the internal loss of the laser diode. Such a reduction of internal loss may increase the efficiency of the laser device. There are many methods and processes to form the conductive oxide layer including depositing it with an ebeam technique, a sputter technique, an evaporation technique, or with an electron cyclotron resonance (ECR) technique. The conductive oxide may be deposited only on top of the laser stripe or the conductive oxide may be deposited over a larger area so that it extends laterally from the top of the laser stripe. Metallization of conventional metals such as Au, Pd, Ni, Pt, and Ti may then be performed overlying a region of the conductive oxide.

In another embodiment to reduce internal loss of a laser by mitigating the modal overlap with the metal regions overlying the p-type cladding, a highly reflective metal such as Ag can be deposited between the p-type gallium and nitrogen cladding region and the primary metallization layers. The reflective metal layer(s) such as silver may serve to reflect the electromagnetic radiation from the optical mode and reduce the modal overlap with the overlying metallization layers, and hence reduce the internal loss of the laser diode. Such a reduction of internal loss may increase the efficiency of the laser device. There are many methods and processes to form the highly reflective metal layer including depositing it with an ebeam technique, a sputter technique, or an evaporation technique. The reflective metal layer may be deposited only on top of the laser stripe or the reflective metal layer may be deposited over a larger area so that it extends laterally from the top of the laser stripe. Metallization of conventional metals such as Au, Pd, Ni, Pt, and Ti may then be performed overlying a region of the highly reflective metal layers.

In a specific embodiment on the {20-2-1} GaN, the device has a laser stripe region formed overlying a portion of the off-cut crystalline orientation surface region. The laser stripe region is characterized by a cavity orientation substantially in a projection of a c-direction, which is substantially normal to an a-direction. The laser stripe region has a first end 807 and a second end 809 and is formed on a projection of a c-direction on a {20-2-1} gallium and nitrogen containing substrate having a pair of cleaved mirror structures which face each other. The cleaved facets provide a reflective coating, no coating, an antireflective coating, or expose gallium and nitrogen containing material.

In embodiments, the device has a first cleaved facet provided on the first end of the laser stripe region and a second cleaved facet provided on the second end of the laser stripe region. The first cleaved facet is substantially parallel with the second cleaved facet. Mirror surfaces are formed on each of the cleaved surfaces. The mirror surface of the first cleaved facet is provided by a top-side skip-scribe scribing and breaking process. The scribing process can use any suitable techniques, such as a diamond scribe or laser scribe. In a specific embodiment, the first mirror surface comprises a reflective coating. The reflective coating is selected from silicon dioxide, hafnia, and titania, tantalum pentoxide, zirconia, or combinations thereof. Depending upon the embodiment, the first mirror surface can also comprise an anti-reflective coating.

Also, in certain embodiments, the second cleaved facet comprises a second mirror surface provided by a top side skip-scribe scribing and breaking process. Preferably, the scribing is diamond scribed or laser scribed. In a specific embodiment, the second mirror surface comprises a reflective coating, such as silicon dioxide, hafnia, and titania, tantalum pentoxide, zirconia, combinations, and the like.

In certain embodiments, the device has a first cleaved facet provided on the first end of the laser stripe region and a second cleaved facet provided on the second end of the laser stripe region. The first cleaved facet is substantially parallel with the second cleaved facet. Mirror surfaces are formed on each of the cleaved surfaces. The mirror surface of the first cleaved facet is provided by a nicking and breaking process where a nick is induced in the semiconductor material using a laser scribe or diamond scribe. This nick behaves as a crack initiation site such that during the breaking process a crack is induced and propagates a cleavage place to form a cleaved facet. Guiding etches or scribes may be used to guide the cleavage plane along a predetermined direction. The nick scribing process can use any suitable techniques, such as a diamond scribe or laser scribe. In a specific embodiment, the first mirror surface comprises a reflective coating. The reflective coating is selected from silicon dioxide, hafnia, and titania, tantalum pentoxide, zirconia, or combinations thereof. Depending upon the embodiment, the first mirror surface can also comprise an anti-reflective coating.

Also, in certain embodiments, the second cleaved facet comprises a second mirror surface provided by a nicking and breaking process where a nick is induced in the semiconductor material using a laser scribe or diamond scribe. The nick behaves as a crack initiation site such that during the breaking process a crack is induced and propagates a cleavage place to form a cleaved facet. Guiding etches or scribes may be used to guide the cleavage plane along a predetermined direction. The nick scribing process can use any suitable techniques, such as a diamond scribe or laser scribe. In a specific embodiment, the second mirror surface comprises a reflective coating, such as silicon dioxide, hafnia, and titania, tantalum pentoxide, zirconia, combinations, and the like.

In certain embodiments, the device has a first etched facet provided on the first end of the laser stripe region and a second etched facet provided on the second end of the laser stripe region. The first etched facet is substantially parallel with the second etched facet. Mirror surfaces are formed on each of the etched surfaces. The mirror surface of the first etched facet is provided by a lithography and etching process where the etching process is selected from one of the following of chemical assisted ion beam etching (CAIBE), reactive ion etching (RIE), or inductively coupled plasma (ICP) etches. In a specific embodiment, the first mirror surface comprises a reflective coating. The reflective coating is selected from silicon dioxide, hafnia, and titania, tantalum pentoxide, zirconia, or combinations thereof. Depending upon the embodiment, the first mirror surface can also comprise an anti-reflective coating.

Also, in certain embodiments, the second etched facet comprises a second mirror surface provided by a lithography and etching process a lithography and etching process where the etching process is selected from one of the following of chemical assisted ion beam etching (CAIBE), reactive ion etching (RIE), or inductively coupled plasma (ICP) etches. In a specific embodiment, the second mirror surface comprises a reflective coating, such as silicon dioxide, hafnia, and titania, tantalum pentoxide, zirconia, combinations, and the like.

The laser stripe has a length from about 50 microns to about 3000 microns, but is preferably between 50 microns and 300 microns, 300 microns and 900 microns, or 900 microns and 1600 microns. The stripe also has a width ranging from about 0.5 microns to about 50 microns, but is preferably between 0.8 microns and 3 microns or between 3 microns and about 35 microns. In a specific embodiment, the overall device has a width ranging from about 0.5 microns to about 15.0 microns. In a specific embodiment, the width is substantially constant in dimension, although there may be slight variations. The width and length are often formed using a masking and etching process, which are commonly used in the art.

This invention provides an optical device structure capable of emitting 501 nm and greater (e.g., 525 nm) light in a ridge laser embodiment. The device preferably includes: (1) a gallium and nitrogen containing substrate configured with a {20-2-1} surface region, (2) an InGaN separate confinement heterostructure, (3) a gallium nitrogen barrier layer(s), (4) a plurality of InGaN quantum wells (2 to 10), (5) a gallium nitrogen barrier layer(s), (6) an AlGaN electron blocking layer, (7) a p-type gallium nitrogen cladding layer, and (8) a p+ gallium nitrogen contact layer.

In an example, the present method and structure has trenches each of which is 5-10 microns wide, although there can be variations, e.g., 1 micron or narrower trenches may still be able to block trenches. In an example, wider trenches may be configured as long as they do not interference with useful area for device fabrication. As each of the trenches become wide, like wider than 25 microns to 50 microns, the resulting structure actually becomes more like a mesa structure where there is more trench region than an elevated region such that the device may actually appear on a mesa as opposed to just having trenches protecting it, although there can be variations. With that said, mesa structures are desirable and are not excluded. In an example, trench regions can be greater than 0.1 microns, greater than 0.5 microns, greater than 1 micron, and greater than 3 microns.

In an example, as for the growth regions (e.g., the whole wafer is a growth region), each of these will range from 5 microns wide to 50 microns or 200 microns wide, including variations. In an example, smaller growth regions are desirable since they can lead to fewer defects, although they growth region should be large enough to form a laser device thereon and achieve smooth epi close to these interfaces on the boundary of the trenches. In an example, desirable trench width will be in the 10 to 50 microns, among others.

In an example, a ratio defined between spatial regions of the trenches to growth regions can vary. In an example, a mesa structure to growth region can have a ratio of 5% and greater and a narrow trench structure to growth region can have a ratio up to 95%, although there can be variations.

In an example, one of the benefits of the present method and structure is reduced misfit dislocations as described. For a given epi structure with high strain the number of misfit dislocations is greatly reduced in these regions depending on the width of the region. In an example, the reduced dislocations also lead to resulting higher strained structures. That is, the method and structure achieves growth structures with much higher strain and still maintain good film quality. In an example, growth structures with 7, 9, or 11 quantum wells can be formed, while still maintaining good epi quality. In other embodiments, SCH regions with much higher indium content for better confinement are achieved, while still maintaining a high film quality.

In an example, it has been discovered that certain semipolar planes are more susceptible to thermal degradation of the light emitting active region during the subsequent growth of the p-type layers above the active region such as electron blocking layers, p-cladding layers, and p-contact layers. This thermal degradation characteristic results in reduced brightness or optical output power from the light emitting region using photoluminescence or electroluminescence measurements. The reduced brightness indicates reduced internal efficiency of the material due to the introduction of defects that act as non-radiative recombination centers. Such non-radiative recombination centers ultimately reduce device efficiency and can even prevent laser diode operation.

In an embodiment for lasers fabricated on a family of planes including, but not limited to, (30-3-2), (20-2-1), (30-3-1), (30-32), (20-21), (30-31) or any orientation within +/−10 degrees toward c-plane and/or a-plane from these orientations, the epitaxial device structure may contain a thin, 5 nm to 20 nm, 20 nm to 100 nm, 100 nm to 300 nm p-type region grown above the light emitting or quantum well regions. This thin p-type layer or layers may be characterized by a p-type cladding layer, an electron blocking layer, some combination, or other and may comprise GaN, AlGaN, InGaN, or InAlGaN and doped with a p-type species such as magnesium. Ultra-thin layers in this range grown at temperatures below, about equal to, or only slightly hotter (10° C. to 75° C.) than the growth temperature used for the light emitting layers can mitigate the thermal degradation to the light emitting layers that occurs when the layers are grown hotter or thicker. The reduced thermal degradation is a result of the relatively short growth time and the low growth temperature required for deposition of the thin p-clad layer.

After the epitaxial growth is completed by MOCVD or other method such as MBE, one or more conducting oxide layers such as indium-tin-oxide (ITO) or zinc oxide (ZnO) may then be deposited directly on or generally above the thin p-cladding layer. These conducting oxide layers can be deposited at a temperature lower than a typical p-cladding growth temperature and even substantially lower than the growth temperature of the light emission region. This will prevent or drastically reduce any thermal degradation to the light emission region that may have occurred during the epitaxial growth of the conventional p-cladding region. The resulting conducting oxide layer can act as a p-cladding region in laser structures and can enable the formation of a good p-contact on top of the conducting oxide layer that results in ohmic or quasi-ohmic characteristics. Additionally, the conducting oxide layers can have optical absorption coefficients in the blue and green wavelength ranges of interest that are lower or significantly lower than the optical absorption coefficient of a typical highly doped epitaxial p-type cladding regions such as GaN or AlGaN, and may therefore help to reduce optical absorption for lower internal losses in a laser cavity. In an alternative embodiment, metallic layers such as silver may be used in place of conducting oxide layers.

In another embodiment for lasers fabricated on a family of planes including, but not limited to, (30-3-2), (20-2-1), (30-3-1), (30-32), (20-21), (30-31) or any orientation within +/−10 degrees toward c-plane and/or a-plane from these orientations, the epitaxial device structure may contain a p-type cladding region grown at very low growth temperature while still enabling an acceptable voltage characteristic within the device. The p-cladding layer may comprise GaN, AlGaN, InGaN, or InAlGaN and may be doped with a species such as magnesium. The very low growth temperature may be less than, equal to, or only slightly higher (10° C. to 50° C.) than the growth temperature used for the light emitting layers. More typically, the p-cladding region is grown at temperatures more than 50° C., more than 100° C., or more than 150° C. hotter than the light emitting layers. The substantially lower growth temperature may mitigate degradation to the light emitting layers that typically occurs when the layers are grown hotter or thicker. In a laser diode structure, the growth conditions, layer thickness, and layer composition may be designed to enable a laser device operable below 7V, operable below 6V, or operable below 5V.

An example of a laser diode with a conductive oxide layer that comprises a substantial portion of the p-type cladding region is included. In this embodiment the waveguide stripe region is comprised entirely of the conductive oxide such that it forms all of the lateral index contrast to provide the lateral waveguide. As an example, the conductive oxide can be an indium tin oxide, or other suitable material.

An example of a laser diode with a conductive oxide layer that comprises a substantial portion of the p-type cladding region is included. In this embodiment the waveguide stripe region comprises a combination of a conductive and an epitaxially deposited p-type material such as p-type GaN, AlGaN, InAlGaN, or other gallium and nitrogen containing materials. In this embodiment the conductive oxide and the epitaxially formed p-type material provides the lateral index contrast to provide the lateral waveguide.

An example process flow for forming a laser diode with a conductive oxide layer that comprises a substantial portion of the p-type cladding region is included. In this example the epitaxially grown wafer is subjected to a photolithography process that may result in openings in the photoresist where the desired lasers stripes will be positioned. Following the photolithography the conductive oxide layer is deposited on the patterned wafer. The deposition methods include sputtering, electron beam, electron cyclotron resonance (ECR) deposition, or various other evaporation methods. The ECR deposition occurs at a rate of 1-3 angstroms per second, provides an ohmic contact to the p-layer it is deposited on, and provides a suitable sheet resistance for and absorption coefficient for forming an electrically conductive and low optical loss cladding region. This is followed by a lift-off process where the conductive oxide on top of the photoresist is removed from the wafer to result in laser stripe regions defined by the remaining conductive oxide stripes. In this embodiment the conductive oxide stripe region forms all of the lateral index contrast to provide the lateral waveguide.

An alternative example process flow for forming a laser diode with a conductive oxide layer that comprises a substantial portion of the p-type cladding region is included. In this example the epitaxially grown wafer is subjected to a blanket deposition of a conductive oxide layer. The deposition methods include sputtering, electron beam, electron cyclotron resonance (ECR) deposition, or various other evaporation methods. Following the deposition a photolithography process is used to define laser stripe patterns in the photoresist where the desired lasers stripes will be positioned. Following the photolithography step and etching process is carried out to remove the conductive oxide layer in the field without the photoresist. This etching process can be wet or dry. An example of a wet etch chemistry may include HCl or HCl and $FeCl_3$. In this embodiment the conductive oxide stripe region forms all of the lateral index contrast to provide the lateral waveguide.

In another embodiment using a transparent conductive oxide such as ITO the transparent conductive oxide may be deposited above p-type cladding region(s) and below metallization layers. In this embodiment the transparent conductive oxide may or may not form a substantial portion of the p-type cladding region and may primarily serve as a low refractive index layer to reduce the amount of modal overlap with the overlying metallization layers which are very lossy/absorbing to the optical mode of the laser diode. Such a configuration may substantially prevent the optical mode from overlapping the metal and hence reduce the internal loss of the laser diode. Such a reduction of internal loss may increase the efficiency of the laser device. In a preferred process, after the ridge was formed using a wet or dry etching process to define the laser stripe and the dielectric passivation layer was deposited to passivate the regions surrounding the top of the ridge, but leaving an opening on the top of the ridge exposing a semiconductor surface, a conductive oxide may be deposited on top of the exposed semiconductor region on top of the ridge and may also overly some of the surrounding dielectric passivation region. The conductive oxide may then be patterned through a lift off process or by a wet or dry etching process. Metallization layers such as Au, Pd, Ni, Pt, and Ti may then be performed overlying a region of the conductive oxide. There are many methods and processes to form the conductive oxide layer including depositing it with an ebeam technique, a sputter technique, an evaporation technique, or with an electron cyclotron resonance (ECR) technique.

In another embodiment to reduce loss from the metallization layers overlying the p-type cladding regions a highly reflective metal such as silver may be deposited above p-type cladding region(s) and below the primary metallization layers. In this embodiment the highly reflective metal may primarily serve as a reflector layer to reduce the amount of modal overlap with the overlying metallization layers, and hence reduce the internal loss of the laser diode. Such a reduction of internal loss may increase the efficiency of the laser device. In a preferred process, after the ridge was formed for the laser diode and the dielectric passivation layer was deposited to passivate the regions surrounding the top of the ridge, but leaving an opening on the top of the ridge exposing a semiconductor surface, a highly reflective metal layer such as Ag may be deposited on top of the exposed semiconductor region on top of the ridge and may also overly some of the surrounding dielectric passivation region. The highly reflective metal layer such as silver may then be patterned through a lift off process or by a wet or dry etching process. Metallization layers such as Au, Pd, Ni, Pt, and Ti may then be performed overlying a region of the conductive oxide. Further, in one embodiment, Pt or another metal may be added to the highly reflective layer to improve characteristics such as the contact resistance to the semiconductor surface. There are many methods and processes to form the conductive oxide layer including depositing it with an ebeam technique, a sputter technique, or with an evaporation technique.

In one preferred embodiment an electron cyclotron resonance (ECR) deposition method is used to form an indium tin oxide (ITO) layer as the electrically conductive oxide. By using the ECR process to deposit ITO a low damage will be inflicted on the semiconductor surface to enable very good contact resistance. The bulk resistivity of these ITO films can be less than about $10E^{-4}$ ohm-cm, less than about $4E^{-4}$ ohm-cm, or less than about $3E^{-4}$ ohm-cm. This resistivity is drastically higher than typical p-type GaN or p-type AlGaN which can be 3-4 orders of magnitude higher. The lower resistivity will result in a lower device series resistance and hence a lower operating voltage within the laser diode for higher efficiency. Further, the index of refraction of the ITO will be lower than that of GaN, AlGaN, or InAlGaN to provide better waveguiding for laser diodes operating in the blue and green wavelength regimes. For example, in the 450 nm range the index of refraction for ITO is about 2.05 and for GaN it is about 2.48 while in the 525 nm range the index of refraction for ITO is about 1.95 and for GaN it is about 2.41. The lower index of the ITO will provide higher index contrast with the InGaN based active region and hence can provide higher overlap with the quantum wells for higher modal gain. In a specific example, the conductive oxide is formed at a temperature lower than 350° C. or lower than 200° C. Additionally, for both the conductive oxide and the low temp pGaN, the laser device is operable in the 500 nm to 600 nm range.

In an alternative embodiment an electron cyclotron resonance (ECR) deposition method is used to form a zinc oxide (ZnO) layer as the electrically conductive oxide. By using the ECR process to deposit ZnO a low damage will be inflicted on the semiconductor surface to enable very good contact resistance. The ECR deposition occurs at a rate of 1-3 angstroms per second, provides an ohmic contact to the p-layer it is deposited on, and provides a suitable sheet resistance for and absorption coefficient for forming an electrically conductive and low optical loss cladding region.

In yet an another preferred embodiment, the transparent conductive oxide such as ITO is deposited through a low damage sputtering process. In such a process it is very important that the sputtering process does inflict damage to the semiconductor layer and create a very high contact resistance. As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above toward an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above toward an (h k l) plane wherein l=0, and at least one of h and k is non-zero).

As shown, the present device can be enclosed in a suitable package. Such package can include those such as in TO-38 and TO-56 headers. Other suitable package designs and methods can also exist, such as TO-9 or flat packs where fiber optic coupling is required and even non-standard packaging. In a specific embodiment, the present device can be implemented in a co-packaging configuration such as those described in U.S. Application Publication No. 2010/0302464, which is incorporated by reference in its entirety.

In other embodiments, the present laser device can be configured in a variety of applications. Such applications include laser displays, metrology, communications, health care and surgery, information technology, and others. As an example, the present laser device can be provided in a laser display such as those described in U.S. Application Publication No. 2010/0302464, which is incorporated by reference in its entirety.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as a gallium and nitrogen containing epitaxial region, or functional regions such as n-type GaN, combinations, and the like. Additionally, the examples illustrates two waveguide structures in normal configurations, there can be variations, e.g., other angles and polarizations. For semipolar, the present method and structure includes a stripe oriented perpendicular to the c-axis, an in-plane polarized mode is not an Eigen-mode of the waveguide. The polarization rotates to elliptic (if the crystal angle is not exactly 45 degrees, in that special case the polarization may rotate but be linear, like in a half-wave plate). The polarization will of course not rotate toward the propagation direction, which has no interaction with the Al band. The length of the a-axis stripe determines which polarization comes out at the next mirror.

Although the embodiments above have been described in terms of a laser diode, the methods and device structures can also be applied to any light emitting diode device. Therefore, the above description and illustrations should not be taken as limiting the scope of the present invention which is defined by the appended claims.

What is claimed is:

1. A method of fabricating a gallium and nitrogen containing laser diode device, the method comprising:
   providing a gallium and nitrogen containing substrate material comprising a surface region, the surface region having a semi-polar crystal orientation;
   forming a plurality of recessed regions formed within the substrate material, each pair of adjacent recessed regions forming a mesa region therebetween, the mesa region having a width of less than 50 microns, the pair of adjacent recessed regions being configured to block a plurality of defects from migrating into the mesa region;
   forming an epitaxially formed gallium and nitrogen containing region formed overlying the mesa region, the epitaxially formed gallium and nitrogen containing region being substantially free from defects migrating from regions outside the pair of adjacent recessed regions to the mesa region;
   forming an active region formed overlying the mesa region;
   forming a p-type region overlying the active region;
   forming a laser stripe region overlying a portion of the mesa region, the laser stripe region being characterized by a cavity orientation substantially parallel to a projection of a c-direction, the laser stripe region having a first end and a second end; and
   forming a first facet provided on the first end of the laser stripe region and a second facet provided on the second end of the laser stripe region.

2. The method of claim 1, further comprising forming a p-type cladding region comprising an (InAl)GaN material doped with a plurality of magnesium species formed overlying the active region.

3. The method of claim 1, wherein the semipolar plane is selected from one of {30-3-1}, {30-31}, {20-2-1}, {30-3-2}, {20-21}, {30-3-1}, {30-32}, or an offcut from any one of these planes within +/−5 degrees toward a c-plane.

4. The method of claim 1, wherein the active region comprises InGaN quantum wells configured to emit in the blue range having a wavelength of between 430 nm to 480 nm or in the green range having a wavelength of between 500 nm to 540 nm.

5. The method of claim 1, wherein the p-type region is a p-type gallium and nitrogen containing cladding region, and further comprising:
   forming a conductive oxide layer comprising an indium tin oxide overlying the p-type gallium and nitrogen containing cladding region; and
   forming a metallization layer selected from at least one of Au, Ni, Pd, Pt, or Ti overlying the conductive oxide layer.

6. The method of claim 1, wherein the p-type region is a p-type gallium and nitrogen containing cladding region, and the method further comprising:
   forming a highly reflective metal layer overlying the p-type gallium and nitrogen containing cladding region; and
   forming a metallization layer selected from at least one of Au, Ni, Pd, Pt, or Ti overlying the highly reflective metal layer.

7. The method of claim 1, wherein,
   the active region comprises one or more light emitting layers;

each of the one or more lighting emitting layers being configured between a pair of barrier regions;

each of the one or more lighting emitting layers having a thickness ranging from about 2 nm to about 8 nm; and each of the barrier regions has a thickness ranging from 2 nm to 4 nm or 4 nm to 8 nm or 8 nm to 20 nm.

8. The method of claim 1, wherein the epitaxially grown region comprises a defect density of less than $10^5$ cm$^{-2}$; wherein each recessed region comprises a width ranging from five microns to two hundred microns; wherein the gallium and nitrogen containing material is GaN.

9. The method of claim 1, wherein the first and second facets are cleaved facets.

10. The method of claim 1, wherein the first and second facets are etched facets.

11. An apparatus comprising:

a gallium and nitrogen containing laser diode device, the device comprising:

a gallium and nitrogen containing substrate material comprising a surface region, the substrate surface region having a semi-polar crystal orientation;

a plurality of migration blocking regions (MBRs) formed within the substrate surface region, each pair of adjacent MBRs forming a mesa region therebetween, the mesa region having a width of less than 50 microns, the pair of adjacent MBRs being configured to block a plurality of defects from migrating into the mesa region;

an epitaxially formed gallium and nitrogen containing region formed overlying the mesa region, the epitaxial region being substantially free from defects migrating from regions outside the pair of adjacent MBRs to the mesa region;

an active region formed overlying the mesa region;

a p-type region overlying the active region; and an application configured to the device.

12. The apparatus of claim 11, wherein the plurality of MBRs are provided by an etched trench, an etched mesa, a mesa, or other structure or patterned mask.

13. The apparatus of claim 11, wherein the plurality of MBRs are provided by an etched mesa using a patterned mask.

14. The apparatus of claim 11, wherein the plurality of MBRs are provided by a deposited and patterned material comprising at least one of silicon dioxide or silicon nitride.

15. The apparatus of claim 11, comprising a laser stripe region overlying the p-type region and configured in a projection of a c-direction.

16. The apparatus of claim 11, comprising a laser stripe region overlying the p-type region, wherein the laser stripe region is characterized by a cavity orientation substantially parallel to a projection of a c-direction; the laser stripe region having a first end and a second end; a first facet provided on the first end of the laser stripe region and a second facet provided on the second end of the laser stripe region.

17. The apparatus of claim 16, wherein the first facet and the second facet are etched facets; or where in the first facet and the second facet are cleaved facets.

18. The apparatus of claim 11, wherein the p-type region is a p-type cladding region comprising an (InAl)GaN material doped with a plurality of magnesium species; wherein the semipolar crystal orientation is selected from one of {30-3-1}, {30-31}, {20-2-1}, {20-21}, {30-3-1}, {30-32}, or an offcut from any one of these planes within +/−5 degrees toward a c-plane.

19. A method for fabricating a gallium and nitrogen containing laser diode device, the method comprising:

providing a gallium and nitrogen containing substrate material comprising a surface region, the substrate surface region a semi-polar crystal orientation;

forming a plurality of migration blocking regions (MBRs) within the substrate surface region, each pair of adjacent MBRs forming a mesa region therebetween, the mesa region having a width of less than 50 microns, the pair of adjacent MBRs being configured to block a plurality of defects from migrating into the mesa region;

forming an epitaxially gallium and nitrogen containing region overlying the mesa region, the epitaxial region being substantially free from defects migrating from regions outside the pair of adjacent MBRs to the mesa region;

forming an active region overlying the mesa region;

forming a p-type region overlying the active region; and configuring the device to an application.

* * * * *